(12) United States Patent
Tsangarides et al.

(10) Patent No.: US 12,723,932 B2
(45) Date of Patent: Sep. 1, 2026

(54) FORCE INPUT LOCALISATION

(71) Applicant: Cambridge Touch Technologies Ltd., Cambridge (GB)

(72) Inventors: Constantinos Tsangarides, Cambridge (GB); Michael Astley, Cambridge (GB); Riccardo Micci, Cambridge (GB); Jiahao Li, Cambridge (GB)

(73) Assignee: Cambridge Touch Technologies Ltd., Cambridge (GB)

( * ) Notice: Subject to any disclaimer, the term of this patent is extended or adjusted under 35 U.S.C. 154(b) by 371 days.

(21) Appl. No.: 18/273,470

(22) PCT Filed: Jan. 21, 2022

(86) PCT No.: PCT/GB2022/000007
§ 371 (c)(1),
(2) Date: Jul. 20, 2023

(87) PCT Pub. No.: WO2022/157478
PCT Pub. Date: Jul. 28, 2022

(65) Prior Publication Data

US 2024/0102871 A1 Mar. 28, 2024

(30) Foreign Application Priority Data

Jan. 22, 2021 (GB) ..................................... 2100870

(51) Int. Cl.
*G01L 1/16* (2006.01)
*G06F 3/041* (2006.01)
*H10N 30/30* (2023.01)

(52) U.S. Cl.
CPC ............ *G01L 1/16* (2013.01); *G06F 3/04144* (2019.05); *H10N 30/302* (2023.02)

(58) Field of Classification Search
CPC . G01L 1/16; G01L 9/008; G01L 5/167; G06F 3/04186; G06F 3/0445; G06F 3/0414
See application file for complete search history.

(56) References Cited

U.S. PATENT DOCUMENTS 7,663,607 B2 * 2/2010 Hotelling ............ G06F 3/04166 345/173
8,982,060 B2 * 3/2015 King ..................... G06F 3/0446 178/18.05

(Continued)

FOREIGN PATENT DOCUMENTS

EP 3246806 A1 11/2017
GB 2582171 A 9/2020

(Continued)

OTHER PUBLICATIONS

International Search Report and Written Opinion, dated Apr. 8, 2022 directed to International application No. PCT/GB2022/000007, 15 pages.

(Continued)

*Primary Examiner* — Tran M. Tran

(57) ABSTRACT

A device (15) including a piezoelectric sensor (16). The piezoelectric sensor (16) includes a layer of piezoelectric material (7) disposed between a number of sensing electrodes (4, 12, 13) and at least one counter electrode (3). The device (15) also includes a controller (17) connected to the piezoelectric sensor (16). The sensing electrodes (4, 12, 13) are arranged to form one or more active regions (19). Each active region (19) includes one or more primary sensing electrodes (4,12) and one or more secondary sensing electrodes (4, 13). The secondary sensing electrodes (4, 13) are separated from the primary sensing electrodes (4, 12) by a perimeter (14). The controller (17) is configured, for each active region (19), to monitor primary piezoelectric charges induced on each primary sensing electrode (4, 12) and to (Continued)

monitor secondary piezoelectric charges induced on each secondary sensing electrode (4, 13). The controller (17) is also configured, in response to detecting one or more primary and/or secondary piezoelectric charges, to determine whether a corresponding applied force has a centroid within the perimeter (14) based on comparing the primary piezoelectric charges to the secondary piezoelectric charges.

20 Claims, 19 Drawing Sheets

(56) References Cited

U.S. PATENT DOCUMENTS 9,069,409 B2* 6/2015 Chang ................... G06F 3/0446
9,383,884 B2* 7/2016 Ando ...................... G06F 3/046
9,417,725 B1* 8/2016 Watazu ................. G06F 3/0446
9,574,954 B2* 2/2017 Baker ....................... G01L 9/02
9,696,831 B2* 7/2017 Thimirachandra ..... G06F 3/041
9,836,158 B2* 12/2017 King ..................... G06F 3/0446
9,846,091 B2* 12/2017 Lu ............................ G01L 1/16
9,904,382 B2* 2/2018 Ando ...................... G06F 1/169
10,120,478 B2* 11/2018 Filiz .................... G06F 3/04166
10,126,153 B2* 11/2018 Bischoff ................... G01L 1/16
10,318,065 B2* 6/2019 Peterson ............ H03K 17/9622
10,852,875 B2* 12/2020 Routley .............. G06F 3/04146
10,936,117 B2* 3/2021 Wang .................. G06F 3/04166
11,375,957 B2* 7/2022 Shahparnia ........ A61B 5/02055
11,449,165 B2* 9/2022 Kim .................... G06F 3/04182
11,474,653 B2 10/2022 Marques et al.
11,520,430 B2* 12/2022 Liu ....................... G06F 3/0416
11,556,202 B2 1/2023 Nathan et al.
11,619,555 B2* 4/2023 Nagamori ............ H10N 30/302
73/862.625
11,740,147 B2* 8/2023 Ishizaki .................. G01L 5/165
73/862.043
11,747,880 B2* 9/2023 Park ...................... G06F 3/0486
713/323
11,781,925 B2* 10/2023 Kinjo ...................... G01L 1/146
73/628
12,066,347 B2* 8/2024 Wu ......................... G01L 5/162
12,099,684 B2* 9/2024 Meyer .................... B60K 35/22
2006/0019752 A1 1/2006 Ohta
2006/0197750 A1 9/2006 Kerr et al.
2007/0262962 A1 11/2007 XiaoPing et al.
2008/0192024 A1* 8/2008 Mita ....................... G06F 3/044
345/173
2008/0246723 A1 10/2008 Baumbach
2008/0309624 A1 12/2008 Hotelling
2009/0146970 A1 6/2009 Lowles et al.
2010/0007631 A1 1/2010 Chang
2010/0013785 A1 1/2010 Murai et al.
2010/0079384 A1 4/2010 Grivna
2011/0050635 A1* 3/2011 Nien ....................... G06F 3/044
341/20
2013/0027153 A1 1/2013 Shin et al.
2013/0113715 A1* 5/2013 Grant .................. G06F 3/04886
345/173
2014/0139444 A1* 5/2014 Kauhanen ............. G06F 3/0447
345/173
2015/0042590 A1 2/2015 Ando et al.
2015/0160770 A1 6/2015 Stewart et al.
2015/0331517 A1 11/2015 Filiz et al.
2015/0346881 A1 12/2015 Watazu
2017/0262099 A1 9/2017 Nathan et al.
2017/0308200 A1 10/2017 Mugiraneza et al.
2018/0299958 A1 10/2018 Wang et al.
2018/0307365 A1 10/2018 Chen et al.
2018/0337325 A1 11/2018 Han et al.
2019/0027807 A1 1/2019 Choi et al.
2019/0191582 A1 6/2019 Olien et al.
2019/0227649 A1 7/2019 Micci et al.
2019/0243503 A1 8/2019 Nathan et al.
2019/0377452 A1* 12/2019 Routley .............. G06F 3/04182
2019/0384441 A1* 12/2019 Seo ....................... G06F 3/0416
2020/0240809 A1 7/2020 Nagamori
2021/0124458 A1 4/2021 Marques et al.
2021/0165550 A1* 6/2021 Astley ................... G06F 3/0416
2022/0171489 A1 6/2022 Nathan et al.

FOREIGN PATENT DOCUMENTS

GB 2585709 A 1/2021
GB 2588426 A 4/2021
WO 2014098946 A1 6/2014
WO 2016102975 A2 6/2016
WO 2017109455 A1 6/2017
WO 2019145674 A1 8/2019
WO 2020169953 A1 8/2020
WO 2020183194 A1 9/2020
WO 2020245555 A1 12/2020

OTHER PUBLICATIONS

Combined Search and Examination Report under Sections 17 and 18(3) for UK application No. GB2100870.1 dated Nov. 9, 2021, 12 pages.
Examination Report in EPO application EP 22 700 854.7, European Patent Office, dated Jun. 20, 2025, 7 pages.

* cited by examiner

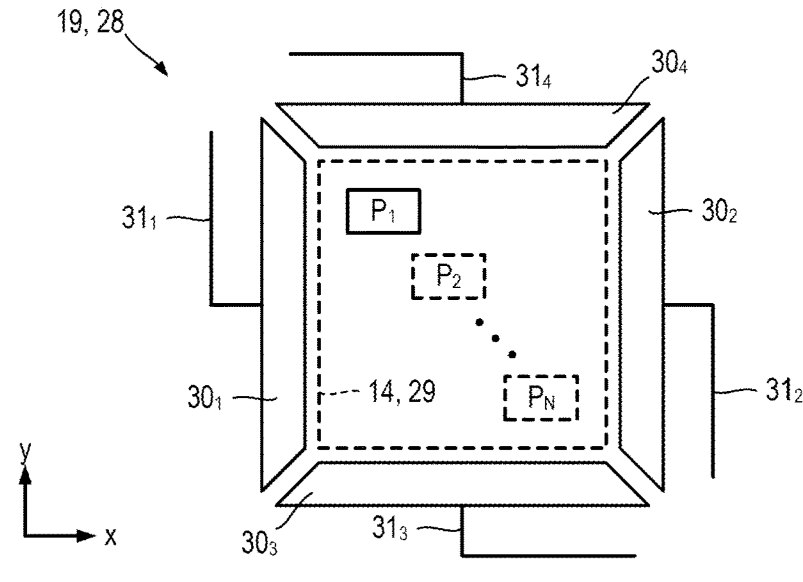
Fig. 8
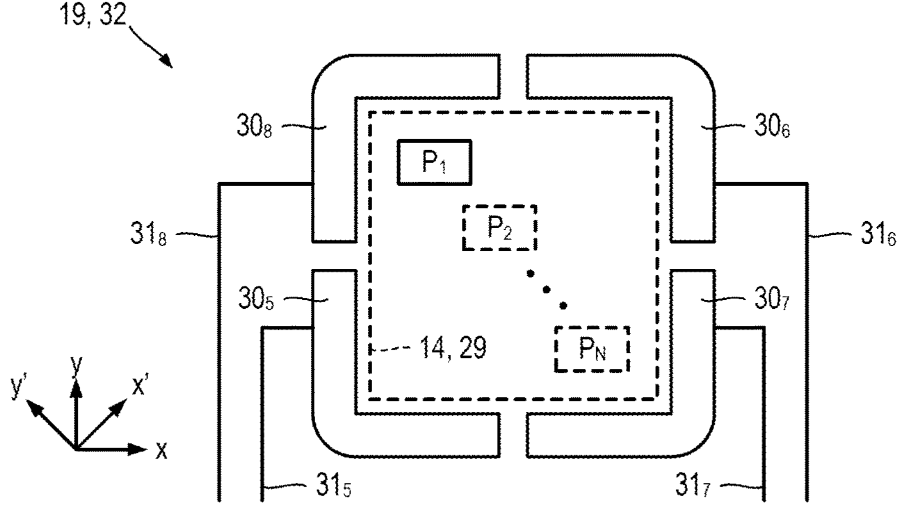
Fig. 9
Fig. 10

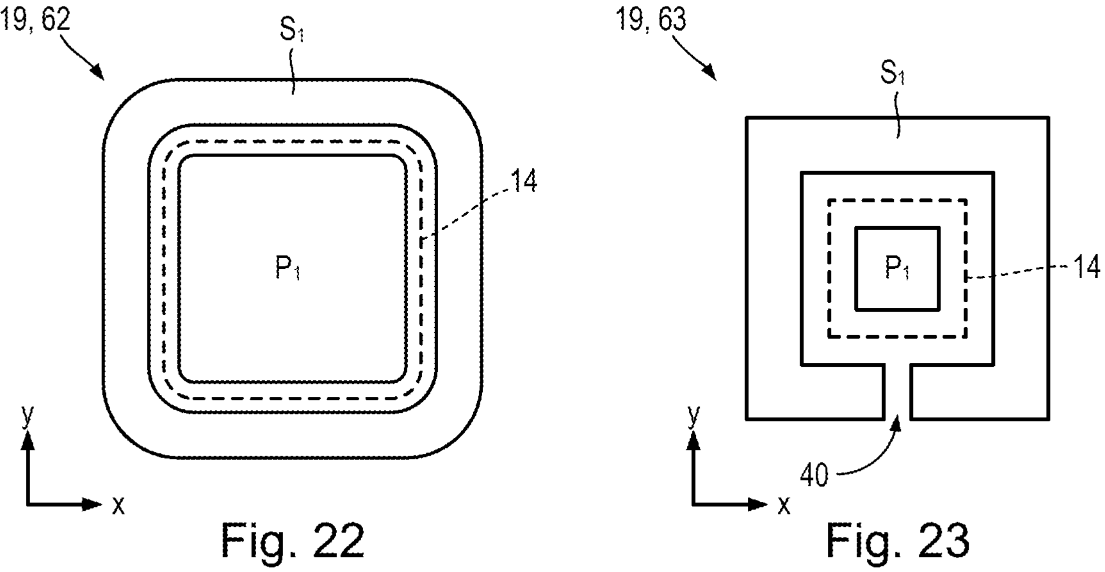
Fig. 22
Fig. 23
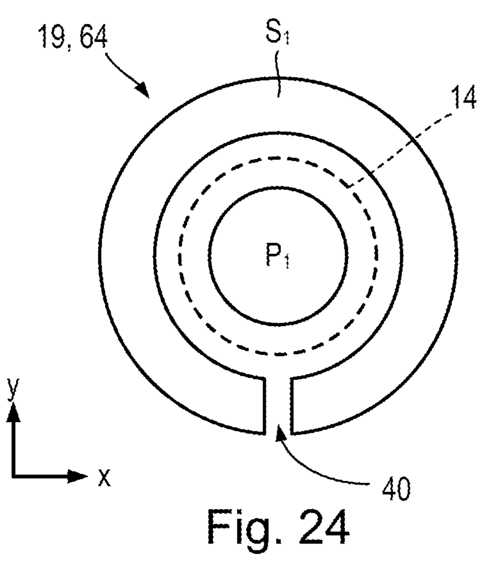
Fig. 24
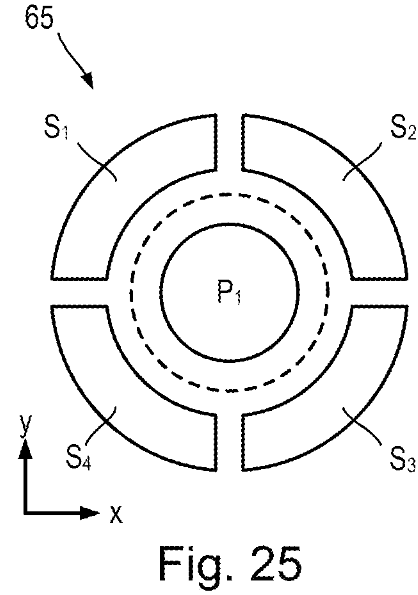
Fig. 25

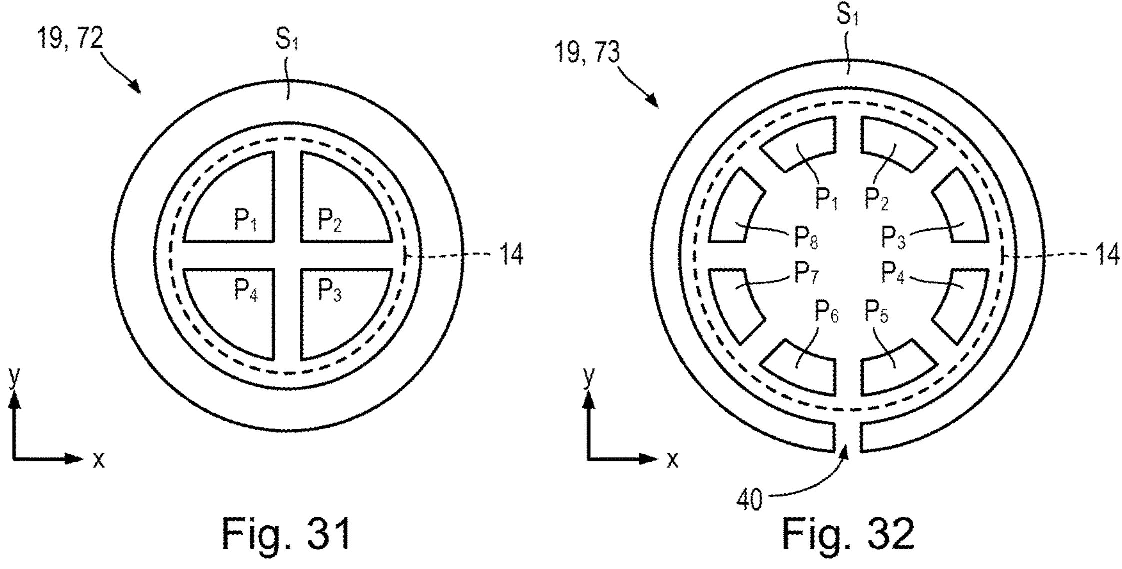
Fig. 31
Fig. 32
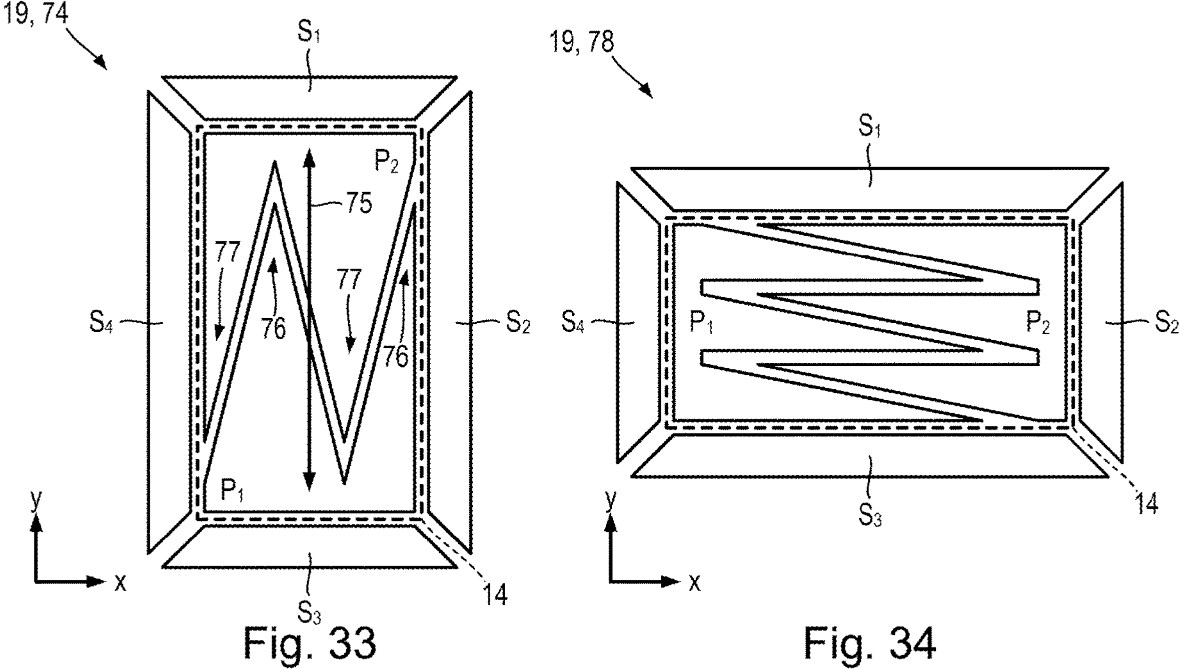
Fig. 33
Fig. 34

FORCE INPUT LOCALISATION

RELATED APPLICATIONS

This application is a 35 U.S.C. § 371 application of PCT Application No. PCT/GB2022/000007, filed Jan. 21, 2022, which claims priority to United Kingdom application No. 2100870.1 filed Jan. 22, 2021, each of which is hereby incorporated by reference as if fully disclosed herein.

FIELD OF THE INVENTION

The present invention relates to sensors for piezoelectric force sensors and processing of signals from such sensors. In particular the present invention relates to localising an applied force to one, or a group of, sensing electrodes of a piezoelectric force sensor.

BACKGROUND

Human-machine-interface panels are common interaction method for users to communicate with a wide variety of equipment. Examples include smart-phones, tablet computers, laptops, all-in-one personal computers (PCs), point-of-sale payment devices (automated tills/registers), consumer electronics, white goods (washing machines, tumble dryers), automotive applications (e.g. dashboard), control of industrial machinery, medical devices and so forth.

A full-display touchscreen panel is often an attractive solution for high-end products which may receive a wide variety of input types, for example smart-phones, tablet computers, laptops, all-in-one personal computers (PCs) and so forth. However, for fixed-use panels which do not require the capacity to receive such rich input data, a high resolution touchscreen panel may be too expensive and is usually unnecessary. Fixed-use panels may find applications in, for example, consumer electronics, white goods (e.g. washing machines), automotive applications (e.g. dashboard controls), control of industrial machinery, medical devices and so forth. For such applications, it may be more straightforward to define fixed buttons, arrays of buttons (e.g. a numeric pad), slider controls, dial controls and so forth.

Such user input controls have previously been implemented using mechanical switches, sliders (e.g. potentiometers) and similar mechanically actuated input controls. Mechanically actuated input controls may be associated with one or more of increased costs, increased complexity of an outer casing/panel of a device, a lack of mechanical robustness and/or increased potential for water/particle ingress into the device. Capacitive-sensing electrodes have been considered as possible replacements for mechanically actuated user controls, sometimes referred to as "buttonless" input panels (in reference to the absence of mechanical buttons). Such "buttonless" panels implemented using capacitive sensing have limitations which may limit the range of suitable applications. Capacitive sensing methods may become inaccurate when liquids are present on or over the sensing electrodes. Further, a capacitive coupling to a user's digit is required, which may not be possible if a user is wearing thicker gloves (e.g. for operation of industrial equipment). User input controls based on capacitive sensing may also be easy to accidentally trigger because no pressure is needed to trigger the response (any grounded conductor may trigger such controls). The requirement for electric fields to be able to extend from capacitive sensing electrodes to interact with a user's digits restricts the possible materials for a casing or cover protecting capacitive input controls to insulating materials.

An example of a projected capacitance touch panel is described in US 2010/0079384 A1. WO 2016/102975 A2 and WO 2017/109455 A1 describe touch panels which are able to combine projected capacitance touch sensing with piezoelectric pressure sensing in a single touch panel. WO 2019/145674 A1 describes a method of processing signals from a touch panel for combined capacitive and force sensing. This method includes determining, based on capacitance signals, a user interaction period during which a user interaction with the touch panel occurs. This information is used as input to a process for conditional integration of piezoelectric signals.

SUMMARY

According to a first aspect of the invention there is provided a device including a piezoelectric sensor. The piezoelectric sensor includes a layer of piezoelectric material disposed between a number of sensing electrodes and at least one counter electrode. The device also includes a controller connected to the piezoelectric sensor. The sensing electrodes are arranged to form one or more active regions. Each active region includes one or more primary sensing electrodes and one or more secondary sensing electrodes. The secondary sensing electrodes are separated from the primary sensing electrodes by a perimeter. The controller is configured, for each active region, to monitor primary piezoelectric charges induced on each primary sensing electrode and to monitor secondary piezoelectric charges induced on each secondary sensing electrode. The controller is also configured, in response to detecting one or more primary and/or secondary piezoelectric charges, to determine whether a corresponding applied force has a centroid within the perimeter based on comparing the primary piezoelectric charges to the secondary piezoelectric charges.

Primary piezoelectric charges may correspond to charges induced on (or collected by) the respective primary sensing electrodes. Secondary piezoelectric charges may correspond to charges induced on (or collected by) the respective secondary sensing electrodes.

The relative areas and positions of primary and secondary sensing electrodes within each active region may be configured to enable distinction between an applied force having a centroid within the perimeter and an applied force having a centroid outside the perimeter.

The perimeter may correspond to a locus of positions which are equidistant between the primary sensing electrodes and the secondary sensing electrodes. The perimeter may be defined as a closed curve such that all corresponding primary sensing electrodes are within the closed curve and all corresponding secondary sensing electrodes are outside the closed curve. The perimeter may be defined at one or both ends of a linear array of primary sensing electrodes. The perimeter may be continuous. The perimeter may be discontinuous.

Each secondary sensing electrode may extend at least partway around the perimeter of the respective active region. Each secondary sensing electrode may extend around at least 20%, at least 50%, at least 60%, at least 70%, at least 80%, at least 90% or more than 95% of a length of the perimeter.

Primary sensing electrodes may alternatively be referred to as active electrodes. Secondary sensing electrodes may alternatively be referred to as localisation electrodes. The primary sensing electrodes and/or the secondary sensing electrodes may be co-planar. The primary sensing electrodes and/or the secondary sensing electrodes may all by supported by a single face of a material which may be flat (planar) or curved.

A secondary sensing electrode may belong to two adjacent active regions. For example, a secondary sensing electrode may be useful to distinguish an applied force having a centroid on the boundary between two adjacent active regions.

The one or more secondary sensing electrodes of a first active region of the one or more active regions may include first and second regions of conductive material disposed on opposite sides of the first active region along a first direction, and may include third and fourth regions of conductive material disposed on opposite sides of the first active region along a second direction which is different to the first direction.

The first and second directions may be perpendicular. The first, second, third and fourth regions of conductive material may in total extend around at least 50%, at least 60%, at least 70%, at least 80%, at least 90% or more than 95% of a length of the perimeter.

The first and second regions of conductive material may be electrically connected together to provide a first secondary sensing electrode. The first and second regions of conductive material may be electrically connected together using one or more conductive traces. The first region of conductive material may be electrically connected to a first conductive trace. The second region of conductive material may be electrically connected to a second conductive trace. The first and second conductive traces may be connected together directly or indirectly. The first and second regions of conductive material may be electrically connected together internally to the piezoelectric sensor. In other words, the electrical connection may be provided as part of the structure of the piezoelectric sensor. The first and second regions of conductive material may be electrically connected together externally to the piezoelectric sensor. The first and second regions of conductive material may be electrically connected together at an input to an amplifier, for example a charge amplifier.

Electrically connected refers to ohmic or resistive coupling, rather than capacitive and/or inductive coupling. In other words, electrically connected refers to a physical connection between electrically conductive materials. An electrical connection may be made via any number of different conductive materials, for example, a pair of conductive traces formed of a first conductive material may be soldered to opposite ends of a wire formed from a second conductive material (the solder being a third conductive material).

The third and fourth regions of conductive material may be electrically connected together to provide a second secondary sensing electrode. The third and fourth regions of conductive material may be electrically connected together using one or more conductive traces. The third region of conductive material may be electrically connected to a third conductive trace. The fourth region of conductive material may be electrically connected to a fourth conductive trace. The third and fourth conductive traces may be connected together directly or indirectly. The third and fourth regions of conductive material may be electrically connected together internally to the piezoelectric sensor. In other words, the electrical connection may be provided as part of the structure of the piezoelectric sensor. The third and fourth regions of conductive material may be electrically connected together externally to the piezoelectric sensor. The third and fourth regions of conductive material may be electrically connected together at an input to an amplifier, for example a charge amplifier.

The first, second, third and fourth regions of conductive material may all be electrically connected together to provide a third secondary sensing electrode. The first, second, third and fourth regions of conductive material may be electrically connected together using one or more conductive traces. The first region of conductive material may be electrically connected to a first conductive trace. The second region of conductive material may be electrically connected to a second conductive trace. The third region of conductive material may be electrically connected to a third conductive trace. The fourth region of conductive material may be electrically connected to a fourth conductive trace. The first, second, third and fourth conductive traces may be connected together directly or indirectly. All, or any pair, of the first, second, third and fourth regions of conductive material may be electrically connected together internally to the piezoelectric sensor. In other words, the electrical connection may be provided as part of the structure of the piezoelectric sensor. All, or any pair, of the first, second, third and fourth regions of conductive material may be electrically connected together externally to the piezoelectric sensor. The first, second, third and fourth regions of conductive material may be electrically connected together at an input to an amplifier, for example a charge amplifier.

Each of the first, second, third and fourth regions of conductive material may provide a separate secondary sensing electrode. Each secondary sensing electrode may be electrically connected by a respective conductive trace.

The controller may be configured to sum piezoelectric charges from the first and second regions of conductive material to determine a first secondary piezoelectric charge corresponding to the first and second regions of conductive material.

The controller may be configured to sum piezoelectric charges from the third and fourth regions of conductive material to determine a second secondary piezoelectric charge corresponding to the third and fourth regions of conductive material.

A second active region of the one or more active regions may include a secondary sensing electrode in the form of a fifth region of conductive material extending around all, or a majority of, the perimeter of the second active region.

The fifth region of conductive material may extend completely around the perimeter within the exception of one or more gaps sized to allow passage of one or more conductive traces connecting to the one or more primary sensing electrodes of the second active region. The fifth region of conductive material may extend completely around the perimeter, and one or more conductive traces connecting to the one or more primary sensing electrodes may each be routed over or under the fifth region of conductive material by respective jumpers, internal connections of a multi-layer printed circuit board (PCB) or equivalent structures. A majority may correspond to at least 50%, at least 60%, at least 70%, at least 80%, at least 90% or at least 95% of the length of the perimeter of the second active region.

A third active region of the one or more active regions may include an array of primary sensing electrodes spaced apart along a path, and a pair of secondary sensing electrodes arranged on the path at either end of the array of primary sensing electrodes.

The perimeter of the third active region may take the form of a first line separating the primary sensing electrodes from a first secondary sensing electrode at a first end of the array, and a second line separating the primary sensing electrodes from a second secondary sensing electrode at a second, opposite end of the array. The path may be a straight line. The path may be a curved path. The piezoelectric sensor may be supported on a side of the device. The piezoelectric sensor may form or provide all, or part of, a side of the device. The piezoelectric sensor may underlie a side of the device. The piezoelectric sensor may be integrated with a side of the device. Each sensing electrode of the third active region may substantially span the side of the device in a direction which lies at an angle to the path. The angle may be perpendicular.

The piezoelectric sensor may include a single counter electrode which is common to all of the plurality of sensing electrodes. The single counter electrode may extend to cover an area of the layer of piezoelectric material which partially or completely overlaps with each of the primary sensing electrodes and which partially or completely overlaps with each of the secondary sensing electrodes.

The single counter electrode may be provided by a metal sheet forming at least part of a casing of the device. The layer of piezoelectric material may be supported by the metal sheet. The metal sheet may be substantially flat or planar. The metal sheet may include one or more curved and/or formed portions. The metal sheet may be formed of steel. The metal sheet may be formed of an aluminium alloy.

The piezoelectric sensor may include a separate counter electrode corresponding to each of the plurality of sensing electrodes. Each counter electrode may partially or completely overlap with the respective primary sensing electrode or secondary sensing electrode. Each counter electrode may be co-extensive with the respective primary sensing electrode or secondary sensing electrode.

All of the secondary sensing electrodes of an active region of the one or more active regions may be opposed across the layer of piezoelectric material by a common secondary counter electrode corresponding to that active region. Each common secondary counter electrode may be shaped and dimensioned to partially or completely overlap each of the secondary sensing electrodes of the respective active region. Each common secondary counter electrode may be shaped and dimensioned to fully or partially surround (or enclose) the perimeter of the respective active region. A common secondary counter electrode may take the form or two or more conductive regions which are electrically connected together. Electrical connections between conductive regions forming a common secondary counter electrode may be internal and/or external to the piezoelectric sensor.

All of the secondary sensing electrodes may be opposed across the layer of piezoelectric material by a single common secondary counter electrode. The single common secondary counter electrode may be shaped and dimensioned to partially or completely overlap each of the secondary sensing electrodes. The single common secondary counter electrode may take the form or two or more conductive regions which are electrically connected together. Electrical connections between conductive regions forming the single common secondary counter electrode may be internal and/or external to the piezoelectric sensor.

Each primary sensing electrode of an active region of the one or more active regions may be opposed across the layer of piezoelectric material by a respective primary counter electrode. Every primary sensing electrode may be opposed across the layer of piezoelectric material by a respective primary counter electrode. Each primary counter electrode may partially or completely overlap with the respective primary sensing electrode. Each primary counter electrode may be co-extensive with the respective primary sensing electrode.

The device may be configured for capacitive touch measurements using the primary sensing electrodes corresponding to the active region. The device may be configured for capacitive touch measurements using the primary counter electrodes corresponding to the active region.

All of the primary sensing electrodes of an active region of the one or more active regions may be opposed across the layer of piezoelectric material by a common primary counter electrode corresponding to that active region. Each common primary counter electrode may be shaped and dimensioned to partially or completely overlap all of the primary sensing electrodes of the corresponding active region. Each common primary counter electrode may be shaped and dimensioned to be co-extensive with the perimeter of the corresponding active region. The primary sensing electrodes of every active region may be opposed by a respective common primary counter electrode. A common primary counter electrode may take the form or two or more conductive regions which are electrically connected together. Electrical connections between conductive regions forming a common primary counter electrode may be internal and/or external to the piezoelectric sensor.

The device may be configured for capacitive touch measurements using the primary sensing electrodes corresponding to the active region.

The primary sensing electrodes of an active region of the one or more active regions may be opposed across the layer of piezoelectric material by a number of primary counter electrodes which is different to the number of primary sensing electrodes belonging to that active region. Each primary counter electrode may partially or completely overlap with one or more of the primary sensing electrodes corresponding to that active region.

The device may be configured for capacitive touch measurements using the primary sensing electrodes corresponding to the active region. The device may be configured for capacitive touch measurements using the primary counter electrodes corresponding to the active region.

For each active region, the corresponding primary and secondary sensing electrodes may be configured with relative areas and positions such that it is possible to define a threshold multiplier corresponding to each secondary sensing electrode of the active region. The threshold multipliers for the active region may satisfy, in response to application of a force having a centroid within the perimeter, a secondary piezoelectric charge collected by each secondary sensing electrode is less than a product of the respective threshold multiplier and a total primary piezoelectric charge collected by all of the primary sensing electrodes. The threshold multipliers for the active region may satisfy, in response to application of a force having a centroid outside the perimeter, a secondary piezoelectric charge collected by at least one secondary sensing electrode is greater than the product of the respective threshold multiplier and the total primary piezoelectric charge collected by all of the primary sensing electrodes. The controller may be configured to store pre-calibrated threshold multipliers corresponding to each secondary sensing electrode. The controller may be configured, for each active region, to determine whether an applied force has a centroid within the perimeter by comparing each secondary piezoelectric charge against a product of the respective threshold multiplier with a sum over the primary piezoelectric charges.

The values of threshold multipliers may be pre-calibrated using experimental measurements obtained in response to known applied forces having known centroid locations. Additionally or alternatively, the values of threshold multipliers may be pre-calibrated using theoretical charge values obtained using a model, for example a finite element model. A pair of active regions corresponding to identical layouts of primary and secondary sensing electrodes may have different values of threshold multipliers, depending on the relative locations of each active region belonging to the pair on the casing of a device including or incorporating the piezoelectric sensor.

The primary sensing electrodes of at least one active region may provide one or more buttons. An active region providing one or more buttons may include a single primary electrode. An active region providing one or more buttons may include a number of primary sensing electrodes, each providing a respective button.

The primary sensing electrodes of at least one active region may provide a slider control. An active region providing a slider control may include three or more primary electrodes arranged spaced apart along a straight or curved path.

The primary sensing electrodes of at least one active region may provide a dial control. An active region providing a dial control may include three or more primary electrodes arranged spaced apart along a circular or elliptical path.

The primary sensing electrodes of at least one active region may provide a swipe gesture control. An active region providing a swipe gesture control may include first and second primary sensing electrodes arranged such that along a swipe direction, a width of the first primary sensing electrode perpendicular to the swipe direction decreases and a width of the second primary sensing electrode perpendicular to the swipe direction increases.

The primary sensing electrodes of at least one active region may provide a button pad. An active region providing a button pad may include a number, N, of primary sensing electrodes. The N primary sensing electrodes may be arranged to in an array of rows and columns to form a grid. The N primary sensing electrodes may be arranged and/or dimensioned to correspond to indicia formed or printed onto an exterior casing of the device or an apparatus including the device. The N primary sensing electrodes may be equally sized. The N primary sensing electrodes may be unequally sized.

The primary sensing electrodes of at least one active region may provide a touch pad. An active region providing a touch pad may include a number N of primary sensing electrodes arranged to form a grid. An active region providing a touch pad may include a first number N1 of primary sensing electrodes extending in a first direction and arranged spaced apart in a second, different direction, and a second number N2 of primary sensing electrodes extending in the second direction and spaced apart in the first direction. The first and second directions may be perpendicular.

According to a second aspect of the invention there is provided a piezoelectric sensor includes a layer of piezoelectric material disposed between a number of sensing electrodes and at least one counter electrode. The sensing electrodes are arranged to form one or more active regions. Each active region includes one or more primary sensing electrodes and one or more secondary sensing electrodes. The secondary sensing electrodes are separated from the primary sensing electrodes by a perimeter. The one or more secondary sensing electrodes of at least one active region include first and second regions of conductive material disposed on opposite sides of that active region along a first direction, and third and fourth regions of conductive material disposed on opposite sides of that active region along a second direction which is different to the first direction. At least one pair of the first, second, third and fourth regions are electrically connected together to provide one or the secondary sensing electrodes.

The piezoelectric sensor according to the second aspect may include features corresponding to any features of the device according to the first aspect.

According to the a third aspect of the invention there is provided a piezoelectric sensor including a layer of piezoelectric material disposed between a number of sensing electrodes and at least one counter electrode. The sensing electrodes are arranged to form one or more active regions. Each active region includes one or more primary sensing electrodes and one or more secondary sensing electrodes. The secondary sensing electrodes are separated from the primary sensing electrodes by a perimeter. The one or more secondary sensing electrodes of at least one active region include a secondary sensing electrode in the form of a region of conductive material extending around all, or a majority of, the perimeter of that active region.

The piezoelectric sensor according to the third aspect may include features corresponding to any features of the device of the first aspect and/or the piezoelectric sensor of the second aspect.

According to a fourth aspect of the invention, there is provided a method of monitoring a piezoelectric sensor. The piezoelectric sensor includes a layer of piezoelectric material disposed between a number of sensing electrodes and at least one counter electrode. The sensing electrodes are arranged to form one or more active regions. Each active region includes one or more primary sensing electrodes and one or more secondary sensing electrodes. The secondary sensing electrodes are separated from the primary sensing electrodes by a perimeter. The method includes monitoring primary piezoelectric charges induced on each primary sensing electrode. The method also includes monitoring secondary piezoelectric charges induced on each secondary sensing electrode. The method also includes, in response to detecting one or more first and/or second charges, determining whether a corresponding applied force has a centroid within the perimeter based on comparing the primary and secondary piezoelectric charges.

The method may include features corresponding to any features of the device of the first aspect, the piezoelectric sensor of the second aspect and/or the piezoelectric sensor of the third aspect.

BRIEF DESCRIPTION OF THE DRAWINGS

Certain embodiments of the present invention will now be described, by way of example, with reference to the accompanying drawings in which:

FIG. 8 schematically illustrates a first configuration of an active region;

FIG. 9 schematically illustrates a second configuration of an active region;

FIG. 10 schematically illustrates a third configuration of an active region;

FIG. 22 schematically illustrates a first button control;

FIG. 23 schematically illustrates a second button control;

FIG. 24 schematically illustrates a third button control;

FIG. 25 schematically illustrates a fourth button control;

FIG. 31 schematically illustrates a first dial control;

FIG. 32 schematically illustrates a second dial control;

FIG. 33 schematically illustrates a first swipe control;

FIG. 34 schematically illustrates a second swipe control;

DETAILED DESCRIPTION

Figure 1:
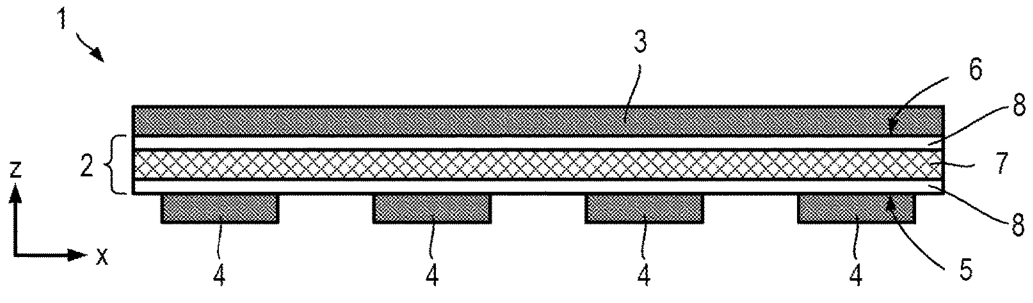
FIG. 1 is a schematic cross-section of a first piezoelectric sensor.

In the following description, like parts are denoted by like reference numerals.

In view of the hereinbefore described problems which may be encountered when using capacitive sensing for "buttonless" input panels, the inventors of the present specification have developed approaches to allow replacement of mechanical switches and other mechanically actuated controls (for example dials, sliders and so forth) using piezoelectric sensors. Piezoelectric sensors are described which may provide "buttonless" force-sensing user input panels/controls by introducing a layer of piezoelectric film and using sensing electrodes of the piezoelectric sensors to provide control elements such as buttons, sliders, dials and so forth.

However, the use of piezoelectric sensors to provide "buttonless" force-sensing user input controls is non-trivial, and simply adding a piezoelectric sensor with sensing electrodes directly corresponding to mechanically actuated controls and/or capacitive touch sensors will typically not be sufficient. When a force is applied to a panel, casing, or other structure supporting one or more piezoelectric sensors, the strain is typically not localised to a small area surrounding the application point. Instead, the entire panel will usually deform to some extent, leading to non-negligible signals being generated in sensing electrodes of a piezoelectric sensor located an appreciable distance from the centroid of an applied force.

It is not sufficient to simply assume that the sensing electrode of a piezoelectric sensor providing the largest output signal corresponds to a control which a user is interacting with. Simply selecting the largest signal may be practical when considering, for example, a flat touch panel taking up substantially an entire surface. However, when considering input surfaces which need not be planar and/or which may support a number of spaced apart controls, taking the largest signal may lead to false inputs. For example, a user pressing on a portion of a device casing which is away from any intended input controls may still generate detectable signals in sensing electrodes of a piezoelectric sensor which are laterally spaced several centimetres away. There is a need to distinguish a light press on a sensing electrode of a piezoelectric sensor from a stronger press which does not actually corresponding to that sensing electrode. The present specification concerns methods, and apparatuses which may be used to enable correct localisation of inputs received using piezoelectric sensors defining user input controls.

Referring to FIG. 1, a simplified cross-section of a first piezoelectric sensor 1 for defining input controls is shown.

The piezoelectric sensor 1 may be used for force-only measurements. Other piezoelectric sensors 18 (FIG. 14) described hereinafter may be used for combined force and capacitance measurements.

The piezoelectric sensor 1 includes a layer structure 2, a counter electrode 3 and a number of sensing electrodes 4. The number, shapes, sizes and positions of the sensing electrodes 4 define the number and types of user input controls which the piezoelectric sensor 1 may provide.

The layer structure 2 has a first face 5 and a second, opposite, face 6. The layer structure 2 includes one or more layers, including at least a layer of piezoelectric material 7. Each layer included in the layer structure 2 is generally planar and extends in first and second directions x, y which are perpendicular to a thickness direction z. The one or more layers of the layer structure 2 are arranged between the first and second faces 5, 6 such that the thickness direction z of each layer of the layer structure 2 is perpendicular to the first and second faces 5, 6. The sensing electrodes 4 are disposed on, or over, the first face 5 of the layer structure 2, or the first face 5 may be bonded to the sensing electrodes 4 (which may be free-standing or supported on a further substrate which is not shown). The counter electrode 3 is disposed on, or over, the second face 6 of the layer structure 2. Alternatively, the second face 6 may be bonded to the counter electrode 3 (which may be free-standing or supported on a further substrate which is not shown).

Preferably, the piezoelectric layer 7 is formed of a piezoelectric polymer, for example a suitable fluoropolymer such as polyvinylidene fluoride (PVDF). However, the piezoelectric layer may alternatively be formed from a layer of a piezoelectric ceramic such as lead zirconate titanate (PZT). Unlike in touchscreen applications, transparency of the piezoelectric layer 7 is not required. However, in some applications a transparent piezoelectric layer 7 may be used to allow visibility of an underlying display, one or more light emitting diodes, or other elements used to provide visual information about the status of a device to a user. Another option is that a piezoelectric layer 7 may be translucent (partially transparent), for example to act as an optical diffusing layer for an underlying light-emitting diode (LED).

The layer structure 2 of the first piezoelectric sensor 1 may include only the layer of piezoelectric material 7, such that the first and second opposite faces 5, 6 are faces of the piezoelectric layer 7. In some examples, the layer structure may optionally include one or more dielectric layers 8 between the piezoelectric layer 7 and the first face 5 and/or one or more dielectric layers 8 between the piezoelectric layer 7 and the second face 6. When included, each dielectric layer 8 is generally planar and extends in first and second directions x, y which are perpendicular to a thickness direction z. Dielectric layer(s) 8 may include layers of a polymer dielectric material such as polyethylene terephthalate (PET) or layers of pressure sensitive adhesive (PSA) materials. However, dielectric layer(s) 8 may include layers of a ceramic insulating material such as aluminium oxide. Dielectric layer(s) 8 may be transparent, opaque or translucent, depending on the intended application.

The counter electrode 3 and/or the sensing electrodes 4 may be formed from any conductive materials such as, for example, conductive oxides such as indium tin oxide (ITO), indium zinc oxide (IZO), conductive polymers such as polyaniline, polythiophene, polypyrrole or poly(3,4-ethylenedioxythiophene) polystyrene sulfonate (PEDOT/PSS), metals such as aluminium, copper, silver or other metals suitable for deposition and/or patterning, and so forth. The counter electrode 3 and/or the sensing electrodes 4 may be formed from a metal mesh, nanowires, optionally silver nanowires, graphene, or carbon nanotubes. When the first piezoelectric sensor 1 is intended to overlie a display, or is required to be fully or partly transparent for any other reasons, the materials selected should be transparent. In other examples the first piezoelectric sensor 1 may be opaque or translucent as mentioned hereinbefore.

Although in some examples the counter electrode 3 may be a thin electrode which is mechanically supported by the layer structure 2, this need not be the case. In some first piezoelectric sensors 1, the counter electrode 3 may be a free-standing conductor such as a metal foil, a metal sheet, or a metal casing for a device or appliance. For example, the counter electrode 3 may be provided by a steel (or other metal) casing of a device which obtains inputs using a first piezoelectric sensor 1. For example, a piezoelectric layer 7 having sensing electrodes 4 patterned on the first surface 5 may be bonded or otherwise securely attached to an interior surface of the steel casing providing the counter electrode 3. User input controls may be indicated by indicia printed, engraved, embossed, attached or otherwise defined on the exterior surface of the casing overlying the sensing electrodes 4. Using a steel casing of a device as part of an input control would be impossible with capacitive sensing (at least where more than a single input is needed), because a metallic, conductive casing would shield electric fields generated using sensing electrodes from interacting with a user.

Figure 2:
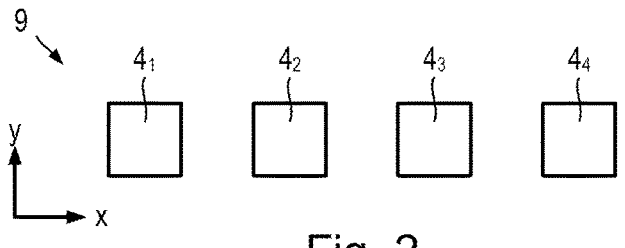
FIG. 2 is a schematic plan view of a first sensing electrode layout.

Referring also to FIG. 2, a plan view of a first sensing electrode layout 9 is shown.

The first sensing electrode layout 9 includes four sensing electrodes $\mathbf{4}_1$, $\mathbf{4}_2$, $\mathbf{4}_3$, $\mathbf{4}_4$ evenly spaced along a straight line. The sensing electrodes $\mathbf{4}_1$, $\mathbf{4}_2$, $\mathbf{4}_3$, $\mathbf{4}_4$ are supported on the first face 5 of the layer structure 2 as described in relation to FIG. 1. The sensing electrodes $\mathbf{4}_1$, $\mathbf{4}_2$, $\mathbf{4}_3$, $\mathbf{4}_4$ may provide user input controls corresponding to a line of discrete buttons, or may operate together to provide a slider control by interpolating a position at which the slider control is pressed based on relative signals from the sensing electrodes $\mathbf{4}_1$, $\mathbf{4}_2$, $\mathbf{4}_3$, $\mathbf{4}_4$.

Figure 7:
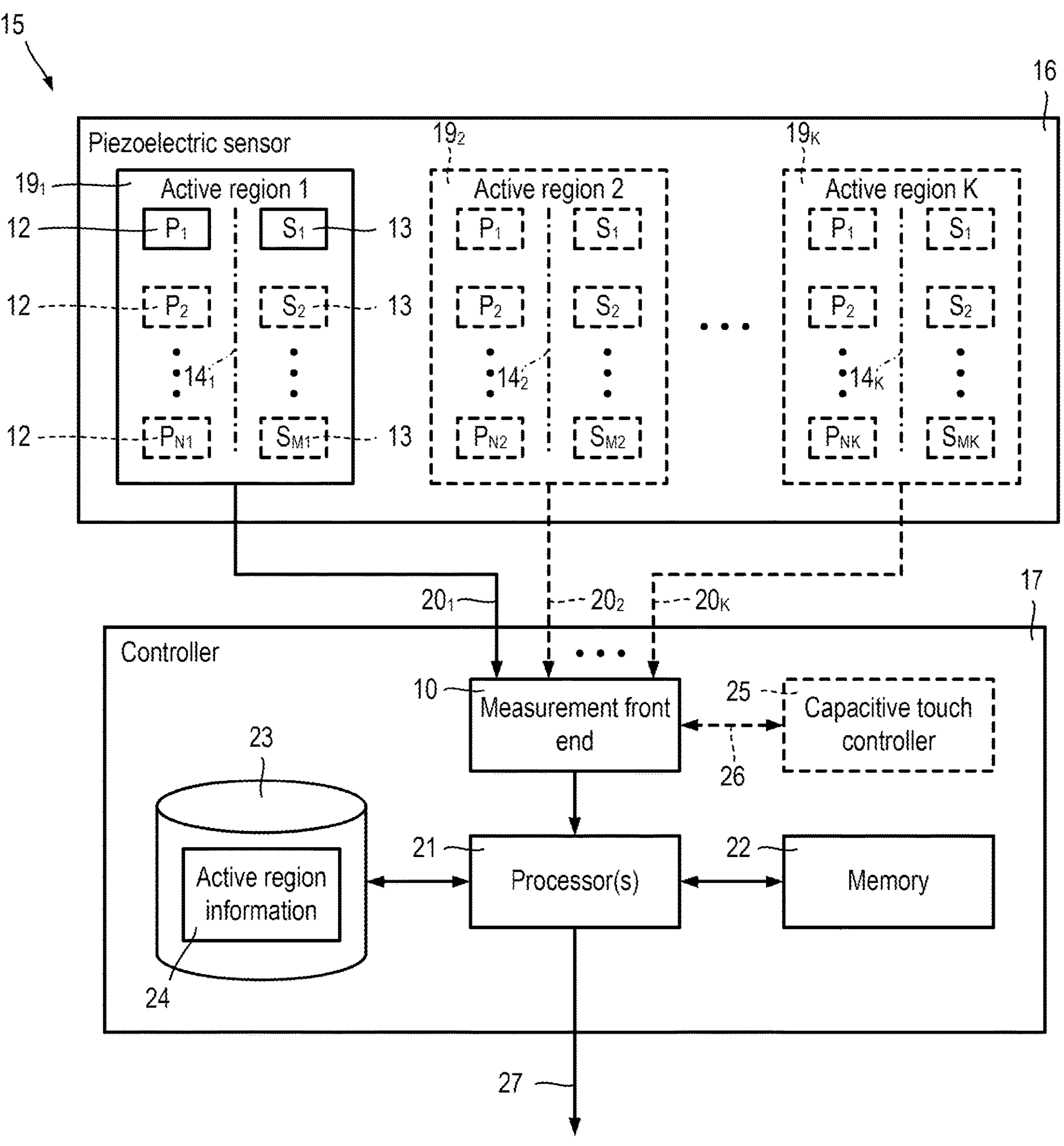
FIG. 7 is a schematic block diagram of a device including a piezoelectric sensor.

When a user presses the first piezoelectric sensor 1 it will deform, and the corresponding straining of the piezoelectric layer 7 will generate polarisation and cause charges to be induced between each sensing electrode 4 and the counter electrode 3. The piezoelectric charges Q induced on the sensing electrodes $\mathbf{4}_1$, $\mathbf{4}_2$, $\mathbf{4}_3$, $\mathbf{4}_4$ may be detected and amplified using a measurement front end to (FIG. 7). Independent piezoelectric charges $Q_1$, $Q_2$, $Q_3$, $Q_4$ may be measured for each of the four sensing electrodes $\mathbf{4}_1$, $\mathbf{4}_2$, $\mathbf{4}_3$, $\mathbf{4}_4$.

Although the first piezoelectric sensor 1 includes a single counter electrode 3, in other examples of piezoelectric sensors 16, 18 (FIGS. 14 through 21) the counter electrode 3 may be divided into two or more counter electrodes 3, each shaped and dimensioned to oppose one, or a group, of sensing electrodes 4 across the layer of piezoelectric material.

Figure 3:
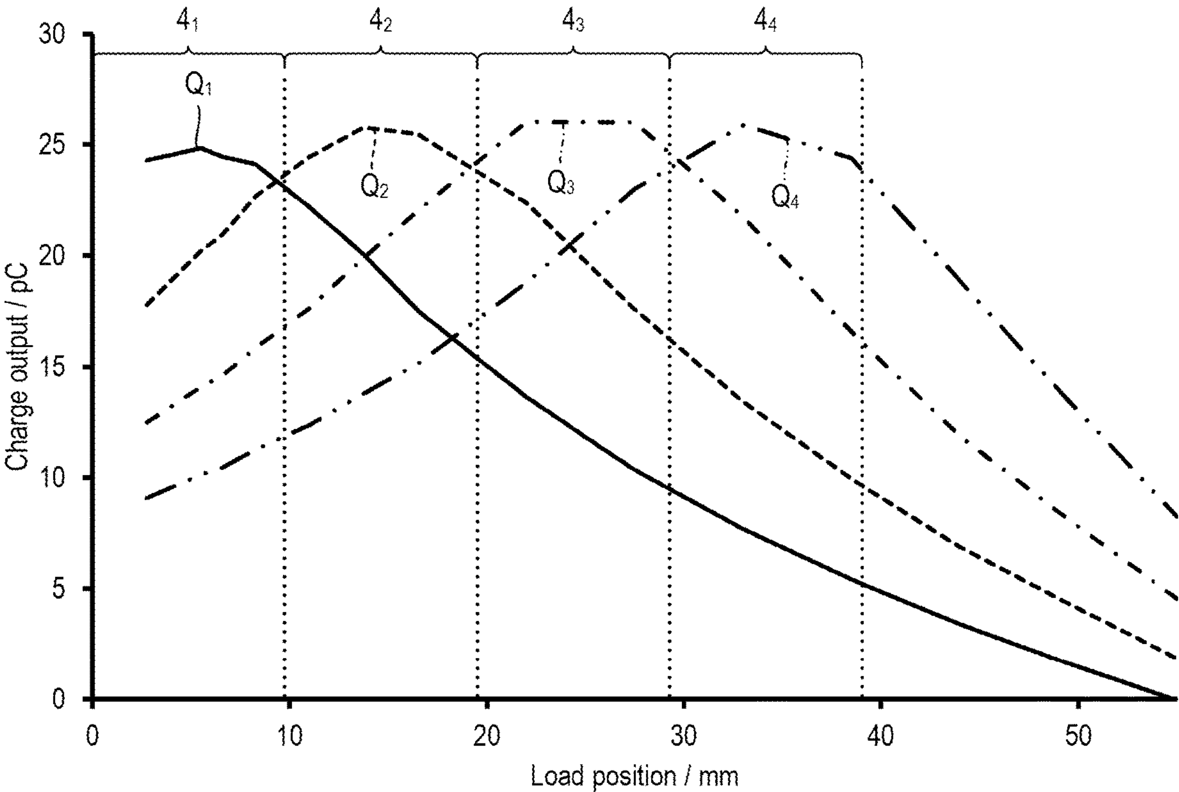
FIG. 3 plots piezoelectric charges simulated for the first sensing electrode layout of FIG. 2.

Referring also FIG. 3, finite element simulations of piezoelectric charges $Q_1$, $Q_2$, $Q_3$, $Q_4$ corresponding to the first sensing electrode layout 9 are shown as a function of the position of a centroid of an applied force.

The approximate extent of each sensing electrode $\mathbf{4}_1$, $\mathbf{4}_2$, $\mathbf{4}_3$, $\mathbf{4}_4$ is indicated on FIG. 3 using dotted lines for reference. The data were obtained using finite element simulations conducted using the COMSOL® Multiphysics 5.5 software. The modelled piezoelectric sensor (not shown) was an example of the first piezoelectric sensor 1 in which the sensing electrodes 4 were defined by a top conductor layer of a conventional 4-layer printed circuit board (PCB) (not shown) and the counter electrode 3 was provided by a bottom conductor layer of a conventional 2-layer PCB (not shown). The layer structure 2 modelled included a layer of piezoelectric material 7 sandwiched between the 4-layer PCB and the 2-layer PCB using respective layers of pressure sensitive adhesive (PSA). The modelled piezoelectric sensor (not shown) was modelled with a rectangular shape and with supports in the form of six elastomeric hemispheres $83_1$, . . . , $83_6$ (FIG. 35), one located at each corner and one located midway along each of the long edges. The applied force was 1 gram-force (gf), or 0.980665 N. The counter electrode 3 was modelled at zero volts (ground), although similar results would be expected using any fixed potential. The material parameters used for finite element simulation were (Table 1):

| | Thickness (μm) | Young Modulus (MPa) | Density (kg · m$^{-3}$) | Poisson ratio | Relative permittivity |
|---|---|---|---|---|---|
| 2-layer PCB | 360 | 22,000 | 1,900 | 0.15 | 1 |
| 4-layer PCB | 1000 | 22,000 | 1,900 | 0.15 | 1 |
| PSA | 50 | 0.65 | 1,012 | 0.49 | 3.32 |
| Piezoelectric material | 40 | 2640 ($E_{xx}$, $E_{yy}$) 900 ($E_{zz}$) | 1,780 | 0.39 | 7.6 |
| Elastomeric supports | 5000 | 4.2 | 935 | 0.49 | — |

(For the purpose of the anisotropic modulus values, the piezoelectric material was modelled as a film in the x-y plane, with the thickness along the z-axis. The elastomeric hemispherical supports were not coupled to the electric field model.)

It may be observed that the strain resulting from the applied force spreads laterally, so that piezoelectric charges $Q_1$, $Q_2$, $Q_3$, $Q_4$ may be observed whichever of the sensing electrodes $4_1$, $4_2$, $4_3$, $4_4$ is directly pressed. For example, if a planar first piezoelectric sensor 1 is supported at its edges and able to flex in the middle (an arrangement providing strong signals), the signal spread can be several tens of millimetres. It may be observed that a force having a centroid applied over the middle of the second sensing electrode $4_2$ results in a charge of $Q_2 \approx 25$ pC. The adjacent first and third sensing electrodes $4_1$, $4_3$ have approximately equal charges $Q_1 \approx Q_3 \approx 20$ pC, and the fourth sensing electrode $4_4$ still has charge $Q_4 \approx 14$ pC which is about half that of the directly pressed second sensing electrode $4_2$.

The lateral spreading of the piezoelectric charges means that it is difficult or impossible to distinguish between a soft touch press directly over sensing electrode 4 providing a discrete user input button and a hard press some distance away from that sensing electrode 4. Consequently the localisation of the applied force would be inaccurate. This problem persists beyond sensing electrodes providing individual discrete buttons. In the example of the first sensing electrode layout 9, in may be observed from FIG. 3 that determining which of the sensing electrodes $4_1$, $4_2$, $4_3$, $4_4$ could be done simply based on which has the largest charge signal $Q_1$, $Q_2$, $Q_3$, $Q_4$ whilst the centroid of an applied force is over or between the sensing electrodes $4_1$, $4_2$, $4_3$, $4_4$. However, once the applied force is no longer being applied to any of the sensing electrodes $4_1$, $4_2$, $4_3$, $4_4$, for example from a position of about 40 mm onwards in FIG. 3, the signals $Q_1$, $Q_2$, $Q_3$, $Q_4$ decrease for all of the electrodes $4_1$, $4_2$, $4_3$, $4_4$ whilst maintaining approximately constant ratios between each pairing of the signals $Q_1$, $Q_2$, $Q_3$, $Q_4$. For such an input it is not possible to distinguish between a light press to the fourth sensing electrode $4_4$ of the array and a hard press off to the side. This could result in detecting an input in error (false positive), for example, because a user is supporting their weight on a part of a device casing which is not defined as an input control (does not correspond to any sensing electrode(s) 4). The same issues with input localisation occur when a force moves outside the immediate area of the sensing electrodes $4_1$, $4_2$, $4_3$, $4_4$ in any direction.

The first sensing electrode layout 9 is merely one example, and other examples are described and shown in this specification. However, any possible layout of sensing electrodes 4 on a piezoelectric sensor 1 will experience similar issues as the centroid of an applied force moves beyond an area containing the sensing electrodes 4.

The techniques, methods and apparatuses of the present specification may help to mitigate and/or overcome these localisation issues. This may be accomplished by adding additional sensing electrodes 4 which do not correspond directly to an intended user input control, and which instead are arranged about (or equivalently around) one or more edges of a perimeter surrounding the sensing electrodes 4 intended to define one or more user input controls.

Figures 4, 5A, 5B, 6:
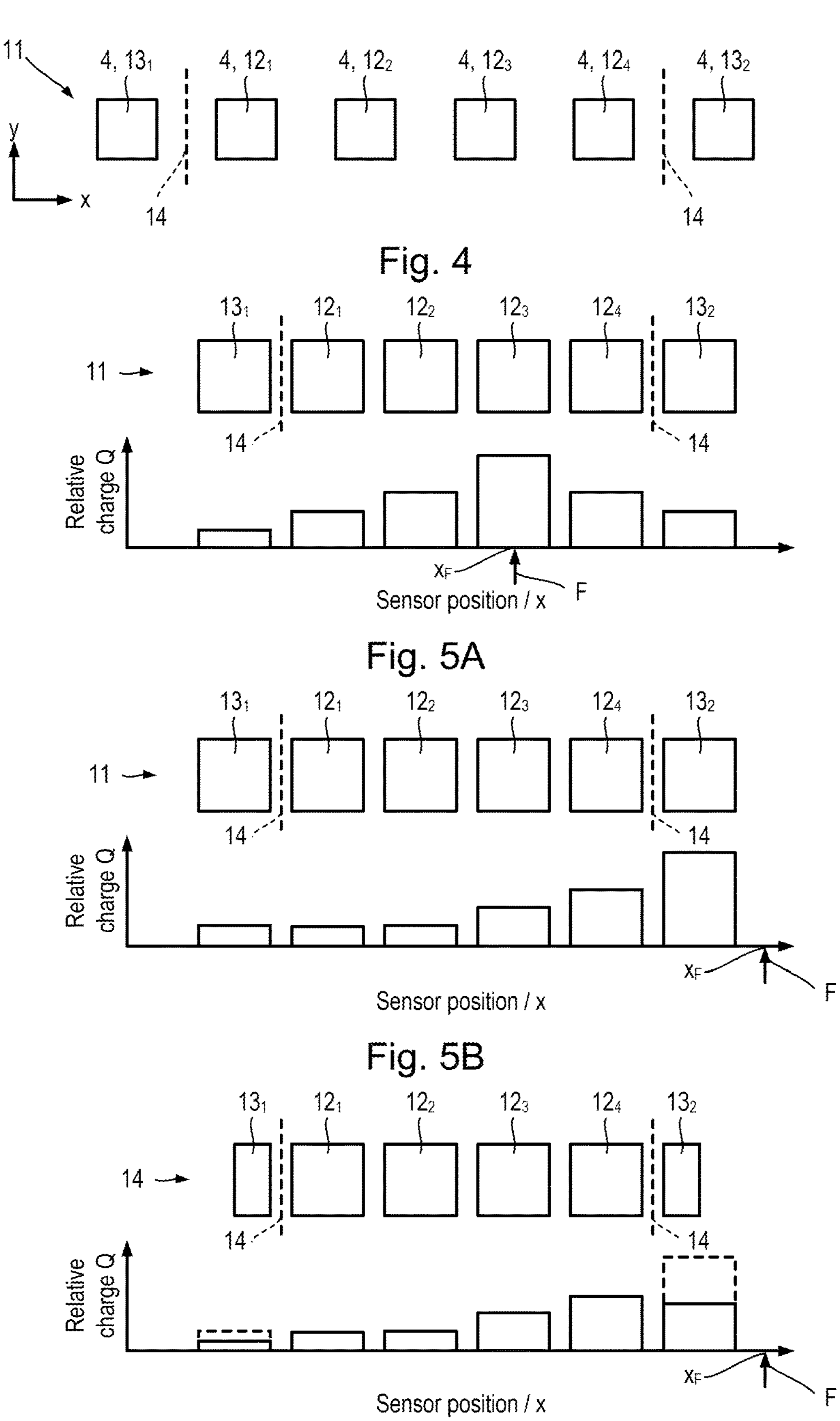
FIG. 4 is a schematic plan view of a second sensing electrode layout.
FIGS. 5A and 5B are schematic illustrations of charges induced for the second sensing electrode layout of FIG. 4 in response to forces applied at two locations.
FIG. 6 is a schematic illustration of charges induced for a third sensing electrode layout, for a force applied at the same location as FIG. 5B.

Referring also to FIG. 4, a second sensing electrode layout 11 is shown.

Similarly to the first sensing electrode layout 9, the second sensing electrode layout 11 includes four sensing electrodes 4 in the form of first to fourth primary sensing electrodes $12_1$, $12_2$, $12_3$, $12_4$ arranged evenly spaced along a straight line. The second sensing electrode layout 11 also includes first and second secondary sensing electrodes $13_1$, $13_2$ arranged at either end to bracket the linear array of primary sensing electrodes $12_1$, $12_2$, $12_3$, $12_4$. A perimeter 14 separates the primary sensing electrodes $12_1$, $12_2$, $12_3$, $12_4$ from the secondary sensing electrodes $13_1$, $13_2$. The second sensing electrode layout 11 is disposed, supported on, or bonded on or over a layer structure 2 in the same way as the first sensing electrode layout 9.

For the purposes of this example, we shall restrict consideration to varying the location of a centroid of an applied force along a first axis x parallel to the linear array of sensing electrodes 12, 13, so that the perimeter 14 takes the form of a pair of lines oriented along a second direction y. As described hereinafter, in general the perimeter 14 may take the form of any line, set of two or more lines, closed curve, and so forth, which separates the primary sensing electrodes 12 from the secondary sensing electrodes 13. For example, the perimeter 14 may generally be taken as a locus of points equidistant between a group of primary sensing electrodes 12 and a corresponding group of secondary sensing electrodes 13 surrounding or bracketing the primary sensing electrodes 12.

Referring also to FIG. 5A, a schematic illustration of piezoelectric charges Q induced on the primary and secondary sensing electrodes 12, 13 of the second sensing electrode layout 11 is shown.

A measurement front end 10 (FIG. 7) monitors and measures primary piezoelectric charges $Qp_1$, $Qp_2$, $Qp_3$, $Qp_4$ corresponding to each primary sensing electrode $12_1$, $12_2$, $12_3$, $12_4$, and secondary piezoelectric charges $Qs_1$, $Qs_2$ corresponding to each secondary sensing electrode $13_1$, $13_2$. FIG. 5A illustrates an applied force F having a centroid applied centrally over the third primary sensing electrode $12_3$. Since the centroid location $x_F$ of the force F is applied within the group of primary sensing electrodes $12_1$, $12_2$, $12_3$, $12_4$, i.e. within the perimeter 14, the primary sensing electrode $12_3$ being directly pressed has the largest piezoelectric charge $Qp_3$. This makes it straightforward to determine which of the primary sensing electrodes $12_1$, $12_2$, $12_3$, $12_4$ is being actuated when the second sensing electrode layout 11 corresponds to a row of button controls and/or the location $x_F$ of the centroid of the force F when the second sensing electrode layout 11 corresponds to a slider control.

Herein we refer to the location of a centroid of an applied force F rather than an application point because in practice any force is applied over a finite contact area. Forces applied by a user's digit are typically applied over a contact area within which their digit is deformed into contact with an input surface, and this contact area may be irregular and/or may vary with the magnitude of applied force. To a reasonable approximation, pressure over a contact area may be considered constant, so that the effective point of application of the force F coincides with the centroid of the corresponding contact area.

Referring also to FIG. 5B, a schematic illustration is shown of piezoelectric charges Q induced on the primary and secondary sensing electrodes 12, 13 of the second sensing electrode layout 11 for a different centroid location $x_F$ to that shown in FIG. 5A.

FIG. 5B illustrates an applied force F having a centroid location $x_F$ which is arranged along the first axis x beyond the second secondary sensing electrode $\mathbf{13}_2$. As explained in relation to FIG. 3, relying only on the primary piezoelectric charges $Qp_1$, $Qp_2$, $Qp_3$, $Qp_4$, it would be impossible to distinguish whether these charges correspond to a light press applied to the fourth primary sensing electrode $\mathbf{12}_4$ or a stronger press displaced along the first axis x (the latter being the situation illustrated). However, with the additional information provided by the secondary piezoelectric charges $Qs_1$, $Qs_2$, it may be observed that the second secondary piezoelectric charge $Qs_2$ is the largest. This allows inferring that the centroid location $x_F$ of the applied force F is offset away from the primary sensing electrodes 12, outside of the perimeter 14.

A simple condition may be used to generate a flag indicating whether or not a user is interacting with the user input control(s) provided by the second sensing electrode layout 11. The maximum value of the piezoelectric charges $Qp_1$, $Qp_2$, $Qp_3$, $Qp_4$, $Qs_1$, $Qs_2$ is determined. If the largest is one of the primary piezoelectric charges $Qp_1$, $Qp_2$, $Qp_3$, $Qp_4$, the flag indicates an interaction is occurring with the corresponding input control(s) and the primary piezoelectric charges $Qp_1$, $Qp_2$, $Qp_3$, $Qp_4$ are processed to determine which is pressed and/or the centroid location $x_F$ of the force F. However, if the largest value is one of the secondary piezoelectric charges $Qs_1$, $Qs_2$, the flag may instead indicate that the primary piezoelectric charges $Qp_1$, $Qp_2$, $Qp_3$, $Qp_4$ should be ignored. This is simply one example using the piezoelectric charges $Qp_1$, $Qp_2$, $Qp_3$, $Qp_4$, $Qs_1$, $Qs_2$ for localisation, and alternative approaches are described hereinafter.

In this way, by placing secondary sensing electrodes 13 around the perimeter of a group of primary sensing electrodes 12 arranged to provide one or more user input controls of a first piezoelectric sensor 1, localisation of forces applied to interact with the user input control(s) may be accomplished. The secondary sensing electrodes 13 may be invisible, or hidden from, a user of the first piezoelectric sensor 1. For example, a casing (which may also provide the counter electrode 3) of a device may include indicia printed, engraved, embossed or otherwise defined overlying the primary sensing electrodes 12, to indicate to a user where input controls have been defined and/or what function they serve. The secondary sensing electrodes 13 may have no corresponding indicia, or may correspond to a border provided surrounding the indicia corresponding to primary sensing electrodes 12.

The piezoelectric charge Qp, Qs collected be a sensing electrode 12, 13 depends on a combination of the polarisation of the layer of piezoelectric material 7 in the vicinity, and also upon the area of that sensing electrode 12, 13. Larger sensing electrodes 12, 13 may generally collect larger piezoelectric charges Qp, Qs for the same force F. As the secondary sensing electrodes $\mathbf{13}_1$, $\mathbf{13}_2$ are only used for localisation, the signal-to-noise requirements from these electrodes may be less than is required for the primary sensing electrodes $\mathbf{12}_1$, $\mathbf{12}_2$, $\mathbf{12}_3$, $\mathbf{12}_4$ defining one or more user input controls. Consequently, the shapes and/or areas of the secondary sensing electrodes 13 may be different from the shapes and/or areas of the corresponding primary sensing electrodes. One or more weighting factors $\alpha$ (also referred to herein as "scaling factors") may be used to account for differences in shapes and/or areas between the primary and secondary sensing electrodes 12, 13.

For example, referring also to FIG. 6, a schematic illustration is shown of charges Q induced on the primary and secondary sensing electrodes 12, 13 of a third sensing electrode layout 14, for the same centroid location $x_F$ shown in FIG. 5B.

The third sensing electrode layout 14 is the same the second sensing electrode layout 11, except that each of the secondary sensing electrodes $\mathbf{13}_1$, $\mathbf{13}_2$ has half the area of one of the primary sensing electrodes $\mathbf{12}_1$, $\mathbf{12}_2$, $\mathbf{12}_3$, $\mathbf{12}_4$. To account for this, the secondary piezoelectric charges $Qs_1$, $Qs_2$ are multiplied by a factor of two, and this adjusted value is shown in the graph of FIG. 6 using a dashed outline. With the correction for the relative areas, the charges $Qp_1$, $Qp_2$, $Qp_3$, $Qp_4$ and adjusted charges $2Qs_1$, $2Qs_2$ obtained using the third sensing electrode layout 14 may be used for localisation in the same way as the charges $Qp_1$, $Qp_2$, $Qp_3$, $Qp_4$, $Qs_1$, $Qs_2$ obtained using the second sensing electrode layout 11. Reducing the relative areas of one or more secondary sensing electrodes 13 associated with a group of primary sensing electrodes 12 may help to reduce an overall area (or footprint) of a piezoelectric panel 1 for receiving input.

In the general case, the primary sensing electrodes 12 may have different shapes and/or areas to each other, or to the secondary sensing electrodes 13. Sensing electrodes 12, 13 which are identical in shape and area but which are located in different positions on the piezoelectric panel 1 may still have different responses to the same force F (applied centrally to each electrode) as a result of a bending response of the first piezoelectric sensor 1 (accounting for mechanical boundary conditions and so forth). Any such variations may be accounted for by multiplying each piezoelectric charge Qp, Qs by an appropriately calibrated weighting factor. For the $n^{th}$ of a number N of primary sensing electrodes $\mathbf{12}_1, \ldots, \mathbf{12}_n, \ldots, \mathbf{12}_N$, a corresponding adjusted charge $Ap_n$ may be defined as:

$$AP_n=\beta_n Qp_n \quad (1)$$

In which $\beta_n$ is a weighting factor corresponding to the $n^{th}$ primary sensing electrode 12$n$. Similarly, for the $m^{th}$ of a number M of secondary sensing electrodes $\mathbf{13}_m$ arranged around a perimeter 14 enclosing the N primary sensing electrodes $\mathbf{12}_1, \ldots, \mathbf{12}_N$, an adjusted charge $As_m$ may be defined as:

$$As_m=a_m Qs_m \quad (2)$$

In which $\alpha_m$ is a weighting factor corresponding to the $m^{th}$ secondary sensing electrode $\mathbf{13}_m$. The adjusted charges $Ap_1, \ldots, Ap_N, As_1, \ldots, As_M$ may then be compared for the purposes of localisation using any method described in this specification.

A simple test to determine which sensing electrode 12, 13 has the maximum piezoelectric charge Qp, Qs or adjusted charge Ap, As has been described in relation to the second and third sensing electrode layouts 11, 14, these examples are effectively one-dimensional with the centroid coordinate $x_1$ confined to movement along the first axis x. Such configurations may be relevant in practice for some devices, for example, to implement one or more button and/or slider controls on the side of a mobile phone, tablet computer, or any other similar device which is relatively thin in one dimension. These configurations may also be useful when sensing electrodes 4 form a linear array along a first axis x and substantially or completely span a face of a piezoelectric panel along a second axis y.

For examples in which a centroid coordinate $(x_F, y_F)$ of a force F may be displaced from a group of primary sensing electrodes 12 in two lateral directions (e.g. x and y), secondary sensing electrodes 13 may need to be placed around a perimeter 14 in the form of a closed curve. Such examples are effectively two-dimensional, as the force F may be displaced relative to primary sensing electrodes 12 on a surface instead of along a line. A simple test to determine which sensing electrode 12, 13 has the maximum piezoelectric charge Qp, Qs or adjusted charge Ap, As may be useable for some effectively two-dimensional situations, but other conditions may be needed. Specific examples are described in relation to FIGS. 7 to 38H.

Device Include Piezoelectric Input Controls

Referring also to FIG. 7, a block diagram schematically illustrating a device 15 including piezoelectric input controls (or simply the "device") is shown.

Figure 14:
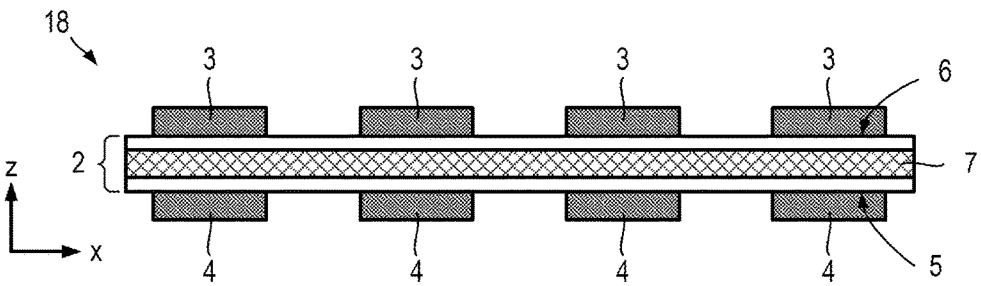
FIG. 14 is a schematic cross-section of a second piezoelectric sensor.

The device 15 includes a piezoelectric sensor 16 connected to a controller 17. The piezoelectric sensor 16 includes a layer of piezoelectric material 7 disposed between a number of sensing electrodes 4, 12, 13 and at least one counter electrode 3. For example, the piezoelectric sensor 16 may take the form of the first piezoelectric sensor 1 or the second piezoelectric sensor 18 (FIG. 14). The sensing electrodes 4, 12, 13 of the piezoelectric sensor 16 are arranged to form one or more active regions 19. The piezoelectric sensor 16 includes at least a first active region $\mathbf{19}_1$, and optionally may include any number K of further active regions $\mathbf{19}_2, \ldots, \mathbf{19}_K$.

Each active region 19 includes one or more primary sensing electrodes 12 and one or more secondary sensing electrodes 13. Within each active region 19, a perimeter 14 separates the primary sensing electrodes 12 from the secondary sensing electrodes 13. The first active region $\mathbf{19}_1$ includes at least one primary sensing electrode 12 and one secondary sensing electrode 13, denoted $P_1$ and $S_1$ in FIG. 7 and hereinafter. Optionally, the first active region $\mathbf{19}_1$ may include up to any number N1 of primary sensing electrodes 12 (denoted $P_2, \ldots, P_{ni}, P_{N1}$ in FIG. 7 and hereinafter) and/or up to any number M1 of secondary sensing electrodes 13 (denoted $S_2, \ldots, S_{mi}, \ldots, S_{M1}$, in FIG. 7 and hereinafter). A perimeter 14, separates the primary sensing electrodes 12, $P_1, \ldots, P_{N1}$ from the secondary sensing electrodes 13, $S_1, \ldots, S_{M1}$. When further active regions $\mathbf{19}_2, \ldots, \mathbf{19}_K$ are included, the $k^{th}$ of K active regions $\mathbf{19}_k$ may include a number Nk of primary sensing electrodes 12 denoted $P_1, \ldots, P_n, \ldots, P_{Nk}$ separated by a corresponding perimeter $\mathbf{14}_k$ from a number Mk of secondary sensing electrodes 13 denoted $S_1, \ldots, S_m, \ldots, S_{Mk}$. Hereinafter, reference to a general active region 19 may be considered to also refer to the $k^{th}$ active region $\mathbf{19}_k$ of a number K of active regions $\mathbf{19}_1, \ldots, \mathbf{19}_k$.

The primary sensing electrodes 12, $P_n$ and secondary sensing electrodes 13, $S_m$ of each active region 19 are not shown with actual shapes and positions in FIG. 7. Only schematic blocks representing each primary sensing electrode 12, $P_n$ and secondary sensing electrode 13, $S_m$ are shown. Examples of relative shapes and positions of secondary sensing electrodes 13, $S_m$ for an active region 19 may be found in FIGS. 8 to 12, and examples of active region 19 layouts including relative shapes and positions of primary sensing electrodes 12, $P_m$ and/or secondary sensing electrodes 13, $S_m$ may be found in FIGS. 8 to 35.

Although illustrated as single, vertical lines in the schematic representation of FIG. 7, the perimeter 14 of any particular active region 19 may take any shape suitable for segregating the primary sensing electrodes 12, $P_1, \ldots, P_n, \ldots, P_N$ from the secondary sensing electrodes 13, $S_1, \ldots, S_m, \ldots, S_M$. Preferably, the perimeter 14 of an active region 19 corresponds to a locus of positions which are equidistant between the primary sensing electrodes 12, $P_1, \ldots P_n, \ldots, P_N$ and the secondary sensing electrodes 13, $S_1, \ldots, S_m, \ldots, S_M$ of that active region 19. For example, a perimeter 14 may be defined as a closed curve such that all corresponding primary sensing electrodes 12, $P_1, \ldots, P_n, \ldots, P_N$ are within the closed curve and all corresponding secondary sensing electrodes 13, $S_1, \ldots, S_m, \ldots, S_M$ are outside the closed curve. Alternatively, for linear arrays of sensing electrodes 12, 13 such as the second and/or third sensing electrode layouts 11, 14, a corresponding perimeter 14 may be defined at one or both ends of a linear array of primary sensing electrodes 12, $P_1, \ldots, P_n, \ldots, P_N$. In the general case, a perimeter 14 of an active region 19 may be continuous or discontinuous. For example, some active regions 19 may have continuous perimeters 14, whilst other active regions 19 may have discontinuous perimeters 14.

Each secondary sensing electrode 13, $S_n$ may extend at least partway around the perimeter 14 of the respective active region 19. For example, each secondary sensing electrode 13, $S_n$ may extend around at least 20% of the corresponding perimeter 14. In some active regions 19, a single secondary sensing electrode 13, $S_1$ may extend entirely (or almost entirely) around the perimeter 14.

The controller 17 is connected to the piezoelectric sensor 16, and receives piezoelectric signals $\mathbf{20}_1, \ldots, \mathbf{20}_k, \ldots, \mathbf{20}_K$ corresponding to each active region $\mathbf{19}_1, \ldots, \mathbf{19}_k, \ldots, \mathbf{19}_K$. Based on the piezoelectric signals, the controller 17 is configured, for each active region $\mathbf{19}_1, \ldots, \mathbf{19}_K$, to monitor primary piezoelectric charges Qp induced (or collected) on each primary sensing electrode 12, $P_n$, and to monitor secondary piezoelectric charges Qs induced (or collected) on each secondary sensing electrode 13, $S_m$. For example, piezoelectric charges $Qp_1, \ldots, Qp_{N1}, \ldots, Qs_1, \ldots, Qs_{M1}$ may be measured for the first active region $\mathbf{19}_1$.

In response to detecting one or more primary and/or secondary piezoelectric charges Qp, Qs from a given active region 19, the controller 17 is configured to determine whether a corresponding applied force has a centroid within the perimeter 14 correspond to that active region 19 based on comparing the primary piezoelectric charges Qp and the secondary piezoelectric charges Qs. The relative areas and positions of primary and secondary sensing electrodes 12, $P_n$, 13, $S_m$ within each active region 19 are configured to enable distinction between an applied force F having a centroid within the corresponding perimeter $\mathbf{14}_k$ and an applied force F having a centroid outside the perimeter $\mathbf{14}_k$.

Method Using Threshold Multipliers

For an active region 19 having primary sensing electrodes 12, $P_1, \ldots, P_n, \ldots, P_N$ and secondary sensing electrodes 13, $S_1, \ldots, S_m, \ldots, S_M$, the corresponding primary piezoelectric charges $Qp_1, \ldots, Qp_n, \ldots, Qp_N$ and secondary piezoelectric charges $Qs_1, \ldots, Qs_m, \ldots, Qs_M$ are measured (using measurement front end 10). For each of the M secondary sensing electrodes $S_1, \ldots, S_m, \ldots, S_M$, a corresponding threshold multiplier $Th_1, \ldots, Th_m, \ldots, Th_M$ is calibrated, and the condition is tested:

$$Qs_m < Th_m \sum_{n=1}^{N} Qp_n \tag{3}$$

Equation (3) is written for the $m^{th}$ of M secondary sensing electrodes 13, $S_1, \ldots, S_m \ldots, S_{Mk}$, and should be evaluated separately for every one of the M secondary sensing electrodes 13, $S_1, \ldots, S_m \ldots, S_M$ (i.e. for $1 \le m \le M$)

If Equation (3) evaluates as true for every one of the M secondary sensing electrodes 13, $S_1, \ldots, S_m, \ldots, S_M$, then an applied force F giving rise to the piezoelectric charges $Qp_n$, $Qs_m$ has a centroid coordinate $(x_F, y_F)$ which is within the corresponding perimeter 14 of the active regions 19 under consideration (for example the $k^{th}$ active region $\mathbf{19}_k$ of K active regions $\mathbf{19}_1, \ldots, \mathbf{19}_K$).

However, if Equation (3) evaluates as false for at least one of the M secondary sensing electrodes 13, $S_1, \ldots, S_m \ldots, S_M$, then an applied force F given rise to the piezoelectric charges $Qp_n$, $Qs_m$ has a centroid coordinate $(x_F, y_F)$ which is outside the corresponding perimeter 14 of the active region 19.

In order for the method explained in relation to Equation (3) to provide accurate localisation, the primary sensing electrodes 12, $P_1, \ldots, P_n, \ldots, P_N$ and secondary sensing electrodes 13, $S_1, \ldots, S_m \ldots, S_M$ of each active region $\mathbf{19}_k$ need to be configured with relative areas and positions such that it is possible to calibrate threshold multipliers $Th_1, \ldots, Th_m, \ldots, Th_M$ which satisfy the conditions explained hereinbefore in dependence upon a applied force F having centroid coordinates $(x_F, y_F)$ inside or outside the corresponding perimeter 14. Calibration of suitable threshold multipliers $Th_1, \ldots, Th_m, \ldots, Th_M$ should be possible provided that the secondary sensing electrodes 13, $S_1, \ldots, S_m \ldots, S_M$ extend around a sufficient fraction (preferably most or all) of the perimeter 14.

The values of threshold multipliers $Th_1, \ldots, Th_m, \ldots, Th_M$ may be pre-calibrated using experimental measurements obtained in response to known applied forces F having known centroid coordinates $(x_F, y_F)$. Additionally or alternatively, the values of threshold multipliers $Th_1, \ldots, Th_m, \ldots, Th_M$ may be pre-calibrated using theoretical charge values obtained using a model, for example a finite element analysis (FEA) model. Examples of calibrating threshold multipliers $Th_1, \ldots, Th_m, \ldots, Th_M$ based on data from finite element analysis simulations are described hereinafter in relation to FIGS. 35 to 38H, and the same procedures should be applicable to experimentally obtained data.

A pair of active regions 19 corresponding to identical layouts of primary and secondary sensing electrodes 12, 13 may have different values of threshold multipliers $Th_1, \ldots, Th_m, \ldots, Th_M$ depending on the relative locations of those active regions 19 on the piezoelectric sensor 16, for example due to boundary conditions, the shape of the piezoelectric sensor 16 and so forth.

The method of threshold multipliers $Th_m$ described in relation to Equation (3) may be adapted to use the adjusted charges $Ap_n$, $As_m$ calculated according to Equations (1) and (2) instead of piezoelectric charges $Qp_n$, $Qs_m$ as measured, by testing the alternative condition:

$$As_m < Th_m \sum_{n=1}^{N} Ap_n \tag{4}$$

Alternatively, the weighting factors $\alpha_m$ for the secondary sensing electrodes 13, $S_1, \ldots, S_M$ need not be determined, and the relative weighting of secondary piezoelectric charges $Qs_m$ may be accounted for directly in the calibration of threshold multipliers by testing the condition:

$$Qs_m < Th_m \sum_{n=1}^{N} \beta_n Qp_n \tag{5}$$

Method Using Maximum Signal

Although primarily useful for linear arrays which are effectively one-dimensional, for example as described in relation to the second and third sensing electrode layouts it, 14, a simple determination of the maximum value of piezoelectric charges Qp, Qs may still be useful for some effectively two-dimensional active regions 19. For example, the maximum value of the set of all piezoelectric charges $\{Qp_1, \ldots, Qp_n, \ldots, Qp_N, Qs_1, \ldots, Qs_m, \ldots, Qs_m\}$ measured from an active region 19 may be determined. If the maximum value corresponds to one of the primary piezoelectric charges $Qp_1, \ldots, Qp_n, \ldots, Qp_N$ then the centroid coordinate $(x_F, y_F)$ of the corresponding applied force F is within the perimeter 14. By contrast, if the maximum value corresponds to one of the secondary piezoelectric charges $Qs_1, \ldots, Qs_n, \ldots, Qs_m$ then the centroid coordinate $(x_F, y_F)$ of the corresponding applied force F is outside the perimeter 14.

The method of maximum signal may be less sensitive than the threshold multiplier $Th_m$, method to uneven responses of sensing electrodes 12, $P_n$, 13, $S_m$ due to factors such as boundary conditions, shape of the piezoelectric sensor 16 and relative positions of the electrodes 12, $P_n$, 13, $S_m$ on the piezoelectric sensor 16. The applicability of the maximum signal method may be determined for a given active region 19 of a particular piezoelectric sensor 16 based on experimental measurements obtained in response to known applied forces F having known centroid coordinates $(x_F, y_F)$, and/or using theoretical charge values obtained using a model such as a finite element model.

The method of maximum signal may be applied based on adjusted charges $Ap_1, \ldots, Ap_{Nk}, As_1, \ldots, As_M$ instead. Using the adjusted charges $Ap_1, \ldots, Ap_{Nk}, As_1, \ldots, As_M$ may be expected to have superior performance to using a maximum of piezoelectric charges $Qp_1, \ldots, Qp_{Nk}, Qs_1, \ldots, Qs_M$ for many piezoelectric sensors 16, for instance due to non-uniform straining of the piezoelectric layer 7 in most practical cases.

In general, each active region 19 of a piezoelectric sensor 16 may be treated independently. Although all of the active regions $\mathbf{19}_1, \ldots, \mathbf{19}_k, \ldots, \mathbf{19}_K$ of a piezoelectric sensor 16 may be analysed using a single one of the methods described hereinbefore, in some examples different methods could be applied to different active regions 19. For example, an active region $19_k$ may achieve sufficient localisation using the maximum signal method, whilst other active regions $19_h$ (h*k) may obtain more accurate localisation using the threshold multiplier $Th_m$ method.

The controller 17 shown in FIG. 7 includes a measurement front end 10, one or more digital electronic processors 21, memory 22 and non-volatile storage 23. The non-volatile storage 23 stores program code which may be executed by the one or more processors 21, utilising the memory 22, to carry out any of the methods and functions described hereinbefore. The non-volatile storage 23 also stores active region information 24 defining which channels receiving piezoelectric signals 20 correspond to primary sensing electrodes 12, $P_n$, which channels correspond to secondary sensing electrodes 13, $S_m$, and which active region $19_1$, . . . , $19_K$ each sensing electrode 12 $P_n$, 13, $S_m$ is associated with.

Optionally, the device 15 may be a combined force and capacitance sensing device and may additionally include a capacitive touch controller 25. When the capacitive touch controller 25 is included, it may be separate from the measurement front end 10, or the controller 17. Alternatively, the capacitive touch controller 25 may be integrated with the measurement front end 10 and/or the controller 17 as a single package integrated circuit (IC) or chip.

The measurement front end 10 detects straining of the piezoelectric layer 7 in response to one or more forces F applied to the piezoelectric sensor 16. Depending on the configuration, the measurement front end 10 may directly detect potentials induced between the counter electrode(s) 3 and each sensing electrode 12, $P_n$, 13, $S_m$ by strain-induced polarisation of the layer of piezoelectric material 7. Alternatively, the measurement front end 10 may detect charge or current flow in response to the strain-induced polarisation of the layer of piezoelectric material 7. Charge based measurements are preferred, although the methods for localising applied forces F described hereinbefore may be adapted to measurements of currents or voltages instead using the usual conversions between charge Q, current I=dQ/dt and voltage V=Q/C (with C the capacitance between the addressed sensing electrode 12, $P_n$, 13, $S_m$ and the counter electrode(s) 3). The measurement front end 10 may have a separate input channel corresponding to each sensing electrode 12, $P_n$, 13, $S_m$. Alternatively, the measurement front end may have fewer input channels than a total number of sensing electrodes 12, $P_n$, 13, $S_m$, and the measurement front end 10 may address the sensing electrodes 12, $P_n$, 13, $S_m$ according to a sequence (for example using time-division multiplexing).

The measurement front end 10 may include a low-frequency cut-off filter configured to reject a pyroelectric response of the layer of piezoelectric material 7. The low frequency cut-off may take a value between 1 Hz and 7 Hz. The measurement front end 10 may include a notch filter configured to reject a mains power distribution frequency, for example, 50 Hz or 60 Hz.

When the optional capacitive touch controller 25 is included, measurements of the mutual- or self-capacitances of some or all of the primary sensing electrodes 12, $P_n$ and/or counter electrode(s) 3 may be made, either directly from the piezoelectric sensor 16, or via the measurement front end 10. For example, the measurement front end 10 may measure piezoelectric force signals and capacitances concurrently as described in WO 2017/109455 A1, or as described in WO 2016/102975 A2, and the entire contents of both documents are hereby incorporated by reference. In particular, suitable combined force and capacitance devices 15 using piezoelectric sensors 16 in the form of touch panels are shown in, and described with reference to, FIGS. 4 to 23 of WO 2017/109455 A1. Further, suitable combined force and capacitance devices 15 using piezoelectric sensors 16 in the form of touch panels are shown in, and described with reference to, FIGS. 15 to 29 of WO 2016/102975 A2.

When the optional capacitive touch controller 25 is included, the measurement front end 10 may also relay and/or modify capacitance measurement signals 26 between the capacitive touch controller 25 and one or more primary sensing electrodes 12, $P_n$ and/or counter electrodes 3. The capacitive signal processing module 25 may function in the same way as a conventional capacitive touch controller, and may be provided by a conventional capacitive touch controller. In some examples, the capacitive touch controller 25 may provide driving signals for capacitance measurements to the measurement front end 10. The mutual- or self-capacitances of some or all of the primary sensing electrodes 12, $P_n$ and/or counter electrodes 3 may be measured by the capacitive touch controller 25 according to known methods.

Whilst this specification is concerned with methods for localising user inputs based on piezoelectric measurements alone, examples including the optional capacitive touch controller 25 do not obviate the need for piezoelectric-based localisation of force F locations ($x_F$, $y_F$). Devices 15 including a capacitive touch controller 25 and configured for combined piezoelectric and capacitive measurements may adapted their operation to the prevailing input conditions. For example, when the piezoelectric sensor 16 and a user's un-gloved digit are both dry, the highly localised signals from capacitance measurements may be used. However, when a user is wearing a glove and/or water is present on the piezoelectric sensor 16 and/or the user's digit, or when a non-conductive object is used for input, the piezoelectric measurements and the methods of localising input described herein may be used to augment, or entirely replace, capacitance measurements.

Once it has been determined which active region or regions 19 are being pressed, the controller 17 outputs user input data 27 including details of which user input controls (e.g. buttons, sliders, touch pads) defined by the primary sensing electrode 12, $P_n$ have been actuated, and optionally the levels of force F detected for each. Conversion of piezoelectric charges $Q_p$, $Q_s$ or adjusted charges $A_p$, $A_s$ to force values F will require additional calibration, because the same force F applied to different locations of a piezoelectric sensor 16 may result in different amounts of strain, depending on the shape of the piezoelectric sensor 16, mechanical boundary conditions and so forth. A look-up table, or other model, calibrated using known forces F applied at known coordinates ($x_F$, $y_F$) may be used for converting piezoelectric charges $Q_1$, $Q_s$ or adjusted charges $A_p$, $A_s$ to force values F, The references to WO 2017/109455 A1 and WO 2016/102975 A2 are provided for the purposes of improving understanding the present specification, however the present specification is not limited to methods or apparatuses described in these documents.

The controller 17 may be implemented in any way capable of providing the functions described herein, for example, a suitably programmed microcontroller, an application specific integrated circuit (ASIC), a field programmable gate array (FPGA) and so forth. Although shown in FIG. 7 as separate elements within an integrated controller 17, the measurement front end 10, processor(s) 21, memory (22), non-volatile storage 23 and optionally the capacitive touch controller 25 may be implemented as separate components or any group may be integrated as a single component. For example, the measurement front end 10 may be provided as a separate device coupled to a microcontroller providing the functions of the processor(s) 21, memory 22 and non-volatile storage 23.

Primary sensing electrodes 12, $P_n$ may alternatively be referred to as "active" electrodes. Secondary sensing electrodes 13, $S_m$ may alternatively be referred to as "localisation", "perimeter" or "perimetric" electrodes. In general, the primary sensing electrodes 12, $P_n$ and/or the secondary sensing electrodes 13, $S_m$ may be co-planar, or may all be supported by a single face of a material which may be flat (planar) or curved, for example the casing of a device or appliance as described elsewhere herein.

In some examples, a secondary sensing electrode 13, $S_m$ may belong to a pair of active regions 19$_k$, 19$_k$*, which are closely spaced and adjacent. A shared secondary sensing electrode 13, $S_m$ may be useful to distinguish and mask an applied force F having a centroid coordinate ($x_F$, $y_F$) on a boundary between such a pair of adjacent active regions 19$_k$, 19$_{k1}$).

First Active Region

Referring also to FIG. 8, a first configuration of an active region 19, 28 (also referred to as the "first active region" hereinafter) is shown.

The first active region 28 has a perimeter 14 in the form of a generally square perimeter 29, which encloses a number N of primary sensing electrodes 12, $P_1, \ldots, P_n, \ldots, P_N$. First and second regions 30$_1$, 30$_2$ of conductive material (first and second "conductive regions" hereinafter) are disposed on opposite sides of the first active region 28 along a first direction x, bracketing (or sandwiching) the perimeter 29 and primary sensing electrodes 12, $P_n$. Similarly, third and fourth regions 30$_3$, 30$_4$ of conductive material (third and fourth "conductive regions" hereinafter) are disposed on opposite sides of the first active region 28 along a second direction y which is different to the first direction x. Each conductive region 30$_1$, 30$_2$, 30$_3$, 30$_4$ extends substantially along the length of an adjacent edge of the square perimeter 29. In other words, the conductive regions 30$_1$, 30$_2$, 30$_3$, 30$_4$ may be considered to at least partly define the perimeter 29. Each conductive region 30$_1$, 30$_2$, 30$_3$, 30$_4$ is electrically connected to a respective conductive trace 31$_1$, 31$_2$, 31$_3$, 31$_4$.

The conductive regions 30$_1$, 30$_2$, 30$_3$, 30$_4$ and the generally square perimeter 29 are shown in schematic plan view in FIG. 8. However, the specific numbers, shapes, relative positions and/or relative areas of the primary sensing electrodes 12, $P_1, \ldots, P_n, \ldots, P_N$ are not relevant to understanding the first active region 28 and consequently are shown as representative blocks in FIG. 8.

The first active region may be configured with between one and four secondary sensing electrodes 13, $S_m$, depending on the connections of the conductive regions 30$_1$, 30$_2$, 30$_3$, 30$_4$ and/or the processing of signals from the conductive regions 30$_1$, 30$_2$, 30$_3$, 30$_4$.

Quad Secondary Sensing Electrode Configuration

The first active region 28 may be configured so that each conductive region 30$_1$, 30$_2$, 30$_3$, 30$_4$ provides a respective secondary sensing electrode 13, $S_1$, $S_2$, $S_3$, $S_4$. Measurements from each of the four secondary sensing electrodes 13, $S_1$, $S_2$, $S_3$, $S_4$ may be readout using the respective conductive traces 31$_1$, 31$_2$, 31$_3$, 31$_4$.

Dual Secondary Sensing Electrode Configuration

The first active region 28 may be configured so that the conductive regions 30$_1$, 30$_2$, 30$_3$, 30$_4$ provide a pair of secondary sensing electrodes 13, $S_1$, $S_2$.

The first and second conductive regions 30$_1$, 30$_2$ may be electrically connected together to provide the first secondary sensing electrode 13, $S_1$. For example, the first and second conductive traces 31$_1$, 31$_2$ could be merged between the first active region 28 and a readout from the piezoelectric sensor 16. Alternatively, the first conductive trace 31$_1$ may be routed to the second conductive region 30$_2$, while the second conductive trace 31$_2$ is routed to allow connection off the piezoelectric sensor 16 (for example to a measurement front end 10). The electrical connection between the first and second conductive regions 30$_1$, 30$_2$ may in general be direct or indirect, and either internal or external to the piezoelectric sensor. An internal connection is part of, or supported on, the piezoelectric sensor 16 itself, for example by merging the first and second conductive traces 31$_1$, 31$_2$ into a single conductive trace for readout. An external connection may be formed away from the piezoelectric sensor 16, for example using wires or by merging the connections leading to the first and second conductive regions 30$_1$, 30$_2$ at an input to an amplifier forming part of the measurement front end 10.

Herein, electrically connected refers to ohmic or resistive coupling, rather than capacitive and/or inductive coupling. In other words, a physical connection between electrically conductive materials. An electrical connection may be made via any number of different conductive materials, for example, a pair of conductive traces formed of a first conductive material may be soldered to opposite ends of a wire formed from a second conductive material, the solder being a third conductive material.

The third and fourth conductive regions 30$_3$, 30$_4$ may also be electrically connected together to provide the second secondary sensing electrode 13, $S_2$. An electrical connection between the third and fourth conductive regions 30$_3$, 30$_4$ may take any form described in relation to the first and second conductive regions 30$_1$, 30$_2$.

In this way, the first active region 28 may be configured to have a pair of secondary sensing electrodes 13, $S_1$, $S_2$. The first secondary sensing electrode 13, $S_1$ is formed from the first and second conductive regions 30$_1$, 30$_2$ and may be used to detect when the centroid coordinate ($x_F$, $y_F$) of an applied force F crosses the perimeter 29 moving parallel to the first direction x. The second secondary sensing electrode 13, $S_2$ is formed from the third and fourth conductive regions 30$_3$, 30$_4$ and may be used to detect when the centroid coordinate ($x_F$, $y_F$) of an applied force F crosses the perimeter 29 moving parallel to the second direction y.

An alternative dual-secondary sensing electrode configuration may be provided by electrically connecting the first conductive region 30$_1$ to the third conductive region 30$_3$ and electrically connecting the second conductive region 30$_2$ to the fourth conductive region 30$_4$. Another dual-secondary sensing electrode configuration may be provided by electrically connecting the first conductive region 30$_1$ to the fourth conductive region 30$_4$ and electrically connecting the second conductive region 30$_2$ to the third conductive region 30$_3$.

Single Secondary Sensing Electrode Configuration

The first active region 28 may be configured so that the conductive regions 30$_1$, 30$_2$, 30$_3$, 30$_4$ provide a single secondary sensing electrode 13, $S_1$.

For example, the first, second, third and fourth conductive regions 30$_1$, 30$_2$, 30$_3$, 30$_4$ may all be electrically connected together to provide a single secondary sensing electrode 13, $S_1$. The electrical connections amongst the conductive regions $30_1$, $30_2$, $30_3$, $30_4$ may take any form described hereinbefore, and in particular may be direct or indirect, and internal or external to the piezoelectric sensor.

Number of Secondary Sensing Electrodes to Use

In some implementations of a piezoelectric sensor, the strain resulting from an applied force F, and hence the associated piezoelectric polarisation and signal, decreases reasonably quickly with distance from the centroid coordinate ($x_F$, $y_F$). Consequently piezoelectric signals may be dominated by the charge measured from the sensing electrode 12, $P_n$, 13, $S_m$ closest to the centroid coordinate ($x_F$, $y_F$). In such circumstances, it may be sufficient for localisation to employ a single secondary sensing electrode 13, $S_1$ which completely or substantially encloses the square perimeter 29 of the first active region 28, for example, using the single secondary electrode configuration of the first active region 28 described hereinbefore (alternatively see FIGS. 11 and 12). The maximum signal method described hereinbefore may be applied, and a force F may be determined to be outside the perimeter 29 if the charge $Qs_1$ (or adjusted charge $As_1$) on the single secondary sensing electrode 13, $S_1$ is the largest measured for the first active region 28.

Application of the maximum signal method should be contingent on confirming (using calibration experiments and/or simulations) that the charge $Qs_1$ (or adjusted charge $As_1$) from the single secondary electrode 13, $S_1$ will be smaller than at least one of the primary piezoelectric charges $Qp_1, \ldots, Qp_N$ (or adjusted charges $Ap_1, \ldots, Ap_N$) when the centroid coordinate ($x_F$, $y_F$) of an applied force F is within the perimeter 29. Whether or not this condition can be satisfied may depend on factors including, but not limited to, the relative position of the first active region 28 on the piezoelectric sensor 16, the mechanical support and boundary conditions of the piezoelectric sensor 16, the shape and/or curvature of the piezoelectric sensor 16, and so forth. The maximum signal method need not be used, and a single secondary sensing electrode 13, $S_1$ which completely or substantially encloses the perimeter 29 of the first active region 28 may alternatively be combined with the threshold multiplier method.

The applicability of a single secondary sensing electrode 13, $S_1$ for localising inputs to any particular example of the first active region 28 may be checked through calibration measurements using known forces F applied at known coordinates ($x_F$, $y_F$) and/or by modelling (for example finite element analysis).

Often, the distribution of charges induced by polarisation of a piezoelectric layer 7 of a piezoelectric sensor 16 exhibits one or more of lateral spreading, anisotropy and/or a dependence on the centroid coordinate ($x_F$, $y_F$) of an applied force F in addition to the magnitude of the force F itself. Such effects may depend on factors including, but not limited to, the relative position of the first active region 28 on the piezoelectric sensor 16, the mechanical support and boundary conditions of the piezoelectric sensor 16, the shape and/or curvature of the piezoelectric sensor 16, and so forth. Consequently some implementations of the first active region 28 may obtain more reliable localisation of a force F generating piezoelectric charges $Qp_n$, $Qs_m$ to inside/outside the perimeter 29 by using a dual- or quad-secondary sensing electrode configuration of the first active region. The most accurate configuration for connecting (or not) the conductive regions $30_1$, $30_2$, $30_3$, $30_4$ needs to be determined in each case by calibration experiments and or modelling such as finite element analysis.

The quad-secondary sensing electrode configuration may be used for calibration experiments and/or modelling purposes. Each conductive region $30_1$, $30_2$, $30_3$, $30_4$ then corresponds to a respective secondary sensing electrode 13, $S_1$, $S_2$, $S_3$, $S_4$. Piezoelectric charges $Qs_1$, $Qs_2$, $Qs_3$, $Qs_4$, $Qp_1, \ldots, Qp_N$ induced in response to a known force F applied at a range of controlled or known locations spanning the perimeter 29 in at least first and second directions x, y may be measured and/or modelled. Secondary piezoelectric charges corresponding to the dual secondary electrode configuration may be estimated as $Qs_1+Qs_2$ and $Qs_3+Qs_4$ (or appropriate sums for other configurations), and secondary piezoelectric charges corresponding to the single secondary electrode configuration may be estimated as $Qs_1+Qs_2+Qs_3+Qs_4$. Using these measured and/or calculated piezoelectric charges $Qp_n$, $Qs_m$, the possible combinations of secondary electrode configuration (quad, dual or single) and signal processing method (maximum signal, threshold multiplier(s)) may be applied, and those which are capable of localising the centroid coordinate ($x_F$, $y_F$) of an applied force to within the perimeter 29 can be identified. A transition region may be defined as a measure of quality, representing a locus of centroid coordinates ($x_F$, $y_F$) for which a fixed force F would produce piezoelectric charges $Qp_n$, $Qs_m$ (or values derived from them) having a difference smaller than a threshold value such as a measured standard error (or a multiple thereof) of the charge measurements. Preferably, the combination of secondary electrode configuration (quad, dual or single) and signal processing method (maximum signal, threshold multiplier(s)) providing the narrowest transition region should be selected.

For the purpose of conducting such simulations, finite element analysis of mechanical deformation linked to electrostatic coupling of an electric field to electrodes (via the strain computed for a piezoelectric layer 7) may be solved using commercial available packages such as Comsol®. Selecting the most appropriate secondary sensing electrode configuration is discussed in relation to three examples hereinafter (see FIGS. 35 through 38H).

Although quad, dual and single secondary sensing electrode configurations have been described, in general any number M of secondary sensing electrodes 13, $S_1, \ldots S_M$ may be used, for example one, two, three, four, five or more. A triple secondary sensing electrode configuration could be provided using the first active region 28 by, for example, electrically connecting the first and second conductive regions $30_1$, $30_2$ to provide a first secondary sensing electrode $S_1$, whilst using the third and fourth conductive regions $30_3$, $30_4$ as separate second and third secondary sensing electrodes $S_2$, $S_3$.

Although configurations have been described in which one or more of the conductive regions $30_1$, $30_2$, $30_3$, $30_4$ of the first active region 28 are physically, electrically connected together, equivalent functionality may instead by provided by combining piezoelectric signals 20 and/or piezoelectric charges $Qp_n$, $Qs_m$ in the controller 17 (for example in the measurement front end to or the using the processor(s) 21).

Each of the conductive traces $31_1$, $31_2$, $31_3$, $31_4$ may connect the respective conductive region $30_1$, $30_2$, $30_3$, $30_4$ to a separate input channel of the measurement front end to. A quad secondary sensing electrode configuration is the same as described hereinbefore. An alternative dual secondary sensing electrode configuration may be obtained by summing piezoelectric charges measured from the first and second conductive regions $30_1$, $30_2$ to determine a first secondary piezoelectric charge $Qs_1$ (or adjusted secondary charge $As_1$) corresponding to the first and second regions of conductive material as an effective (or virtual) first secondary sensing electrode $S_1$. Similarly, piezoelectric charges from the third and fourth conductive regions $\mathbf{30}_3$, $\mathbf{30}_4$ may be summed to determine a second secondary piezoelectric charge $Qs_2$ (or adjusted secondary charge $As_2$) corresponding to the third and fourth regions of conductive material as an effective (or virtual) second secondary sensing electrode $S_2$.

Although shown as orthogonal directions x, y in FIG. 8, the first direction and second directions need not be perpendicular, and may be oriented at any angle larger than zero degrees. For example, the first and second directions may make an angle of 30 degrees, or 45 degrees.

The first, second, third and fourth regions of conductive material may in total extend around at least 50%, at least 60%, at least 70%, at least 80%, at least 90% or more than 95% of a length of the perimeter 29.

Second Active Region

Referring also to FIG. 9, a second configuration of an active region 19, 32 (also referred to as the "second active region" hereinafter) is shown.

In the same way as the first active region 28, the second active region 32 has a perimeter 14 in the form of the a generally square perimeter 29, which encloses a number N of primary sensing electrodes 12, $P_1, \ldots, P_n, \ldots, P_N$.

Fifth and sixth regions $\mathbf{30}_5$, $\mathbf{30}_6$ of conductive material (fifth and sixth "conductive regions" hereinafter) are disposed on opposite sides of the second active region 32 along a first direction x', bracketing (or sandwiching) the perimeter 29 and primary sensing electrodes 12, $P_n$. Similarly, seventh and eighth regions $\mathbf{30}_7$, $\mathbf{30}_8$ of conductive material (seventh and eighth "conductive regions" hereinafter) are disposed on opposite sides of the second active region 32 along a second direction y' which is different to the first direction x'. The edges of the generally square perimeter 29 are aligned with orthogonal axes labelled x and y in FIG. 9, and the first and second directions x', y' are orthogonal to one another and rotated 45 degrees anti-clockwise (counter-clockwise) relative to the axes labelled x and y. Each conductive region $\mathbf{30}_5$, $\mathbf{30}_6$, $\mathbf{30}_7$, $\mathbf{30}_8$ is electrically connected to a respective conductive trace $\mathbf{31}_5$, $\mathbf{31}_6$, $\mathbf{31}_7$, $\mathbf{31}_8$.

In the first active region 28, each of the first to fourth conductive regions $\mathbf{30}_1$, $\mathbf{30}_2$, $\mathbf{30}_3$, $\mathbf{30}_4$ extends substantially along the length of an adjacent edge of the square perimeter 29. Similar to the first active region 28, the fifth to eighth conductive regions $\mathbf{30}_5$, $\mathbf{30}_6$, $\mathbf{30}_7$, $\mathbf{30}_8$ may be considered to at least partly define the perimeter 29. However, in contrast to the first active region 28, each of the fifth to eighth conductive regions $\mathbf{30}_5$, $\mathbf{30}_6$, $\mathbf{30}_7$, $\mathbf{30}_8$ includes a corner corresponding to a corner of the square perimeter 29, and extends along the edges of the square perimeter 29 which meet at that corner. Each of the fifth to eighth conductive regions $\mathbf{30}_5$, $\mathbf{30}_6$, $\mathbf{30}_7$, $\mathbf{30}_8$ extends substantially to the middle of the edges of the square perimeter 29 which meet at the corresponding corner, with a gap to provide electrical isolation from the adjacent conductive regions $\mathbf{30}_5$, $\mathbf{30}_6$, $\mathbf{30}_7$, $\mathbf{30}_8$.

With the exception of the shape and positioning of the conductive regions 305, 306, 307, $\mathbf{30}_8$ relative to the generally square perimeter 29, the second active region 32 is the same as the first active region 28.

The conductive regions $\mathbf{30}_5$, $\mathbf{30}_6$, $\mathbf{30}_7$, $\mathbf{30}_8$ and the generally square perimeter 29 are shown in schematic plan view in FIG. 9. However, the specific numbers, shapes, relative positions and/or relative areas of the primary sensing electrodes 12, $P_1, \ldots, P_n, \ldots, P_N$ are not relevant to understanding the second active region 32 and consequently are shown as representative blocks in FIG. 9.

In the same way as the first active region 28, the second active region 32 may be configured with between one and four secondary sensing electrode 13, $S_m$, depending on the connections of the conductive regions $\mathbf{30}_5$, $\mathbf{30}_6$, $\mathbf{30}_7$, $\mathbf{30}_8$ and/or the processing of signals from the conductive regions $\mathbf{30}_5$, $\mathbf{30}_6$, $\mathbf{30}_7$, $\mathbf{30}_8$.

The first and second active regions 28, 32 have been described as including perimeters 14 in the form of generally square perimeter 29 (and generally square includes square). However, either of the first and second active regions 28, 32 may be simply modified to work with a perimeter 14 which is rectangular in shape, or which takes the form of an irregular quadrilateral.

The use of four conductive regions spaced around the perimeter 14 of an active region 19 is not limited to regular and/or irregular quadrilaterals, and in general may be applied to an active region 19 having a perimeter 14 defined by any closed curve, for example, in the shape of any regular or irregular polygon, a circle or ellipse, an irregular curve, and so forth.

Third Active Region

For example, referring also to FIG. 10, a third configuration of an active region 19, 33 (also referred to as the "third active region" hereinafter) is shown.

Similar to the first and second active regions 28, 32, the third active region 33 includes four conductive regions $\mathbf{30}_9$, $\mathbf{30}_{10}$, $\mathbf{30}_{11}$, $\mathbf{30}_{12}$. Unlike the first and second active regions 28, 32, the third active region 33 includes a perimeter 14 in the form of elliptical perimeter 34 which encloses a number N of primary sensing electrodes 12, $P_1, \ldots, P_n, \ldots, P_N$.

Ninth and tenth regions $\mathbf{30}_9$, $\mathbf{30}_{10}$ of conductive material (ninth and tenth "conductive regions" hereinafter) are disposed on opposite sides of the third active region 33 along a first direction 35, bracketing (or sandwiching) the perimeter 34 and primary sensing electrodes 12, $P_n$. Similarly, eleventh and twelfth regions $\mathbf{30}_{11}$, $\mathbf{30}_{12}$ of conductive material (eleventh and twelfth "conductive regions" hereinafter) are disposed on opposite sides of the third active region 33 along a second direction 36 which is different to the first direction 35. Each conductive region $\mathbf{30}_9$, $\mathbf{30}_{10}$, $\mathbf{30}_{11}$, $\mathbf{30}_{12}$ is electrically connected to a respective conductive trace $\mathbf{31}_9$, $\mathbf{31}_{10}$, $\mathbf{31}_{11}$, $\mathbf{31}_{12}$.

Each of the ninth to twelfth conductive regions $\mathbf{30}_9$, $\mathbf{30}_{10}$, $\mathbf{30}_{11}$, $\mathbf{30}_{12}$ extends around the curve of the elliptical perimeter 34 along substantially a quadrant of the elliptical perimeter 34. Gaps are left between the ninth to twelfth conductive regions $\mathbf{30}_9$, $\mathbf{30}_{10}$, $\mathbf{30}_{11}$, $\mathbf{30}_{12}$ for electrical isolation amongst the ninth to twelfth conductive regions $\mathbf{30}_9$, $\mathbf{30}_{10}$, $\mathbf{30}_{11}$, $\mathbf{30}_{12}$. The quadrants shown in FIG. 10 correspond to the semi-major and semi-minor axes of the elliptical perimeter 34.

With the exception of the shape and positioning of the perimeter 14, 34 and conductive regions $\mathbf{30}_9$, $\mathbf{30}_{10}$, $\mathbf{30}_{11}$, $\mathbf{30}_{12}$, the third active region 33 is the same as the first or second active regions 28, 32. In particular, the third active region 33 may be configured with between one and four secondary sensing electrode 13, depending on the connections of the conductive regions $\mathbf{30}_9$, $\mathbf{30}_{10}$, $\mathbf{30}_{11}$, $\mathbf{30}_{12}$ and/or the processing of signals from the conductive regions $\mathbf{30}_9$, $\mathbf{30}_{10}$, $\mathbf{30}_{11}$, $\mathbf{30}_{12}$.

The conductive regions $\mathbf{30}_9$, $\mathbf{30}_{10}$, $\mathbf{30}_{11}$, $\mathbf{30}_{12}$ and the elliptical perimeter 34 are shown in schematic plan view in FIG. 10. However, the specific numbers, shapes, relative positions and/or relative areas of the primary sensing electrodes 12, $P_1$, $P_n$, $P_N$ are not relevant to understanding the second active region 32 and consequently are shown as representative blocks in FIG. 10.

Fourth Active Region

For example, referring also to FIG. 11, a fourth configuration of an active region 19, 37 (also referred to as the "fourth active region" hereinafter) is shown.

In the same way as the first and second active regions 28, 32, the fourth active region 37 has perimeter 14 in the form of a generally square perimeter 29 which encloses a number N of primary sensing electrodes 12, $P_1, \ldots, P_n, \ldots, P_N$. Unlike the first and second active regions 28, 32, the fourth active region 37 includes a single secondary sensing electrode 13, $S_1$ provided by a thirteenth region of conductive material $\mathbf{30}_{13}$ (thirteenth "conductive region" hereinafter) extending entirely around the perimeter 29 of the fourth active region 37. The thirteenth conductive region $\mathbf{30}_{13}$ has a hollow square shape enclosing the perimeter 29 and primary sensing electrodes 12, $P_n$. Functionally, the fourth active region 37 will operate similarly to the first or second active regions 28, 32 when either is configured for a single secondary sensing electrode 13, $S_1$.

Since the thirteenth conductive region $\mathbf{30}_{13}$ extends completely around the perimeter 29, conductive traces $\mathbf{38}_1, \ldots, \mathbf{38}_n, \ldots, \mathbf{38}_N$ electrically connecting to the one or more primary sensing electrodes $P_1, \ldots, P_n, \ldots, P_N$ are routed either over or under the thirteenth conductive region $\mathbf{30}_{13}$ using respective jumpers or equivalent structures. Alternatively, the primary sensing electrodes $P_1, \ldots, P_n, \ldots, P_N$ and corresponding conductive traces $\mathbf{38}_1, \ldots, \mathbf{38}_n, \ldots, \mathbf{38}_N$ may be disposed on a different surface which is separated from the thirteenth conductive region $\mathbf{30}_{13}$ by one or more insulating (dielectric) layers (not shown). In other examples, the primary sensing electrodes $P_1, \ldots, P_n, \ldots, P_N$ may be disposed on the same surface as the thirteenth conductive region $\mathbf{30}_{13}$, and the conductive traces $\mathbf{38}_1, \ldots, \mathbf{38}_n, \ldots, \mathbf{38}_N$ may be disposed on a different surface which is separated from the thirteenth conductive region $\mathbf{30}_{13}$ by one or more insulating (or dielectric) layers (not shown), with connections to the primary sensing electrodes $P_1, \ldots, P_n, \ldots, P_N$ provided using vias extending through the one or more insulating layers (not shown).

Figure 11:
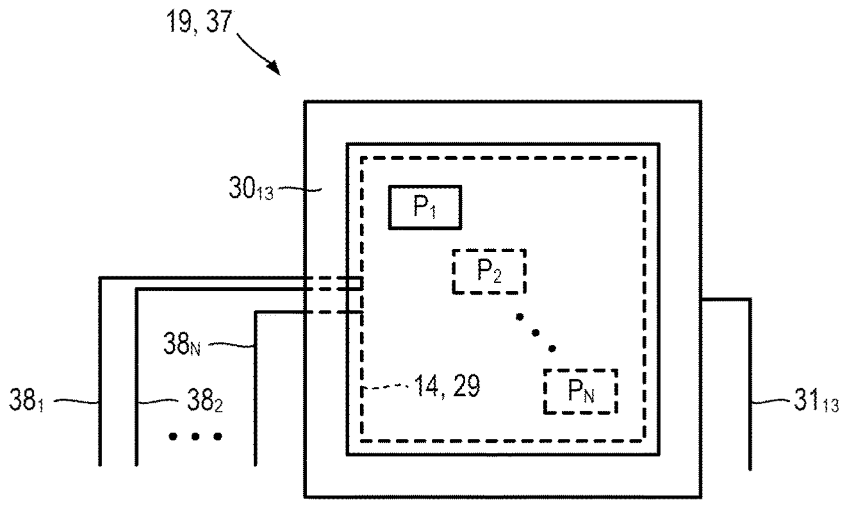
FIG. 11 schematically illustrates a fourth configuration of an active region.

The thirteenth conductive region $\mathbf{30}_{13}$ and the generally square perimeter 29 are shown in schematic plan view in FIG. 11. However, the specific numbers, shapes, relative positions and/or relative areas of the primary sensing electrodes 12, $P_1, \ldots, P_n, \ldots, P_N$ are not relevant to understanding the second active region 32 and consequently are shown as representative blocks in FIG. 11.

The fourth active region 37 has been described as including a perimeter 14 in the form of generally square perimeter 29 (and generally square includes square). However, the fourth active region 37 may be simply modified to work with a perimeter 14 which is rectangular in shape, or which in general may be defined by any closed curve, for example, in the shape of any regular or irregular polygon, a circle or ellipse, an irregular curve, and so forth. Regardless of the specific shape of the perimeter 14, the thirteenth conductive region $\mathbf{30}_{13}$ may take a corresponding shape fully enclosing or surrounding that perimeter 14.

Fifth Active Region

Instead of extending completely around the perimeter, a conductive region providing a single secondary sensing electrode 13, $S_1$ may include one or more gaps to allow routing of conductive traces $\mathbf{38}_1, \ldots, \mathbf{38}_n, \ldots, \mathbf{38}_N$ electrically connecting to the primary sensing electrodes 12, $P_N$.

For example, referring also to FIG. 12, a fifth configuration of an active region 19, 39 (also referred to as the "fifth active region" hereinafter) is shown.

The fifth active region 39 is the same as the fourth active region 37, except that a fourteenth conductive region $\mathbf{30}_{14}$ providing the single secondary sensing electrode 13, $S_1$ includes a gap 40 through which the conductive traces $\mathbf{38}_1, \ldots, \mathbf{38}_n, \ldots, \mathbf{38}_N$ electrically connecting to the primary sensing electrodes 12, $P_1, \ldots. P_n, \ldots, P_N$ are routed. The gap 40 should preferably be just large enough to allow passage of all the conductive traces $\mathbf{38}_1, \ldots, \mathbf{38}_n, \ldots, \mathbf{38}_N$. The fourteenth conductive region $\mathbf{30}_{14}$ extends around a majority of the perimeter 29 of the fifth active region 39. A majority may correspond to at least 50%, at least 60%, at least 70%, at least 80%, at least 90% or at least 95% of the length of the perimeter 29.

Figure 12:
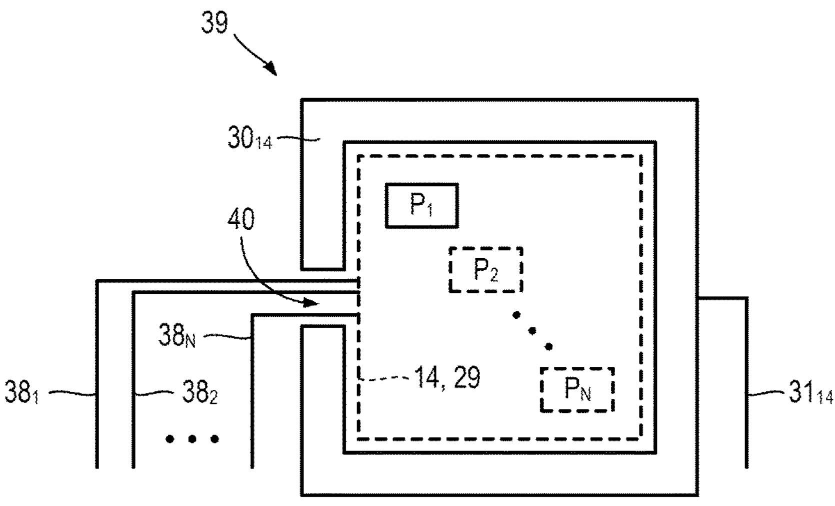
FIG. 12 schematically illustrates a fifth configuration of an active region.

The fourteenth conductive region $\mathbf{30}_4$ and the generally square perimeter 29 are shown in schematic plan view in FIG. 12. However, the specific numbers, shapes, relative positions and/or relative areas of the primary sensing electrodes 12, $P_1, \ldots, P_n, \ldots, P_N$ are not relevant to understanding the second active region 32 and consequently are shown as representative blocks in FIG. 12.

The fourth active region 37 has been described as including a perimeter 14 in the form of generally square perimeter 29 (and generally square includes square). However, the fifth active region 39 may be simply modified to work with a perimeter 14 which is rectangular in shape, or which in general may be defined by any closed curve, for example, in the shape of any regular or irregular polygon, a circle or ellipse, an irregular curve, and so forth. Regardless of the shape of the perimeter 14, the fourteenth conductive region $\mathbf{30}_{14}$ may take a conforming shape which encloses or surrounds that perimeter 14 with the exception of a gap 40.

Casing Integrated Piezoelectric Sensor

As described in relation to the first piezoelectric sensor 1, the counter electrode 3 for a piezoelectric sensor 16 may take the form of a metal casing of a device which requires input, for example a steel casing.

Figure 13:
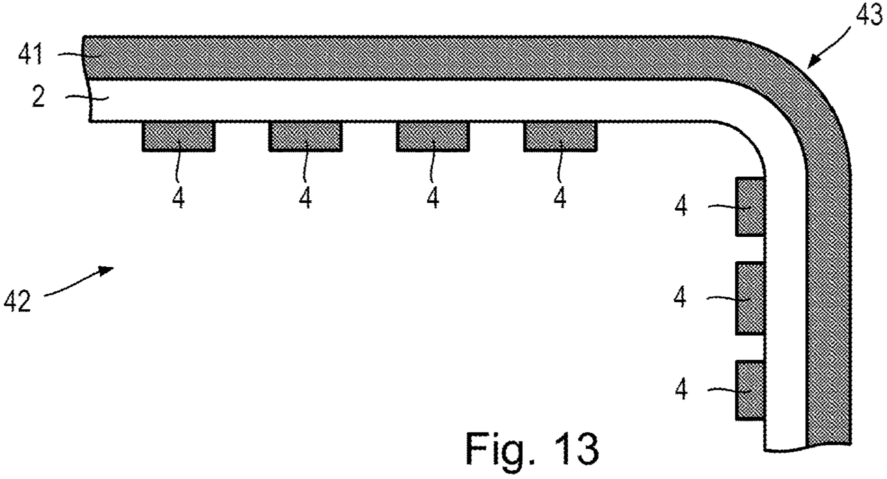
FIG. 13 is a schematic cross-section of a metal casing of a device which supports piezoelectric sensors.

Referring also to FIG. 13, a portion of a metal casing 41 for a device or appliance (not shown) requiring input controls is shown.

A casing integrated piezoelectric sensor 42 (hereinafter "integrated piezoelectric sensor") may be formed by attaching a layer structure 2 supporting a plurality of sensing electrodes 4 to the interior surface of the casing 41. The layer structure 2 may include, for example a piezoelectric material layer 7 having sensing electrodes 4 deposited on one face, and a pressure sensitive adhesive applied to the opposite face for attachment to the casing 41. The sensing electrodes 4 are divided into primary sensing electrodes 12, $P_n$ and secondary sensing electrodes 13, $S_m$, and arranged into active regions 19 to provide user input controls as described herein.

Whilst the portion(s) of the casing 41 supporting the integrated piezoelectric sensor 42 may be substantially flat or planar, the layer structure 2 may be made thin and flexible, enabling attachment to portions of the casing 41 which are curved or which include corners and/or edges 43.

The metal casing 41 is made using a metal sheet, typically formed from steel (preferably stainless steel) or aluminium, although any metal suitable for forming a device or appliance casing may be used. Such metal casings 41 of devices/appliances are typically grounded (or held at a common mode potential), and therefore may be used to provide the counter electrode 3 of a piezoelectric sensor 16 such as the integrated piezoelectric sensor 42 without disturbing normal operation of the device or appliance. Input controls may be indicated to a user by indicia printed, engraved, embossed, attached or otherwise defined on the exterior surface of the casing 41 overlying the sensing electrodes 4 intended for use as primary sensing electrodes 12, $P_n$.

Using a metal casing 41 of a device/appliance as part of a user input panel would be impossible with capacitive sensing (at least where more than a single input is needed), because a metallic, conductive casing would shield electric fields generated using sensing electrodes from interacting with a user. Direct integration of a user input controls into the metal casing 41 of a device/appliance may be aesthetically appealing, but may also serve a technical purpose since physical interruption of the casing may be avoided, consequently improving the mechanical strength of a device/appliance and the sealing against ingress of liquids, particles and so forth.

First Counter Electrode Configuration

The counter electrode 3 of the first piezoelectric sensor 1 may take the form of a single, uniform electrode (which could alternatively be termed a "global" counter electrode). In this configuration, piezoelectric signals 20 and charges $Qp_n$, $Qs_m$ must be measured using the sensing electrodes 4 in order to provide any localisation, since charge on a single counter electrode 3 will indicate only an overall applied force. Overall applied force may be of interest in some applications, and optionally the measurement front end 10 may include a channel for reading out a total charge induced on the counter electrode 3. If optional capacitance measurements are also obtained, these also must be performed using the sensing electrodes 4. For capacitance measurements, the sensing electrodes 4 need to be closest to a user input surface in use, in order to prevent electrostatic screening by the single counter electrode 3.

However, piezoelectric sensors 16 for use in a device 15 are not limited to using a single counter electrode 3.

Second Counter Electrode Configuration

Referring also to FIG. 14 a second piezoelectric sensor 18 is shown.

The second piezoelectric sensor 18 is the same as the first piezoelectric sensor 1, except that a single uniform (or blanket) counter electrode 3 is replaced by a number of separate counter electrodes 3. The second piezoelectric sensor 18 may provide the piezoelectric sensor 16 of a device 15. Each sensing electrode 4 is opposed across the layer structure 2 by a respective counter electrode 3 which is substantially (or completely) coincident and co-extensive with that sensing electrode 4. In other words, the counter electrode 3 corresponding to a given sensing electrode 4 has the same shape, area, orientation and centroid coordinate as that sensing electrode 4, and therefore completely overlaps that sensing electrode 4. In some examples, a sensing electrode 4 and the opposing counter electrode 3 need not have exactly the same shape, area and/or orientation, but their respective centroids may coincide so that they overlap at least partially.

The second counter electrode configuration, including a separate counter electrode 3 corresponding to each of the sensing electrodes 4, enables differential measurements of piezoelectric charges $Qp_n$, $Qs_m$. This may reduce interference from noise in the form of external electric fields, and may improving the signal-to-noise ratio for measuring piezoelectric charges $Qp_n$, $Qs_m$.

First Counter Electrode Layout

Figure 15:
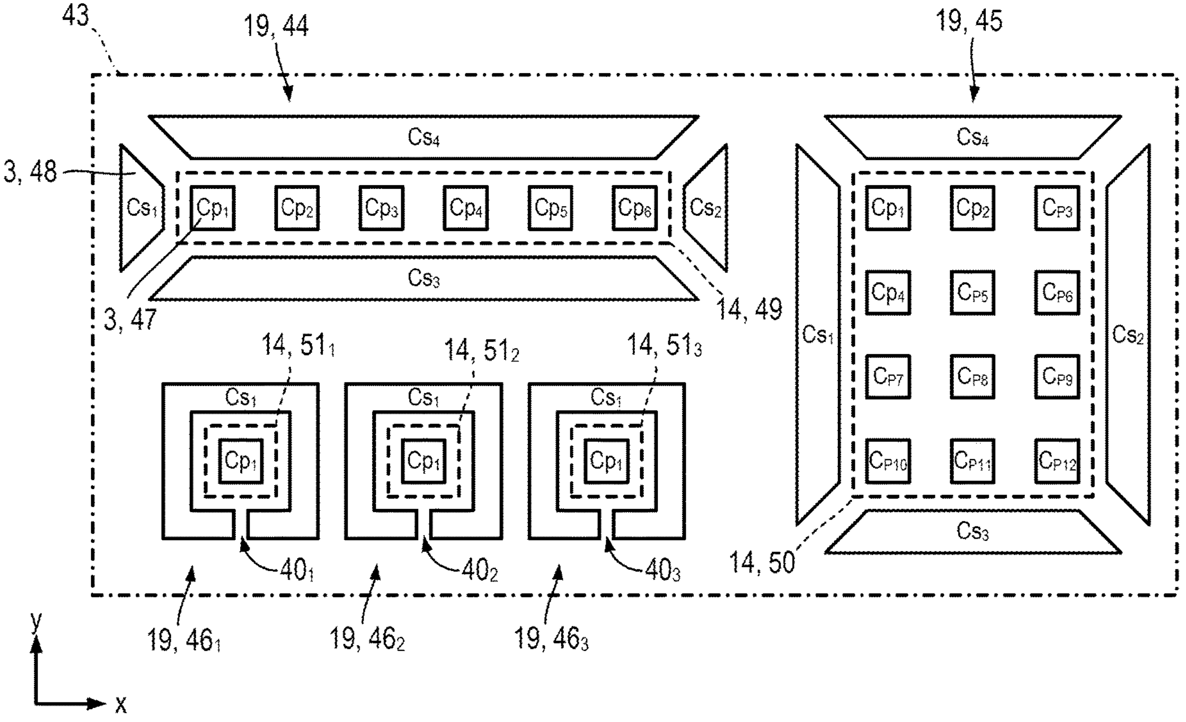
FIG. 15 schematically illustrates a first example of a counter electrode layout.

Referring also to FIG. 15, a first example of a counter electrode layout 43 for a user input panel (hereinafter "first counter electrode layout") is shown.

The first counter electrode layout 43 includes active regions 19 in the form of a slider active region 44, a button/touch pad active region 45 and three discrete button active regions $\mathbf{46}_1$, $\mathbf{46}_2$, $\mathbf{46}_3$. Each active region 19, 44, 45, $\mathbf{46}_1$, $\mathbf{46}_2$, $\mathbf{46}_3$ includes a number NC of counter electrodes 3 in the form of primary counter electrodes 47, $CP_1, \ldots, Cp_n, \ldots, Cp_{NC}$, and a number MC of counter electrodes 3 in the form of secondary counter electrodes 48, $Cs_1, \ldots, Cs_m, \ldots, Cs_{MC}$. In the first counter electrode layout $\mathbf{4}_3$, each primary counter electrode 47, $Cp_1, \ldots, Cp_n, \ldots, Cp_{NC}$ corresponds in shape, area, orientation and position to a primary sensing electrode 12, $P_1, \ldots, P_n, \ldots, P_N$, so that the number N of primary sensing electrodes 12 $P_n$ is equal to the number NC of primary counter electrodes 47, $Cp_n$, i.e. NC=N Similarly, each secondary counter electrode 48, $Cs_1, \ldots, Cs_m, \ldots, Cs_{MC}$ corresponds in shape, area, orientation and position to a secondary sensing electrode 13, $S_1, \ldots, S_m, \ldots, S_M$, so that the number M of secondary sensing electrodes 13, $S_m$ is equal to the number MC of secondary counter electrodes 48, $Cs_m$, i.e. MC=M.

The slider active region 44 includes a linear array of six primary sensing electrodes 12, $P_1$, $P_2$, $P_3$, $P_4$, $P_5$, $P_6$, separated by a perimeter 14 in the form of a rectangular perimeter 49 from four secondary sensing electrodes 13, $S_1$, $S_2$, $S_3$, $S_4$ provided by first to fourth conductive regions as described in relation to the first active region 28. The slider active region 44 also includes a corresponding linear array of six primary counter electrodes 47, $Cp_1$, $Cp_2$, $Cp_3$, $Cp_4$, $Cp_5$, $Cp_6$ which are coincident and co-extensive with the primary sensing electrodes 12, $P_1$, $P_2$, $P_3$, $P_4$, $P_5$, $P_6$ across the piezoelectric layer 7, and four secondary counter electrodes 48, $Cs_1$, $Cs_2$, $Cs_3$, $Cs_4$ which are coincident and co-extensive with the secondary sensing electrodes 13, $S_1$, $S_2$, $S_3$, $S_4$ across the piezoelectric layer 7. Each of the primary counter electrodes 47, $Cp_1$, $Cp_2$, $Cp_3$, $Cp_4$, $Cp_5$, $Cp_6$ and the secondary counter electrodes 48, $Cs_1$, $Cs_2$, $Cs_3$, $Cs_4$ is electrically connected a respective conductive trace (not shown).

The button/touch pad active region 45 includes an array of twelve primary sensing electrodes 12, $P_1, \ldots, P_{12}$ arranged into four rows and three columns, and separated by a perimeter 14 in the form of a rectangular perimeter 50 from four secondary sensing electrodes 13, $S_1$, $S_2$, $S_3$, $S_4$ provided by first to fourth conductive regions as described in relation to the first active region 28. The button/touch pad active region 45 also includes an array of twelve primary counter electrodes 47, $Cp_1, \ldots, Cp_{12}$ which are coincident and co-extensive with the primary sensing electrodes 12, $P_1, \ldots, P_{12}$ across the piezoelectric layer 7, and four secondary counter electrodes 48, $Cs_1$, $Cs_2$, $Cs_3$, $Cs_4$ which are coincident and co-extensive with the secondary sensing electrodes 13, $S_1$, $S_2$, $S_3$, $S_4$ across the piezoelectric layer 7. Each of the primary counter electrodes 47, $Cp_1, \ldots, Cp_{12}$ and the secondary counter electrodes 48, $Cs_1$, $Cs_2$, $Cs_3$, $Cs_4$ is electrically connected to a respective conductive trace (not shown).

Each of the three discrete button active regions $\mathbf{46}_1$, $\mathbf{46}_2$, $\mathbf{46}_3$ includes a single primary sensing electrode 12, $P_1$ separated by a corresponding perimeter 14 in the form of a square perimeter $\mathbf{51}_1$, $\mathbf{51}_2$, $\mathbf{51}_3$ from a single secondary sensing electrodes 13, $S_1$ provided by a single conductive region as described in relation to the fifth active region 39. As with the slider active region 44 and the button/touch pad active region 45, each discrete button active region $\mathbf{46}_1$, $\mathbf{46}_2$, $\mathbf{46}_3$ also includes a single primary counter electrode 47, $Cp_1$ which is coincident and co-extensive with the single primary sensing electrode 12, $P_1$ across the piezoelectric layer 7, and a single secondary counter electrode 48, $Cs_1$ which are coincident and co-extensive with the single secondary sensing electrode 13, $S_1$ across the piezoelectric layer 7. The primary counter electrodes 47, $Cp_n$ and the secondary counter electrode 48, $Cs_1$ of each discrete button active regions $46_1$, $46_2$, $46_3$ is electrically connected to a respective conductive trace (not shown). Each secondary counter electrode 48, $Cs_1$ of each discrete button active regions $46_1$, $46_2$, $46_3$ includes a respective gap $40_1$, $40_2$, $40_3$ for routing a conductive trace (not shown) to electrically contact the corresponding primary counter electrode 47, $Cp_1$.

Only the primary counter electrodes 47, $Cp_n$ and the secondary counter electrodes 48, $Cs_m$ are shown in FIG. 15, however, the primary sensing electrodes 12, $P_n$ and secondary sensing electrodes 13, $S_m$ have identical relative sizes, shapes, orientations and positions on, or over, the first face 5.

Using sensing electrodes 12, $P_n$, 13, $S_m$ and corresponding counter electrodes 47, $Cp_n$, 48, $Cs_m$, the first counter electrode layout 43 allows for differential measurements of the primary piezoelectric charges $Qp_n$ between the $n^{th}$ pair of primary sensing electrode 12, $P_n$ and primary counter electrode 47 $Cp_n$, and the secondary piezoelectric charges $Qs_m$ between the $m^{th}$ pair of secondary sensing electrode 13, $S_m$ and secondary counter electrode 38 $Cs_m$.

The first counter electrode layout 43 may be used for capacitance measurements using whichever of the primary sensing electrodes 12, $P_n$, and the primary counter electrodes 47, $Cp_n$ is (or will be) closest to a user providing input during use. Capacitance measurements may be self-capacitance measurements using individual primary sensing electrodes 12, $P_n$ (or primary counter electrodes 47, $Cp_n$), or capacitive measurements may be mutual-capacitance measurements using pairs of primary sensing electrodes 12, $P_n$ (or pairs of primary counter electrodes 47, $Cp_n$). Capacitance measurements may be used to provide more precise localisation during optimal input conditions, for example in dry conditions when a user presses using a digit (without any gloves) and/or uses a conductive stylus.

Second Counter Electrode Layout

Figure 16:
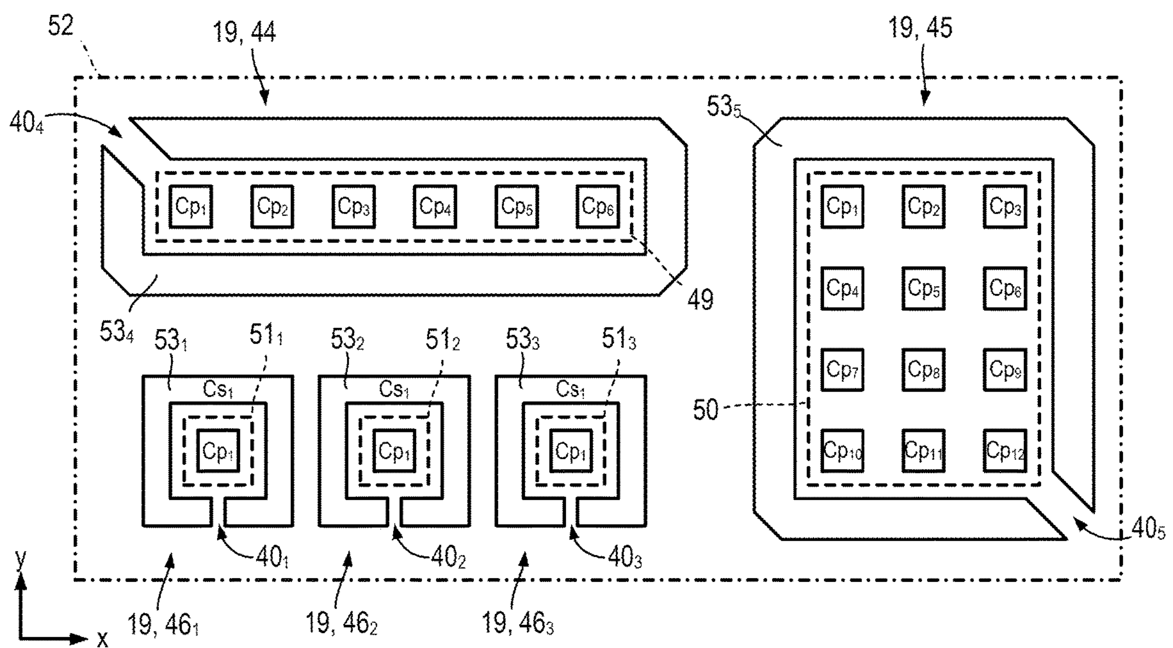
FIG. 16 schematically illustrates a second example of a counter electrode layout.

Referring also to FIG. 16, a second example of a counter electrode layout 52 for a user input panel (hereinafter "second counter electrode layout") is shown.

The second counter electrode layout 52 is for use with an identical layout of primary sensing electrodes 12, $P_n$ and secondary sensing electrodes 13 $S_m$ as the first counter electrode layout 43. The second counter electrode layout 52 has identical primary counter electrodes 47, $Cp_n$ to the first counter electrode layout 43. The second counter electrode layout 52 differs from the first counter electrode layout 43 in that, for each active region 44, 45, $46_1$, $46_2$, $46_3$, all of the secondary sensing electrodes 13, $S_m$ of that active region are opposed across the layer of piezoelectric material 7 by a single common secondary counter electrode 53.

Each common secondary counter electrode 53 is shaped and dimensioned to partially or completely overlap each of the M≥1 secondary sensing electrodes 13, $S_1, \ldots, S_M$ of the respective active region 19, 44, 45, $46_1$, $46_2$, $46_3$. Each of the three discrete button active regions $46_1$, $46_2$, $46_3$ only included a single common secondary counter electrode 48, $Cs_1$ in the first counter electrode layout $4_3$, and these are consequently the same for the second counter electrode layout 52 and provide the corresponding common secondary counter electrodes $53_1$, $53_2$, $54_3$.

In the same way as the first counter electrode layout $4_3$, the slider active region 44 of the second counter electrode layout 52 includes a linear array of six primary counter electrodes 47, $Cp_1$, $Cp_2$, $Cp_3$, $Cp_4$, $Cp_5$, $Cp_6$ which are coincident and co-extensive with the primary sensing electrodes 12, $P_1$, $P_2$, $P_3$, $P_4$, $P_5$) $P_6$ across the piezoelectric layer 7. Unlike the first counter electrode layout 43, the slider active region 44 of the second counter electrode layout 52 includes a common secondary counter electrode $53_4$ which overlaps with all of the secondary sensing electrodes 13, $S_1$, $S_2$, $S_3$, $S_4$ across the piezoelectric layer 7. Each of the primary counter electrodes 47, $Cp_1$, $Cp_2$, $Cp_3$, $Cp_4$, $Cp_5$, $Cp_6$ and the common secondary counter electrode $53_4$ is electrically connected to a respective conductive trace (not shown). The common secondary counter electrode $53_4$ completely encloses the rectangular perimeter 49 of the slider active region 44, with the exception of a gap $40_4$ to permit routing of conductive traces (not shown) electrically connecting to the primary counter electrodes 47, $Cp_1$, $Cp_2$, $Cp_3$, $Cp_4$, $Cp_5$, $Cp_6$.

In the same way as the first counter electrode layout 43, the button/touch pad active region 45 of the second counter electrode layout 52 includes an array of twelve primary counter electrodes 47, $Cp_1$, $Cp_{12}$ which are coincident and co-extensive with the primary sensing electrodes 12, $P_1, \ldots, P_{12}$ across the piezoelectric layer 7. Unlike the first counter electrode layout 43, the button/touch pad active region 45 of the second counter electrode layout 52 includes a common secondary counter electrode $53_5$ which overlaps with all of the secondary sensing electrodes 13, $S_1$, $S_2$, $S_3$, $S_4$ across the piezoelectric layer 7. Each of the primary counter electrodes 47, $Cp_1, \ldots, Cp_{12}$ and the common secondary counter electrode $53_5$ is electrically connected to a respective conductive trace (not shown). The common secondary counter electrode $53_5$ completely encloses the rectangular perimeter 50 of the button/touch pad active region 45, with the exception of a gap $40_5$ to permit routing of conductive traces (not shown) electrically connecting to the primary counter electrodes 47, $Cp_1, \ldots, Cp_{12}$.

In use, a piezoelectric sensor 16 using the second counter electrode layout 52 is arranged such that the primary counter electrodes 47, $Cp_n$ are closest to a user providing input. In this way, the second counter electrode layout 52 allows for differential measurements of the primary piezoelectric charges $Qp_n$ between the $n^{th}$ pair of primary sensing electrode 12, $P_n$ and primary counter electrode 47 $Cp_n$. By contrast, differential measurements for the secondary piezoelectric charges $Qs_m$ are not possible, and the secondary piezoelectric charges $Qs_m$ are obtained using single ended measurements of the secondary sensing electrodes 13, $S_m$. The single ended measurements of secondary piezoelectric charges $Qs_m$ will still have spatial resolution for active regions 19 which include more than one secondary sensing electrode 13, $S_m$, for example the slider or button/touch pad active regions 44, 45. The signal-to-noise ratio of secondary piezoelectric charges $Qs_m$ measured using single ended measurements of the secondary sensing electrodes 13, $S_m$ may be improved by holding the common secondary sensing electrodes 53 at system ground (or another fixed voltage), at least during measurements of the secondary piezoelectric charges $Qs_m$, in order to shield the underlying secondary sensing electrodes 13, from external electrical fields.

The second counter electrode layout 52 may be used for capacitance measurements using the primary counter electrodes 47, $Cp_n$. Capacitance measurements may be self-capacitance measurements using individual primary counter electrodes 47, $Cp_n$, or capacitive measurements may be mutual-capacitance measurements using pairs of primary counter electrodes 47, $Cp_n$. Capacitance measurements may be used to provide more precise localisation during optimal input conditions, for example in dry conditions when a user presses using a digit (without any gloves) and/or uses a conductive stylus.

Third Counter Electrode Layout

Figure 17:
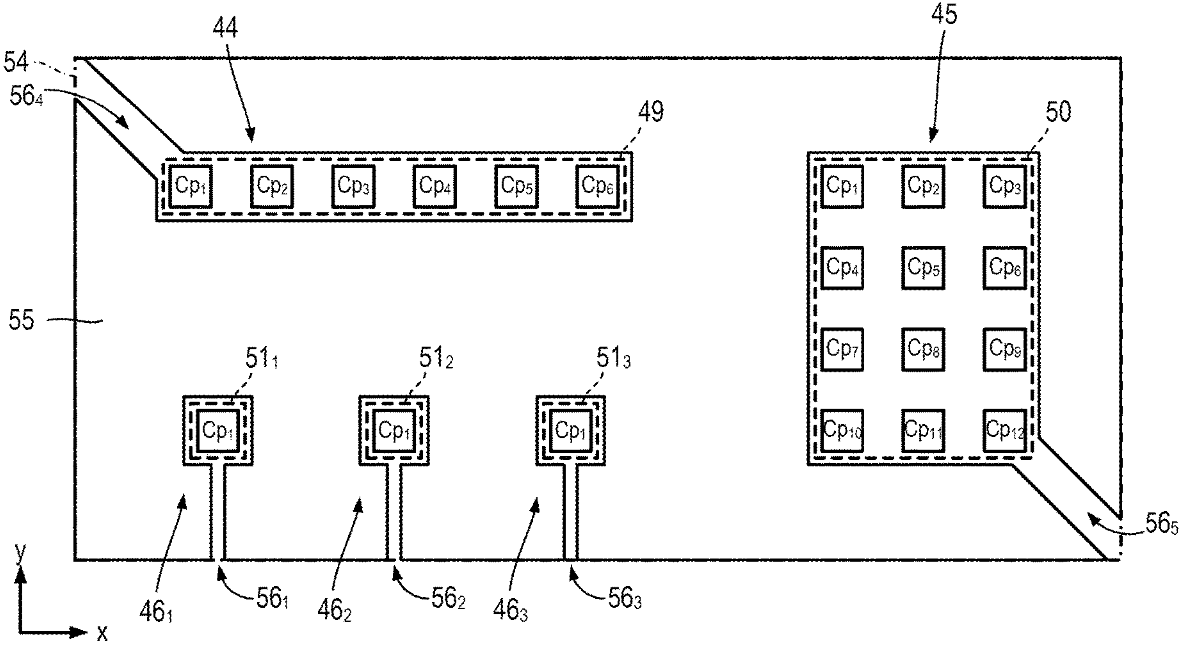
FIG. 17 schematically illustrates a third example of a counter electrode layout.

Referring also to FIG. 17, a third example of a counter electrode layout 54 for a user input panel (hereinafter "third counter electrode layout") is shown.

The third counter electrode layout 54 is the same as the second counter electrode layout 52, except that instead of having a common secondary electrode 53 corresponding to each active region 19, 44, 45, 46$_1$, 46$_2$, 46$_3$ and overlapping the secondary sensing electrodes 13, $S_m$ of that active region 19, 44, 45, 46$_1$, 46$_2$, 46$_3$, the third counter electrode layout 54 includes a single, global common secondary electrode 55 which overlaps all of the secondary sensing electrodes 13, $S_m$. For example, the single common secondary electrode 55 may cover all of the second face 6 of a layer structure 2, with the exception of the perimeters 14, 49, 50 51$_1$, 51$_2$, 51$_3$ of each active region and corresponding conduits 56$_1$, 56$_2$, 56$_3$, 56$_4$, 56$_5$ for routing conductive traces (not shown) to electrically connect to the primary counter electrodes 47, $Cs_n$.

In use, a piezoelectric sensor 16 using the third counter electrode layout 54 is arranged such that the primary counter electrodes 47, $Cp_n$ are closest to a user providing input. In this way, the third counter electrode layout 54 allows for differential measurements of the primary piezoelectric charges $Qp_n$ and single-ended measurements of the secondary piezoelectric charges $Qs_m$ in the same way as the second counter electrode layout 52. The more extensive (or blanket) coverage of the single common secondary electrode 55 may provide more effective shielding of external electrical fields, compared to the multiple common secondary electrodes 53 of the second counter electrode layout 52.

The third counter electrode layout 54 may be used for capacitance measurements using the primary counter electrodes 47, $Cp_n$. Capacitance measurements may be self-capacitance measurements using individual primary counter electrodes 47, $Cp_n$, or capacitive measurements may be mutual-capacitance measurements using pairs of primary counter electrodes 47, $Cp_n$. Capacitance measurements may be used to provide more precise localisation during optimal input conditions, for example in dry conditions when a user presses using a digit (without any gloves) and/or uses a conductive stylus.

Fourth Counter Electrode Layout

Figure 18:
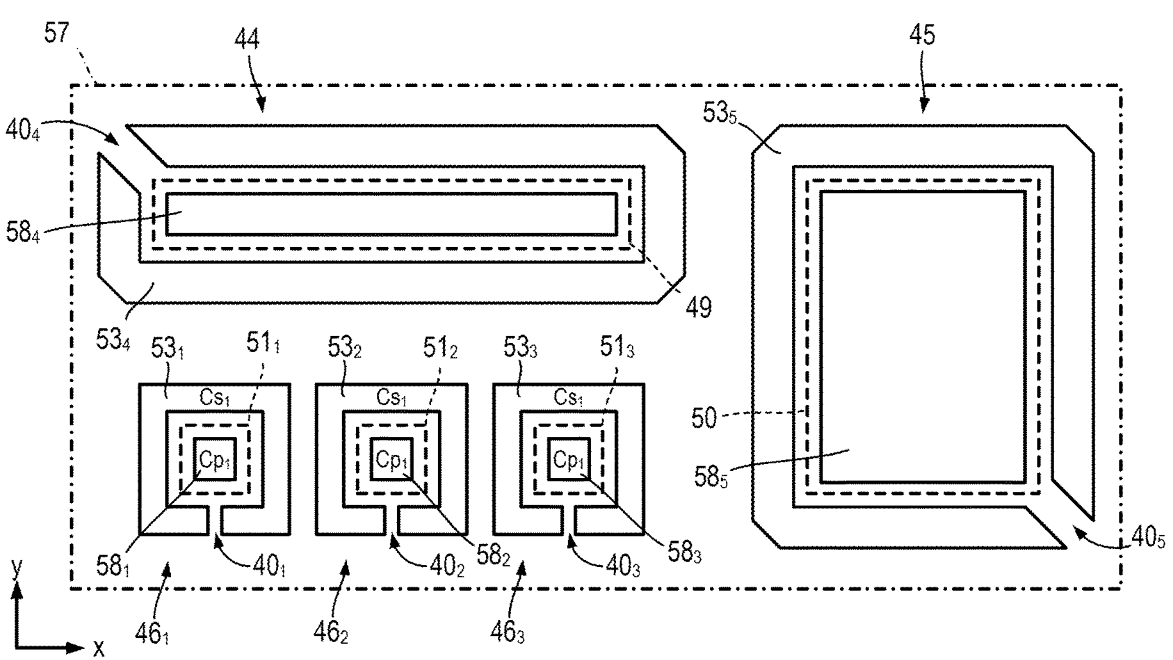
FIG. 18 schematically illustrates a fourth example of a counter electrode layout.

Referring also to FIG. 18, a fourth example of a counter electrode layout 57 for a user input panel (hereinafter "fourth counter electrode layout") is shown.

The fourth counter electrode layout 57 is the same as the second counter electrode layout 52, except that instead of having a separate primary counter electrode 47, $Cp_n$ corresponding to each primary sensing electrode 12, $P_n$, each active region 19, 44, 45, 46$_1$, 46$_2$, 46$_3$ includes a common primary counter electrode 58. Within each active region 19, 44, 45, 46$_1$, 46$_2$, 46$_3$ the respective common primary counter electrode 58 opposes all of the primary sensing electrodes 12, $P_n$ belonging to that active region 19, 44, 45, 46$_1$, 46$_2$, 46$_3$ across the layer of piezoelectric material 7.

Each of the three discrete button active regions 46$_1$, 46$_2$, 46$_3$ only includes a single primary counter electrode 47, $Cp_1$ in the second counter electrode layout 52, and these are consequently the same for the fourth counter electrode layout 57 and provide the corresponding common primary counter electrodes 58$_1$, 58$_2$, 58$_3$.

The slider active region 44 of the fourth counter electrode layout 57 includes an elongated rectangular common primary counter electrode 58$_4$ which partially or completely overlaps each of the primary sensing electrodes 12, $P_1$, $P_2$, $P_3$, $P_4$, $P_5$, $P_6$ of the linear array across the piezoelectric layer 7. The common primary counter electrode 58$_4$ and the common secondary counter electrode 53 are electrically connected to respective conductive traces (not shown). The common secondary counter electrode 53$_4$ completely encloses the rectangular perimeter 49 of the slider active region 44, with the exception of a gap 40$_4$ to permit routing of a conductive trace (not shown) electrically connecting to the common primary counter electrode 58$_4$.

The button/touch pad active region 45 of the fourth counter electrode layout 57 includes a rectangular common primary counter electrode 58$_4$ which partially or completely overlaps each of the primary sensing electrodes 12, $P_1$, . . . , $P_{12}$ across the piezoelectric layer 7. The common secondary counter electrode 53$_5$ completely encloses the rectangular perimeter 50 of the button/touch pad active region 4$_4$, with the exception of a gap 40$_5$ to permit routing of a conductive trace (not shown) electrically connecting to the common primary counter electrode 58$_5$.

In use, a piezoelectric sensor 16 using the second counter electrode layout 52 is arranged such that the common primary counter electrodes 58$_1$, . . . , 58$_5$ are closest to a user providing input. In this way, the fourth counter electrode layout 52 allows for single ended measurements of the primary piezoelectric charges $Qp_1$, using individual primary sensing electrodes 12, $P_n$ and for single ended measurements of the secondary piezoelectric charges $Qs_m$ using individual secondary sensing electrodes 13, $S_m$. The common primary counter electrodes 58 and the common secondary counter electrodes 53 may be held at system ground, or another fixed voltage, at least during readout of piezoelectric charges $Qp_n$, $Qs_m$, in order to provide shielding of the primary and secondary sensing electrodes 12, $P_n$, 13, $S_m$, from external electrical fields The fourth counter electrode layout 52 may be used for capacitance measurements using the common primary counter electrodes 58, though these would be limited to self-capacitance measurements. Although lacking spatial resolution within each perimeter 14, 49, 50, 51$_1$, 51$_2$, 51$_3$, such self-capacitance measurements performed using a common primary counter electrode 58 may still permit localisation of which active regions 19, 44, 45, 46$_1$, 46$_2$, 46$_3$ are being interacted with during optimal input conditions, for example in dry conditions when a user presses using a digit (without any gloves) and/or uses a conductive stylus.

Fifth Counter Electrode Layout

Figure 19:
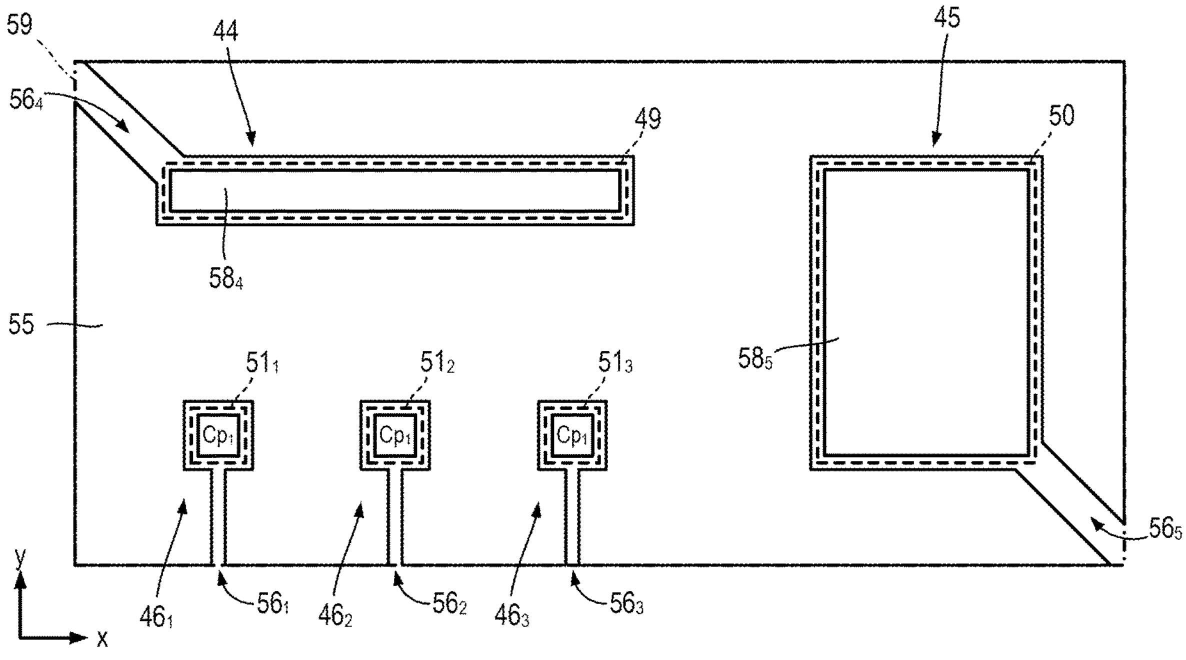
FIG. 19 schematically illustrates a fifth example of a counter electrode layout.

Referring also to FIG. 19, a fifth example of a counter electrode layout 59 for a user input panel (hereinafter "fifth counter electrode layout") is shown.

The fifth counter electrode layout 59 combines the single, global common secondary counter electrode 55 of the third electrode layout 54 with the common primary counter electrodes 58$_1$, 58$_2$, 58$_3$, 58$_4$, 58$_5$ of the fourth counter electrode layout 57. The primary and secondary sensing electrodes 12, $P_n$, 13, $S_m$ have the same layout as any of the first to fourth counter electrode layouts 43, 52, 54, 57.

Sixth Counter Electrode Layout

Figure 20:
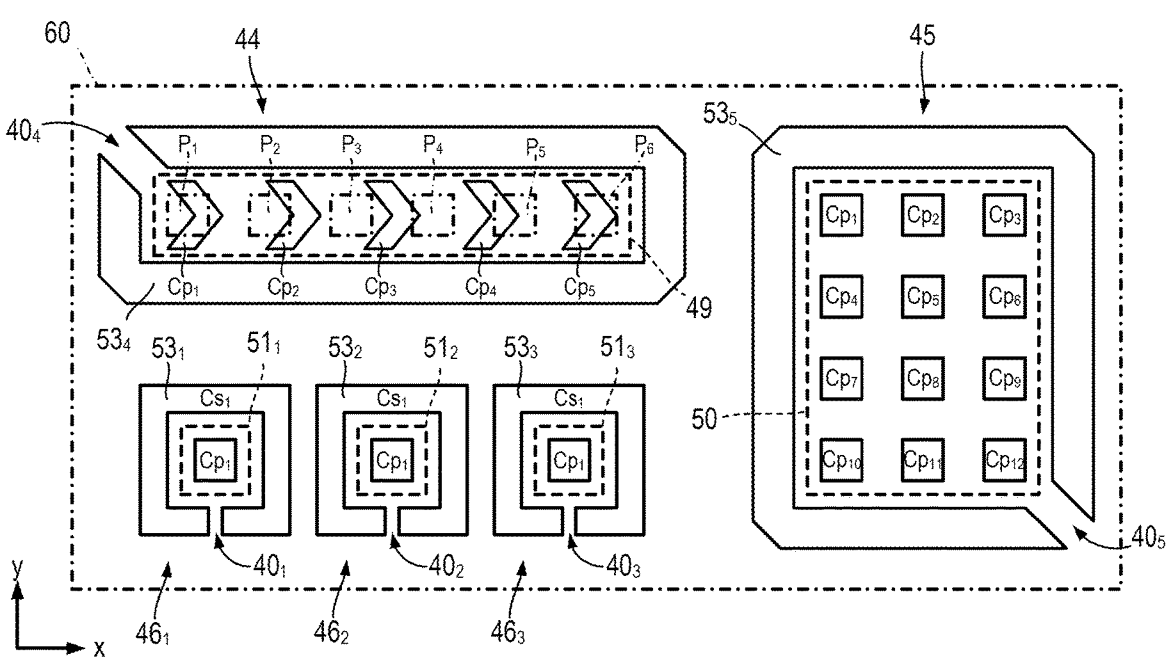
FIG. 20 schematically illustrates a sixth example of a counter electrode layout.

Referring also to FIG. 20, a sixth example of a counter electrode layout 60 for a user input panel (hereinafter "sixth counter electrode layout") is shown.

The sixth counter electrode layout 60 is for use with primary and secondary sensing electrodes 12, $P_n$, 13, $S_m$ having the same layout as any of the first to fifth counter electrode layouts 43, 52, 54, 57, 59. The sixth counter electrode layout 60 uses the same layout of common secondary counter electrodes $53_1$, $53_2$, $53_3$, $53_4$, $53_5$ as the second counter electrode layout 52 or the fourth counter electrode layout 57.

The sixth counter electrode layout 60 differs from the first to fifth counter electrode layouts 43, 52, 54, 57, 59 in that the number NC of primary counter electrodes 47, $Cp_n$ for each active region 19, 44, 45, $46_1$, $46_2$, $46_3$ need not be equal to the number N of primary sensing electrode 12, $P_n$ (i.e. NC=N) or one common primary counter electrode 58 (i.e. NC=1). In the sixth counter electrode layout 60, the number NC of primary counter electrodes 47, $Cp_n$ for each active region 19, 44, 45, $46_1$, $46_2$, $46_3$ may take any value between one and the number N of primary sensing electrodes 12, $P_n$ belonging to that active region 19, 44, 45, $46_1$, $46_2$, $46_3$ (between here includes the endpoints so that $1 \leq NC \leq N$) In other words, the primary sensing electrodes 12, $P_1, \ldots, P_N$ of an active region 19, 44, 45, $46_1$, $46_2$, $46_3$ of a piezoelectric sensor 16 are opposed across the layer of piezoelectric material 7 by a number NC of primary counter electrodes 47, $Cp_1, \ldots, Cp_{NC}$ which may be less than the number N of primary sensing electrodes 12, $P_1, \ldots, P_N$ belonging to that active region 19, 44, 45, $46_1$, $46_2$, $46_3$. Additionally and/or alternatively, the primary counter electrodes 47, $Cp_n$ of one or more active regions 19, 44, 45, $46_1$, $46_2$, $46_3$ need not have the same shapes, areas and/or orientations as the corresponding primary sensing electrodes 12, $P_n$.

The three discrete button active regions $46_1$, $46_2$, $46_3$ and the button/touch pad active region 45 have the same configurations of primary counter electrode 47, $Cp_n$ as the second counter electrode layout 52.

The slider active region 44 includes N=6 primary sensing electrodes 12, $P_1, \ldots, P_6$ arranged in a linear array, each of which takes the form of a square electrode. The slider active region 44 includes NC=5 primary counter electrodes 12, $Cp_1, \ldots, Cp_5$ arranged in a linear array spanning the same length as the linear array of primary sensing electrodes 12, $P_1, \ldots, P_6$. A consequence of the smaller number NC<N of primary counter electrodes 12, $Cp_1, \ldots, Cp_5$ is that these are spaced more widely than the primary sensing electrodes 12, $P_1, \ldots, P_6$. Additionally the primary counter electrodes 12, $Cp_1, \ldots, Cp_5$ are each chevron shaped instead of square.

In use, a piezoelectric sensor 16 using the sixth counter electrode layout 60 is arranged such that the primary counter electrodes 47, $Cp_n$ are closest to a user providing input. The three discrete button active regions $46_1$, $46_2$, $46_3$ and the button/touch pad active region 45 may be used for measurements of piezoelectric charges $Qp_n$, $Qs_m$ as described hereinbefore for the second counter electrode layout 52. For the slider active region 44, measurements of secondary piezoelectric charges $Qs_m$ may be carried out as described in relation to the second counter electrode layout 52. Measurements of the primary piezoelectric charges $Qp_n$ may be carried out using single ended measurements from the primary sensing electrodes 12, $P_1, \ldots, P_6$, preferably with all of the primary counter electrodes 47, $Cp_1, \ldots, Cp_5$ connected to system ground (or other fixed voltage) to at least partially shield the primary sensing electrodes 12, $P_1, \ldots, P_6$ from external electrical fields. During other periods, for example sequentially interspersed with periods for measuring primary piezoelectric charges $Qp_n$, the primary counter electrodes 47, $Cp_1, \ldots, Cp_5$ may be used for self-capacitance measurements. The capability to perform capacitive measurements of localisation when input conditions permit this has been described hereinbefore. A potential advantage of the sixth counter electrode layout 60 is that the electrode pitch (and associated spatial resolution) for measurements of piezoelectric charges $Qp_n$ using primary sensing electrodes 12, $P_1, \ldots, P_6$ may be different (finer or coarser) than an electrode pitch (and associated spatial resolution) for measurements of capacitance using the primary counter electrodes 47, $Cp_1, \ldots, Cp_5$.

Although the example of the slider active region 44 of the sixth counter electrode layout 60 shows a number NC of primary counter electrodes 47, $Cp_n$ being less than a number N of primary sensing electrodes 12, $P_n$ (NC<N), in general the sixth counter electrode layout 60 may include a mixture of some active regions 19 in which NC=N, other active regions in which NC<N, and still further active regions 19 in which NC>N. Regardless of whether NC<N, NC=N or NC>N, each primary counter electrode 47, $Cp_n$ should preferably partially or completely overlap with one or more of the primary sensing electrodes $P_n$ corresponding to the same active region 19.

Seventh Counter Electrode Layout

Figure 21:
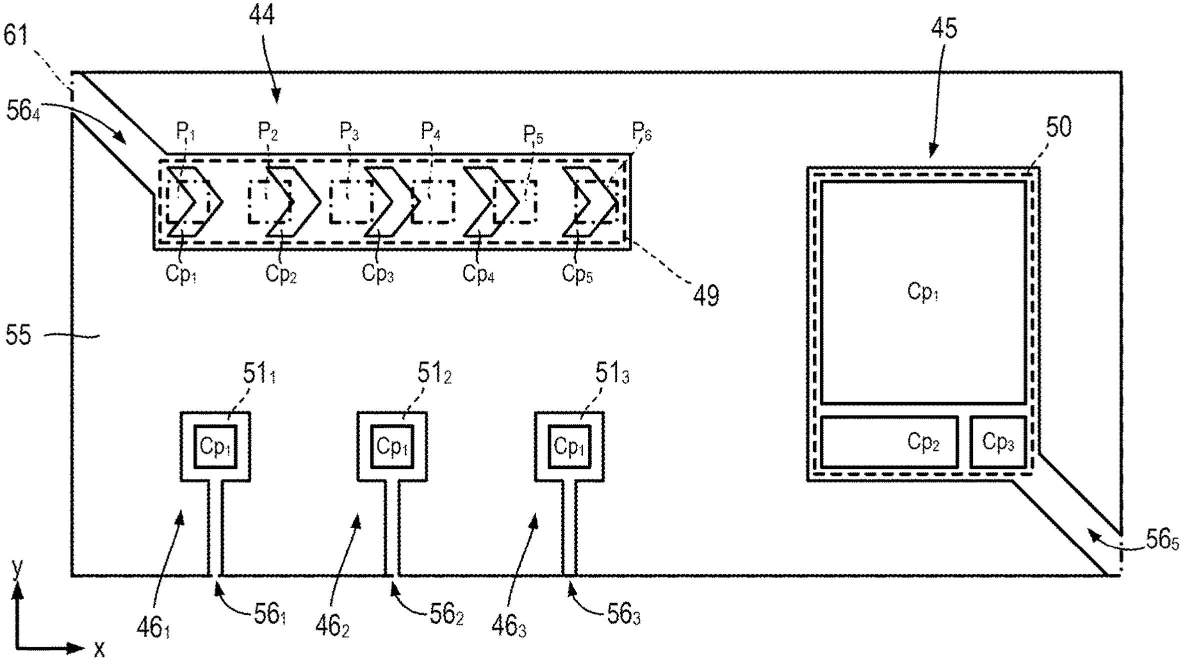
FIG. 21 schematically illustrates a seventh example of a counter electrode layout.

Referring also to FIG. 21, a seventh example of a counter electrode layout 61 for a user input panel (hereinafter "seventh counter electrode layout") is shown.

The seventh counter electrode layout 61 is for use with primary and secondary sensing electrodes 12, $P_n$, 13, $S_m$ having the same layout as any of the first to sixth counter electrode layouts 43, 52, 54, 57, 59, 60. The seventh counter electrode layout 61 uses the same, global common secondary counter electrode 55 as the third counter electrode layout 54 or the fifth counter electrode layout 59. The seventh counter electrode layout 61 uses the same layout of primary counter electrodes 47, $P_n$ as the sixth counter electrode layout 60, except for the button/touch pad action region 45.

In the sixth counter electrode layout 60 (and also the first to third counter electrode layouts), the button/touch pad active region 45 includes an array of twelve primary counter electrodes 47, $CP_1, \ldots, Cp_{12}$ which are coincident and co-extensive with the primary sensing electrodes 12, $P_1, \ldots, P_{12}$ across the piezoelectric layer 7. By contrast, in the seventh counter electrode layout 61, the button/touch pad active region 45 includes three (NC=3) primary counter electrodes 47, $Cp_1$, $Cp_2$, $Cp_3$. A first primary counter electrode 47, $Cp_1$ substantially overlaps all of the primary sensing electrodes 12, $P_1, \ldots, P_9$ forming the top (relative to FIG. 21) three rows of the array. A second primary counter electrode 47, $Cp_2$ substantially overlaps both the primary sensing electrodes 12, $P_{10}$, $P_{11}$ on the bottom (Relative to FIG. 21) row of the array. A third primary counter electrode 12, $Cp_3$ is coincident and coextensive with the final primary sensing electrode 12, $P_{12}$.

In some examples, each different primary counter electrode 47, $Cp_m$ may correspond to a sub-region of an active region 19. For example, in FIG. 21, the first primary counter electrode 47, $Cp_1$ corresponding to the primary sensing electrodes 12, $P_1, \ldots, P_9$ may correspond to a numeric keypad with the numbers one through 9 for inputting part of a code, the second primary counter electrode 47, $Cp_2$ corresponding to the primary sensing electrodes 12, $P_{10}$, $P_{11}$ may correspond to buttons denoting letters "A" and "B" for forming part of a code, and the third primary counter electrode 47, $Cp_3$ corresponding to the final primary sensing electrode 12, $P_{12}$ may correspond to a button for indicating that input of a code to the button/touch pad active region 45 is completed ("enter" key).

Although the first through seventh counter electrode layouts 43, 52, 54, 57, 59, 60, 61 have been described and illustrated in relation to specific examples, these examples are only intended to illustrate the underlying principles. Other examples designed according to the principles outlined hereinbefore may include combinations of active regions 19 providing alternative or further user input controls, and each active region may include more or fewer sensing electrodes 12, 13 and/or counter electrodes 47, 48, 53, 55, 58 than the first through seventh counter electrode layouts 43, 52, 54, 57, 59, 60, 61. Sensing electrodes 12, 13 and/or counter electrodes 47, 48, 53, 55, 58 are not limited to the shapes, relative sizes, relative positions, or other specific geometric details of the first through seventh counter electrode layouts 43, 52, 54, 57, 59, 60, 61.

Examples of User Input Controls

A large variety of different shapes and configurations of user input controls may be defined using a combination of one or more primary sensing electrodes 12, $P_n$ disposed within a perimeter 14 and one or more secondary sensing electrodes 13, $S_m$ arranged about the perimeter 14.

Button Controls

For example, referring also to FIG. 22, an active region 19 providing a first button control 62 is shown.

The first button control 62 includes one primary sensing electrode 12, $P_1$ in the form of a square with rounded corners. The first button control 62 uses the fourth configuration of active region 37, and includes one secondary sensing electrode 13, $S_1$ extending entirely around the primary sensing electrode 12, P. The secondary sensing electrode 13, $S_1$ has a shape conforming to the primary sensing electrode 12, $P_1$, namely a square with rounded corners, with an internal space enclosing the primary sensing electrode 12, $P_1$ also having the shape of a square with rounded corners. A perimeter 14 separating the primary sensing electrode 12, $P_1$ from the secondary sensing electrode 13, $S_1$ takes the form of the locus of points equidistant between the primary and secondary sensing electrodes 12, $P_1$, 13, $S_1$.

The first button control 62 may be used to provide a discrete, pressure sensing button. When no capacitance measurements are obtained (or when capacitance measurements are rendered inoperable by environmental conditions such as a wet input surface), an input to the first button 62 may be localised by comparing the primary piezoelectric charge $Qp_1$ (or adjusted charge $Ap_1$) measured from the primary sensing electrode 12, $P_1$ with the secondary piezoelectric charge $Qs_1$ (or adjusted charge $As_1$) measured from the secondary sensing electrode 13, $S_1$, for example using one or more of the methods described hereinbefore.

Referring also to FIG. 23, an active region 19 providing a second button control 63 is shown.

The second button control 63 is similar to the first button control 62, except that the primary sensing electrode 12, $P_1$ takes the form of a square, and that the second button 63 uses a secondary sensing electrode 13, $S_1$ configured according to the fifth active region 39. The perimeter 14 separating the primary sensing electrode 12, $P_1$ and the secondary sensing electrode 13, $S_1$ is also square.

Referring also to FIG. 24, an active region 19 providing a third button control 64 is shown.

The third button control 64 is the same as the second button control 63, except that each of the primary sensing electrode 12, $P_1$, the secondary sensing electrode 13, $S_1$ and the perimeter 14 are substantially circular (and substantially concentric).

Referring also to FIG. 25, an active region 19 providing a fourth button control 65 is shown.

The fourth button control 65 is the same as the third button control 64, except that instead of a single secondary sensing electrode 13, $S_1$ extending around the entire perimeter 14 (excepting a gap 40), the fourth button 65 includes four secondary sensing electrodes 13, $S_1$, $S_2$, $S_3$, $S_4$, each extending around substantially a quarter of the circular perimeter 14. The secondary sensing electrodes 13, $S_1$, $S_2$, $S_3$, $S_4$ of the fourth button 65 are configured as described in relation to the first to third active regions 28, 32, 33.

User input controls provided by an active region 19 are not limited to single buttons, and in other examples, two or more primary sensing electrodes 12, $P_n$ may be disposed within the perimeter 14 of an active region 19, each primary sensing electrodes 12, $P_n$ providing a corresponding discrete button.

Slider Controls

Figure 26:
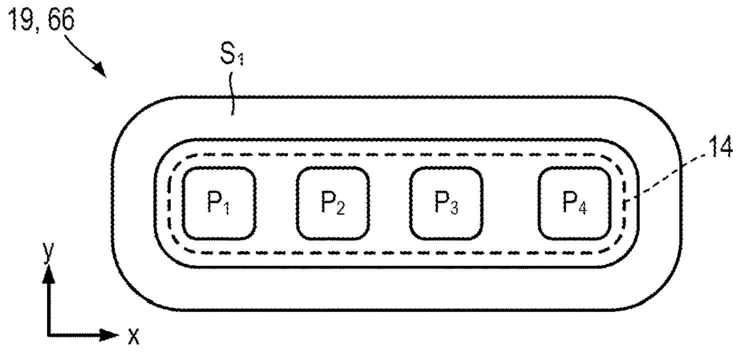
FIG. 26 schematically illustrates a first slider control.

Referring also to FIG. 26, an active region 19 providing a first slider control 66 is shown.

The first slider control 66 includes four primary sensing electrodes 12, $P_1$, $P_2$, $P_3$, $P_4$ each in the form of a square with rounded corners. The primary sensing electrodes 12, $P_1$, $P_2$, $P_3$, $P_4$ are arranged evenly spaced along a straight line. A perimeter 14 having the shape of a rectangle with rounded corners encloses the primary sensing electrodes 12, $P_1$, $P_2$, $P_3$, $P_4$, and is in turn enclosed by a single secondary sensing electrode 13, $S_1$ configured as described in relation to the fourth active region 37. The perimeter 14 is substantially coincident with the locus of points equidistant between the four primary sensing electrodes 12, $P_1$, $P_2$, $P_3$, $P_4$ and the secondary sensing electrode 13, $S_1$.

The four primary sensing electrodes 12, $P_1$, $P_2$, $P_3$, $P_4$ may be used together to provide a slider control, for example by interpolating a pressed position on the first slider control 66 based on comparing and/or interpolating the primary piezoelectric charges $Qp_1$, $Qp_2$, $Qp_3$, $Qp_4$ (or adjusted charges $Ap_1$, $Ap_2$, $Ap_3$, $Ap_4$) measured from the respective primary sensing electrodes 12, $P_1$, $P_2$, $P_3$, $P_4$. When no capacitance measurements are obtained (or when capacitance measurements are rendered inoperable by environmental conditions such as a wet input surface), an input to the first slider control 66 may be localised by comparing the primary piezoelectric charges $Qp_1$, $Qp_2$, $Qp_3$, $Qp_4$ (or adjusted charges $Ap_1$, $Ap_2$, $Ap_3$, $Ap_4$) measured from the respective primary sensing electrodes 12, $P_1$, $P_2$, $P_3$, $P_4$ with the secondary piezoelectric charge $Qs_1$ (or adjusted charge $As_1$) measured from the secondary sensing electrode 13, $S_1$, for example using one or more of the methods described hereinbefore.

Additionally or alternatively, each of the four primary sensing electrodes 12, $P_1$, $P_2$, $P_3$, $P_4$ may be used as a discrete button. For example, the first slider control 66 may be used as an array of four discrete buttons, instead of as a slider.

Although shown in FIG. 26 with four primary sensing electrodes 12, $P_1$, $P_2$, $P_3$, $P_4$ evenly spaced along a first direction x, in general the first slider control 66 (or first button array 66 when used as discrete buttons) may include any number N>2 of primary sensing electrodes 12, $P_1, \ldots, P_N$ evenly or irregularly spaced along a line oriented in any direction. For use as a slider control, at least three primary sensing electrodes 12, $P_1$, $P_2$, $P_3$ are preferable.

Figure 27:
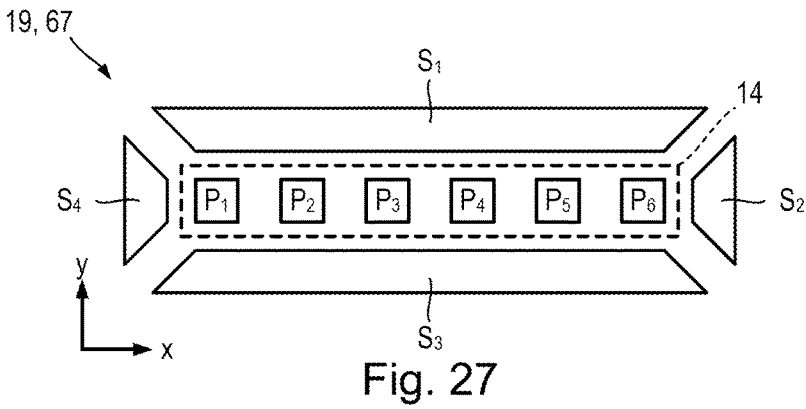
FIG. 27 schematically illustrates a second slider control.

Referring also to FIG. 27, an active region 19 providing a second slider control 67 is shown.

The second slider control 67 is the same as the first slider control 66, except that the second slider control 67 includes six primary sensing electrodes 12, $P_1, \ldots, P_6$ evenly spaced along a first direction x instead of four, and in that the second slider control 67 includes four secondary sensing electrodes 13, $S_1$, $S_2$, $S_3$, $S_4$ configured as described in relation to the first to third active regions 28, 32, 33.

In the same way as the first slider control 66, each of the primary sensing electrodes 12, $P_1, \ldots, P_6$ of the second slider control 67 may be configured to provide a discrete force sensing button, instead of functioning as an element of a slider control.

As discussed hereinafter in relation to FIGS. 35 and 38A to 38H, depending on the configuration and relative position within a piezoelectric sensor 16, the second slider control 67 including four secondary sensing electrodes 13, $S_1$, $S_2$, $S_3$, $S_4$ arranged top, bottom, left and right (relative to the directions shown in FIG. 27) may provide improved localisation compared to a single secondary sensing electrode 13, $S_1$ used for the first slider control 66.

Although shown in FIG. 27 with six primary sensing electrodes 12, $P_1$, . . . , $P_6$ evenly spaced along a first direction x, in general the second slider control 67 (or second button array 67 when used as discrete buttons) may include any number N>2 of primary sensing electrodes 12, $P_1$, . . . , $P_N$ evenly or irregularly spaced along a line oriented in any direction. For use as a slider control, at least three primary sensing electrodes 12, $P_2$, $P_2$, $P_3$ are preferable. The four secondary sensing electrodes 13, $S_1$, $S_2$, $S_3$, $S_4$ may be arranged analogously relative to the orientation of the line along which the primary sensing electrodes 12, $P_1$, . . . , $P_N$ are arranged.

Figure 28:
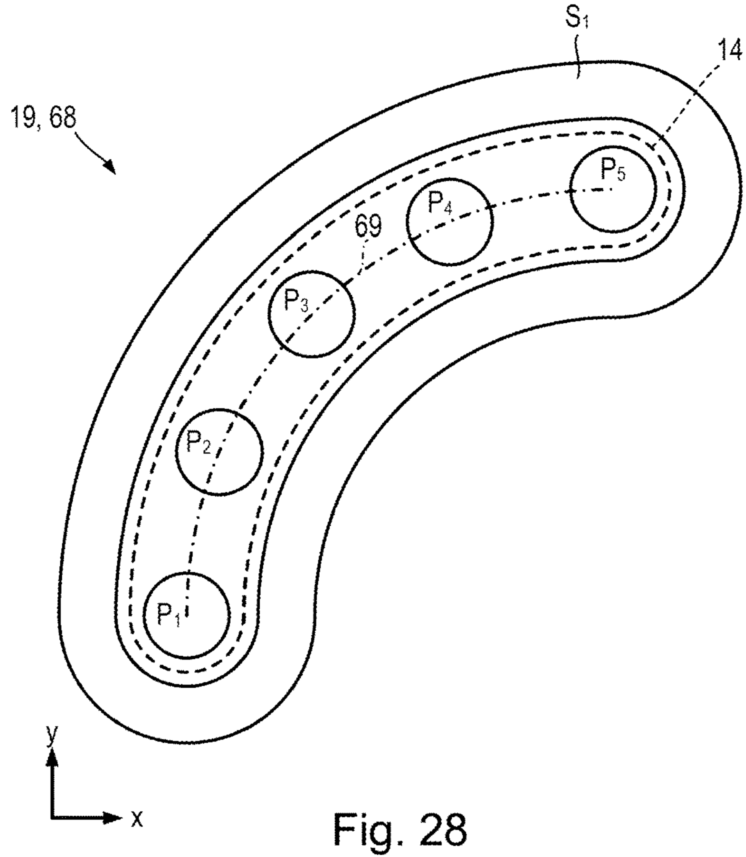
FIG. 28 schematically illustrates a third slider control.

Referring also to FIG. 28, an active region 19 providing a third slider control 69 is shown.

The third slider control 68 is the same as the first slider control 66, except that the second slider control 67 includes five primary sensing electrodes 12, $P_1$, . . . , $P_5$ evenly spaced along a arcuate path 69, instead of four spaced along a direction x. In the same way as the first slider control 66, the third slider control 68 includes a single secondary sensing electrode 13, $S_1$ enclosing the primary sensing electrodes 12, $P_1$, . . . , $P_5$ and configured as described in relation to the fourth active region 37.

In the same way as the first or second slider controls 66, 67, each of the primary sensing electrodes 12, $P_1$, . . . , $P_5$ of the third slider control 68 may be configured to provide a discrete force sensing button, instead of functioning as an element of a slider control.

Although shown in FIG. 28 with five primary sensing electrodes 12, $P_1$, . . . , $P_5$ evenly spaced along an arcuate path, in general the third slider control 68 (or third button array 68 when used as discrete buttons) may include any number N>2 of primary sensing electrodes 12, $P_1$, . . . , $P_N$ evenly or irregularly spaced along any curved and/or straight path (or a path including straight segments and curved segments). For use as a slider control, at least three primary sensing electrodes 12, $P_1$, $P_2$, $P_3$ are preferable. A single secondary sensing electrode 13, $S_1$ need not be used, and instead a number M of secondary sensing electrodes 13, $S_1$, . . . , $S_M$ may be spread about the perimeter 14. For example, four secondary sensing electrodes 13, $S_1$, $S_2$, $S_3$, $S_4$ configured as described in relation to the first to third active regions 28, 32, 33 may be used.

Button/Touch Pads

Figure 29:
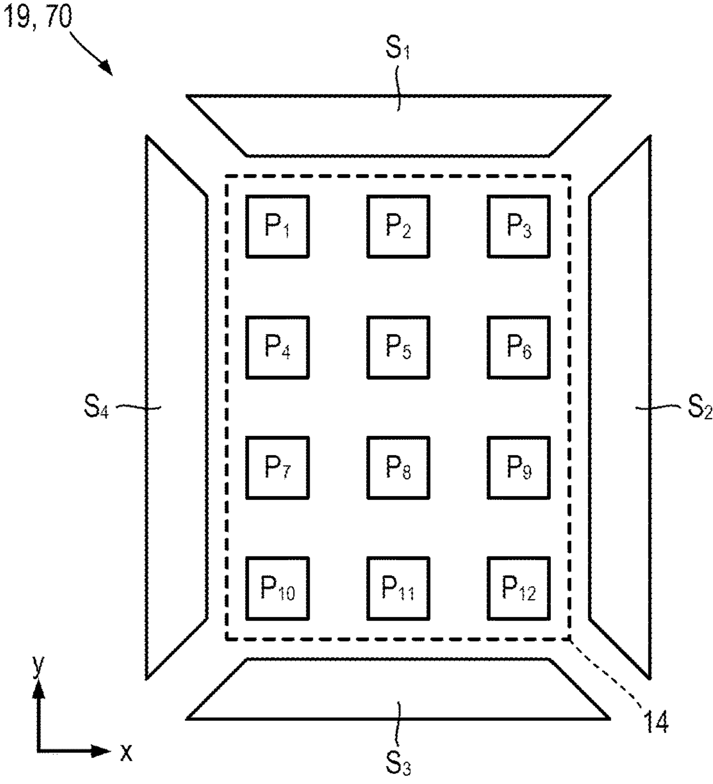
FIG. 29 schematically illustrates a first button pad control.

Referring also to FIG. 29, an active region 19 providing a first button pad control 70 is shown.

The first button pad control 70 includes a number, N, of primary sensing electrodes 12, $P_1$, . . . , $P_N$. The primary sensing electrodes 12, $P_1$, $P_N$ are arranged in an array of rows and columns to form a grid. In the example shown in FIG. 29, the first button pad 70 includes an array of twelve primary sensing electrodes 12, $P_1$, . . . , $P_{12}$ arranged into four rows and three columns. The first button pad control 70 has a substantially rectangular perimeter 14 which encloses the primary sensing electrodes 12, $P_1$, . . . , $P_{12}$ and separates them from four secondary sensing electrodes 13, $S_1$, $S_2$, $S_3$, $S_4$ provided by first to fourth conductive regions as described in relation to the first active region 28.

Each of the primary sensing electrodes 12, $P_1$, . . . , $P_N$ provides a corresponding pressure sensing button, and each may correspond to a different user input. For example, the twelve primary sensing electrodes 12, $P_1$, . . . , $P_{12}$ shown in FIG. 29 may correspond to respective inputs "1", "2", "3", "4", "5", "6", "7", "8", "9", "o", "#", "*" to provide a numeric keypad. In some examples, the first button pad 70 may form part of a piezoelectric sensor 16 bonded or otherwise supported on the interior of a casing of a device 15, or an apparatus including the device 15. Each of the primary sensing electrodes 12, $P_1$, . . . , $P_N$ may be positioned to correspond to indicia printed, engraved, embossed or otherwise formed onto an exterior surface of the casing.

When no capacitance measurements are obtained (or when capacitance measurements are rendered inoperable by environmental conditions such as a wet input surface), an input to the first button pad 70 may be localised by comparing the primary piezoelectric charges $Qp_1$, . . . , $Qp_{12}$ (or adjusted charges $Ap_1$, . . . , $Ap_{12}$) measured from the respective primary sensing electrodes 12, $P_1$, . . . , $P_{12}$ with the secondary piezoelectric charges $Qs_1$ . . . , $Qs_4$ (or adjusted charges $As_1$, . . . , $As_4$) measured from the secondary sensing electrodes 13, $S_1$, $S_2$, $S_3$, $S_4$, for example using one or more of the methods described hereinbefore.

Additionally or alternatively, the primary sensing electrodes 12, $P_1$, . . . , $P_{12}$ may be used together to provide a first touch panel control, for example by interpolating a coordinate $(x_F, y_F)$ for a force F having a centroid applied within the perimeter 14 based on comparing and/or interpolating the primary piezoelectric charges $Qp_1$, . . . , $Qp_{12}$ (or adjusted charges $Ap_1$, . . . , $Ap_{12}$) measured from the respective primary sensing electrodes 12, $P_1$, . . . , $P_{12}$. For example, when an input is localised to within the perimeter 14 (either using capacitive sensing or by comparison of primary $Qp_n$ and secondary $Qs_m$ charges), the primary sensing electrode 12, $P_n$ corresponding to the peak primary piezoelectric charge $Qp_n$ may be identified. The neighbouring primary sensing electrodes 12, $P_n$ along the row and the column containing the peak primary piezoelectric charge $Qp_n$ are identified, and a coordinate $(x_F, y_F)$ interpolated based on the corresponding primary piezoelectric charges $Qp_n$.

The N primary sensing electrodes 12, $P_n$ of the first button pad control 70 may be equally or unequally sized. When configured to provide discrete buttons, the primary sensing electrodes 12, $P_n$ need not be arranged in a regular array, and may instead be positioned arbitrarily within the perimeter 14 depending on a desired layout of discrete force sensing buttons. When configured to provide a first touch panel, the N primary sensing electrodes 12, $P_n$ of the first button pad control 70 are preferably (if not essentially) of equal sizes and arranged in a regular lattice (which need not be square or rectangular).

Although illustrated in FIG. 29 with four secondary sensing electrodes 13, $S_1$, $S_2$, $S_3$, $S_4$ provided by first to fourth conductive regions as described in relation to the first active region 28, the first button pad control 70 may alternatively use any other configuration of one or more secondary sensing electrodes 13, $S_m$ described herein, for example in relation any of the second to fifth active regions 32, 33, 37, 39. In generally, the first button pad control 70 may include more or fewer than four secondary sensing electrodes 13, $S_m$, though preferably the secondary sensing electrodes 13, $S_m$ taken together will completely or substantially enclose the perimeter 14.

Although the first button pad 70 may be used as a touch pad/panel, other arrangements of primary sensing electrodes 12, $P_n$ may provide touch pads/panels.

Figure 30:
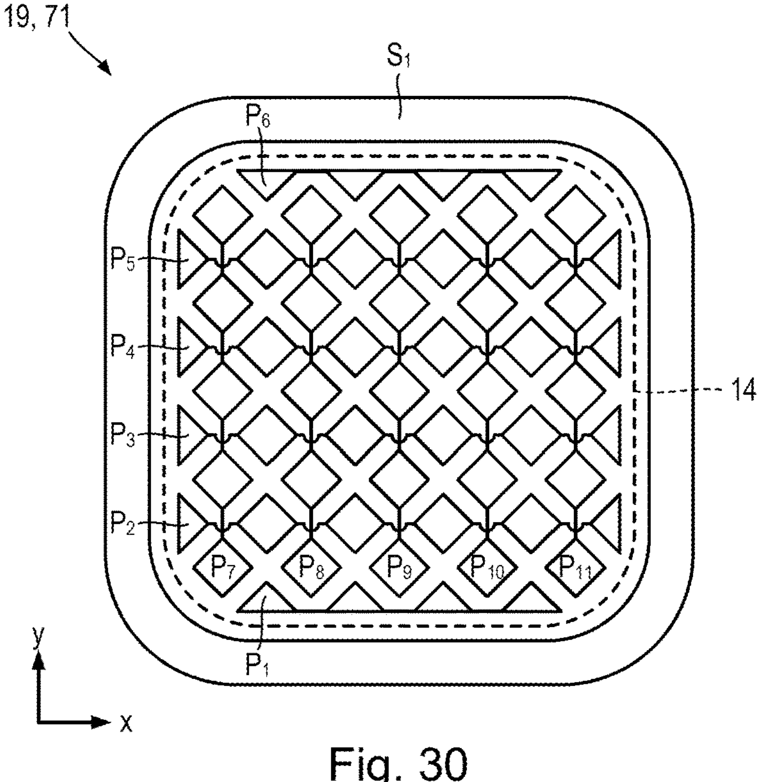
FIG. 30 schematically illustrates a first touch pad control.

Referring also to FIG. 30, an active region 19 providing a first touch panel control 71 is shown.

The first touch panel control 71 includes a number N of primary sensing electrodes 12, $P_n$, including a first number N1 of primary sensing electrodes 12, $P_1, \ldots, P_N$, extending in a first direction x and arranged spaced apart in a second, different direction y, and a second number N2 of primary sensing electrodes 12, $P_{N-N2+1}, \ldots, P_N$ extending in the second direction y and spaced apart in the first direction x (where N1+N2=N). In the example shown in FIG. 30, the first touch panel 71 includes a first number N1=6 of primary sensing electrodes 12, $P_1, \ldots, P_6$ extending in the first direction x and a second number N2=5 of primary sensing electrodes 12, $P_7, \ldots, P_{11}$ extending in the second direction y. The first touch panel 71 also includes a single secondary sensing electrode 13, $S_1$ configured as described in relation to the fourth active region 37.

Each of the five primary sensing electrodes 12, $P_7, \ldots, P_{11}$ extending in the second direction y is formed of a continuous (or unitary) region of conductive material including diamond shaped regions evenly spaced along the second direction y and connected by narrow bridging segments. Each of the six primary sensing electrodes 12, $P_1, \ldots, P_6$ extending in the first direction x is formed from a number of diamond shaped regions (or portions thereof) evenly spaced along the first direction x and connected together by jumpers (or equivalent structures) which are insulated from the primary sensing electrodes 12, $P_7, \ldots, P_{11}$ at intersections. In this way, the primary sensing electrodes 12, $P_1, \ldots, P_{11}$ may adopt a diamond-patterned configuration extensively used in conventional projected capacitance touch panels.

When no capacitance measurements are obtained (or when capacitance measurements are rendered inoperable by environmental conditions such as a wet input surface), an input to the first touch pad/panel 71 may be localised by comparing the primary piezoelectric charges $Qp_1, \ldots, Qp_1$, (or adjusted charges $Ap_1$, $Ap_{11}$) measured from the respective primary sensing electrodes 12, $P_1, \ldots, P_{11}$ with the secondary piezoelectric charge $Qs_1$ (or adjusted charge $As_1$) measured from the secondary sensing electrode 13, $S_1$, for example using one or more of the methods described hereinbefore.

When the coordinate $(x_F, y_F)$ of the centroid of an applied force F is localised to within the perimeter 14, a more precise estimate of the coordinate $(x_F, y_F)$ may be obtained using the primary sensing electrodes 12, $P_1, \ldots, P_{11}$. Piezoelectric charges $Qp_1, \ldots, Qp_6$ (or adjusted charges $Ap_1, \ldots, Ap_6$) from the six primary sensing electrodes 12, $P_1, \ldots, P_6$ spaced apart along the second direction y may be interpolated to estimate the coordinate $y_F$ along the second direction y, whilst piezoelectric charges $Qp_7, \ldots, Qp_{11}$ (or adjusted charges $Ap_1, \ldots, Ap_6$) from the five primary sensing electrodes 12, $P_7, \ldots, P_{11}$ spaced apart along the first direction x may be interpolated to estimate the coordinate $x_F$ along the first direction x.

When the capacitive touch controller 25 is present (and enabled), the capacitive touch controller 25 may be used to determine a touched location from measurements of mutual capacitances at the intersections of the primary sensing electrodes 12, $P_1, \ldots, P_6$ and the primary sensing electrodes 12, $P_7, \ldots, P_{11}$.

Although the first and second directions x, y are shown as perpendicular in FIG. 30, this is not necessary. The piezoelectric sensor 16, or at least the portion of it corresponding to a first touch panel control 71, may be transparent if it is overlying a display. However, the piezoelectric sensor 16 and a portion of it corresponding to a first touch panel control 71 may also be opaque.

Dial Controls

Referring also to FIG. 31, an active region 19 providing a first dial control 72 is shown.

The first dial control 72 includes four primary sensing electrodes 12, $P_1$, $P_2$, $P_3$, $P_4$ each in the form of one quadrant of a circle. In other words, the four primary sensing electrodes 12, $P_1$, $P_2$, $P_3$, $P_4$ are arranged evenly spaced along a circular path. A circular perimeter 14 encloses the primary sensing electrodes 12, $P_1$, $P_2$, $P_3$, $P_4$, and is in turn enclosed by a single secondary sensing electrode 13, $S_1$ configured as described in relation to the fourth active region 37. The perimeter 14 is substantially coincident with the locus of points equidistant between the four primary sensing electrodes 12, $P_1$, $P_2$, $P_3$, $P_4$ and the secondary sensing electrode 13, $S_1$.

The four primary sensing electrodes 12, $P_1$, $P_2$, $P_3$, $P_4$ may be used together to provide a dial control, for example by interpolating a pressed position on the first dial control 72 based on comparing and/or interpolating the primary piezoelectric charges $Qp_1$, $Qp_2$, $Qp_3$, $Qp_4$ (or adjusted charges $Ap_1$, $Ap_2$, $Ap_3$, $Ap_4$) measured from the respective primary sensing electrodes 12, $P_1$, $P_2$, $P_3$, $P_4$. In this way, an angle at which the first dial control 72 is being pressed relative to a centre of the circular path may be measured. A dial control such as the first dial control 72 is functionally similar to a slider control such as the first to third slider controls 66, 67, 68, except that a location is measured along a closed path (circular in FIG. 31) as opposed to a straight or curving open path.

When no capacitance measurements are obtained (or when capacitance measurements are rendered inoperable by environmental conditions such as a wet input surface), an input to the first dial control 72 may be localised by comparing the primary piezoelectric charges $Qp_1$, $Qp_2$, $Qp_3$, $Qp_4$ (or adjusted charges $Ap_1$, $Ap_2$, $Ap_3$, $Ap_4$) measured from the respective primary sensing electrodes 12, $P_1$, $P_2$, $P_3$, $P_4$ with the secondary piezoelectric charge $Qs_1$ (or adjusted charge $As_1$) measured from the secondary sensing electrode 13, $S_1$, for example using one or more of the methods described hereinbefore.

Additionally or alternatively, each of the four primary sensing electrodes 12, $P_1$, $P_2$, $P_3$, $P_4$ may be used as a discrete button. For example, the first dial control 72 may be used as an array of four discrete buttons, instead of as a dial.

Although shown in FIG. 31 with four primary sensing electrodes 12, $P_1$, $P_2$, $P_3$, $P_4$ evenly spaced about a circular path, in general the first dial control 72 may include any number N>2 of primary sensing electrodes 12, $P_1, \ldots, P_N$ evenly or irregularly spaced along a closed path. For use as a dial control, at least three primary sensing electrodes 12, $P_1$, $P_2$, $P_3$ are preferable, spaced along a circular or elliptical path.

Referring also to FIG. 32, an active region 19 providing a second dial control 73 is shown.

The second dial control 73 is the same as the first dial control 72, except that it includes eight primary sensing electrodes 12, $P_1, \ldots, P_8$ evenly spaced about a circular path, and in that the single secondary sensing electrode 13, $S_1$ is configured with a gap 40 according to the fifth active region 39.

Swine Gesture Controls

Referring also to FIG. 33, an active region 19 providing a first swipe gesture control 74 is shown.

The first swipe gesture control 74 includes first and second primary sensing electrodes 12, $P_1$, $P_2$ arranged such that along a swipe direction 75, a width of the first primary sensing electrode 12, $P_1$ perpendicular to the swipe direction 75 decreases and a width of the second primary sensing electrode 12, $P_2$ perpendicular to the swipe direction 75 increases. In the example shown in FIG. 33, the swipe direction 75 corresponds to the y direction, and the first primary sensing electrode 12, $P_1$ takes the form of first triangular protrusions 76 tapering along the positive y direction. Similarly, the second primary sensing electrode 12, $P_2$ takes the form of second triangular protrusions 77 tapering along the negative y direction and interdigitated with the first triangular protrusions 76. A rectangular perimeter 14 encloses the first and second primary sensing electrodes 12, $P_1$, $P_2$, and is in turn surrounded by four secondary sensing electrodes 13, $S_1$, $S_2$, $S_3$, $S_4$ configured as described in relation to the first to third active regions 28, 32, 33.

An applied force F moving along the swipe direction 75 in the positive y direction from the bottom (relative to FIG. 33) of the first swipe gesture control 74 will initially induce a larger first piezoelectric charge $Qp_1$ (or adjusted charge $Ap_1$) than a second piezoelectric charge $Qp_2$ (or adjusted charge AA) because the first primary sensing electrode $P_1$ has a relatively larger area to collect charges at that end of the first swipe gesture control 74. As the force F is moved upwards (relative to FIG. 44) along the swipe direction 75, the relative area of the second primary piezoelectric electrode $P_2$ and the relative size of the second piezoelectric charge $Qp_2$ (or adjusted charge $Ap_1$) increase, and eventually exceed the first piezoelectric charge $Qp_1$. By comparing the first and second primary piezoelectric charges $Qp_1$, $Qp_2$ (or adjusted charges $Ap_1$, $Ap_2$), a user swiping along the swipe direction can be detected. In some implementations, it may be possible to estimate the relative position along the swipe direction 75, for example based on a ratio $Qp_1/Qp_2$ of the first and second primary piezoelectric charges $Qp_1$, $Qp_2$ (or adjusted charges $Ap_1$, $Ap_2$).

When no capacitance measurements are obtained (or when capacitance measurements are rendered inoperable by environmental conditions such as a wet input surface), an input to the first swipe control 74 may be localised by comparing the primary piezoelectric charges $Qp_1$, $Qp_2$ (or adjusted charges $Ap_1$, $Ap_2$) measured from the first and second primary sensing electrodes 12, $P_1$, $P_2$ with the secondary piezoelectric charges $Qs_1$, $Qs_2$, $Qs_3$, $Qs_4$ (or adjusted charges $As_1$, $As_2$, $As_3$, $As_4$) measured from the secondary sensing electrodes 13, $S_1$, $S_2$, $S_3$, $S_4$, for example using one or more of the methods described hereinbefore.

Referring also to FIG. 34, an active region 19 providing a second swipe gesture control 78 is shown.

The second swipe gesture control 78 is the same as the first swipe gesture control 74, except that the different numbers and shapes of particular protrusions 76, 77 are used, and that the swipe direction 75 is aligned with the x axis as shown instead of the y axis as shown.

Simulations

Figure 35:
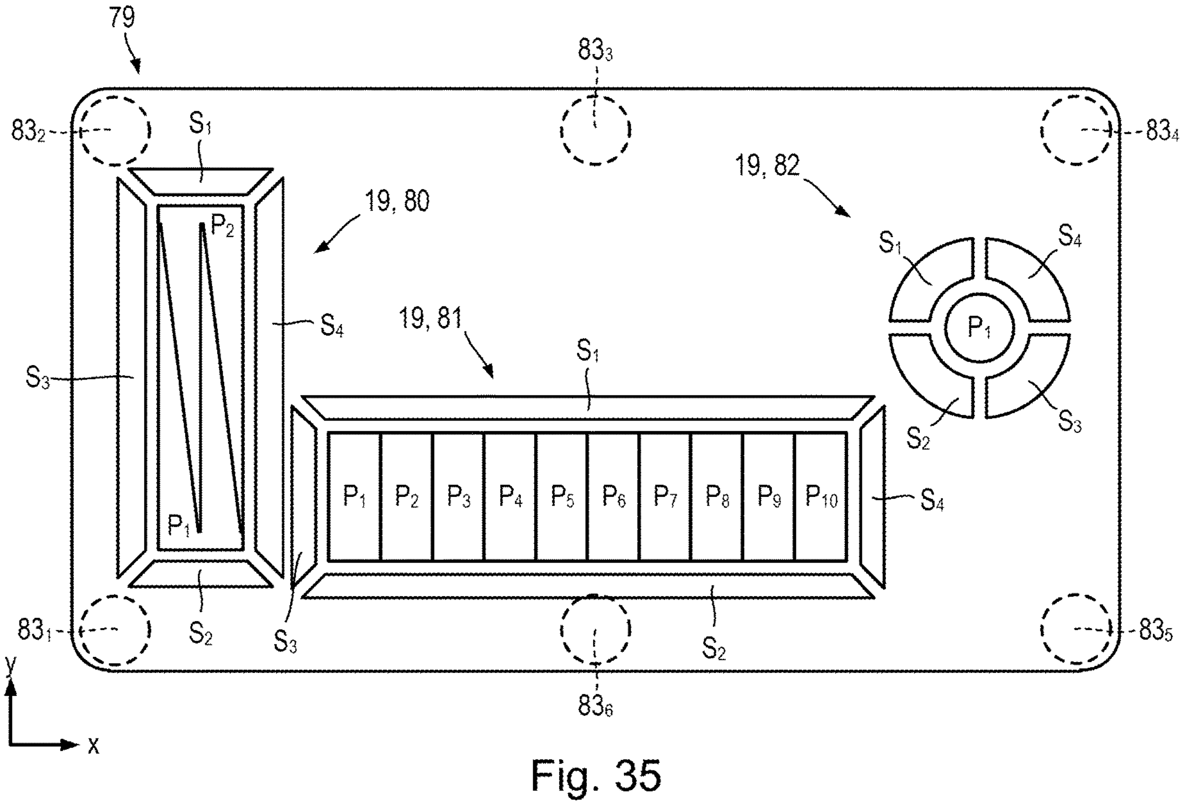
FIG. 35 is a plan view of a model piezoelectric sensor used to obtain simulated data plotted in FIGS. 36A to 38H.

Referring also to FIG. 35, a model piezoelectric sensor 79 is illustrated.

The model piezoelectric sensor 79 was used for finite element analysis modelling to obtain the simulation results discussed hereinafter. The model piezoelectric sensor 79 includes three active regions 19 including a swipe control region 80, a slider control region 81 and a discrete button region 82. The swipe control region 80 has the layout shown in FIG. 35 and is configured substantially as described in relation to the first and second swipe gesture controls 74, 78. The slider control region 81 is configured in the same way as the second slider control 67, and includes a linear array of ten primary piezoelectric electrodes 12, $P_1, \ldots, P_{10}$. The discrete button region 82 includes a single, circular primary piezoelectric electrode 12, $P_1$ providing a button, and is configured as described in relation to the fourth button control 65. The perimeters 14 of the swipe control region 80, the slider control region 81 and the discrete button region 82 are omitted in FIG. 35 for visual purposes, but in each case can be considered as the locus of points equidistant between the primary sensing electrodes 12, $P_n$ and the corresponding secondary sensing electrodes 13, $S_m$.

The model piezoelectric sensor 79 was modelled as being physically constrained by mechanical boundary conditions in the form of six hemispherical supports $\mathbf{83}_1, \ldots, \mathbf{83}_6$ dispersed around the edges of the model piezoelectric sensor 79. Four of the hemispherical supports $\mathbf{83}_1$, $\mathbf{83}_2$, $\mathbf{83}_4$, $\mathbf{83}_5$ are disposed in corners of the model piezoelectric sensor 79, which is generally rectangular with rounded corners. The remaining hemispherical supports $\mathbf{83}_3$, $\mathbf{83}_6$ are disposed at the centres of the long edges (parallel to the first direction x). Each of the hemispherical supports $\mathbf{83}_1, \ldots, \mathbf{83}_6$ was movelled as being formed from an elastomeric material (e.g. Rubber).

Localisation to an active region 19 may be implemented using one or more secondary sensing electrodes 13, $S_m$ and associated secondary piezoelectric charges $Qs_m$ (or adjusted charges $As_m$) as described hereinbefore. Determining the number and configuration of secondary sensing electrodes 13, $S_m$ to use for a particular active region 19 may depend on a number of factors including, but not limited to, the size and shape of that active region 19, the relative location of that active region 19 on a piezoelectric sensor 16, 79, the mechanical boundary conditions experienced by the piezoelectric sensor 16, 79, and so forth.

Simulations shall be described which were conducted using finite element analysis applied to the model piezoelectric sensor 79. Simulations were conducted using the COMSOL® Multiphysics 5.5 software package, and linked mechanical deformation of the model piezoelectric sensor 79 to piezoelectric charges $Qp_n$, $Qs_m$ via strain induced polarisation of a modelled layer of piezoelectric material 7. Aside from the layout of sensing electrodes 4, 12, 13, the simulations were conducted as described hereinbefore in relation to FIG. 3.

Discrete Button Region

Figure 36A:
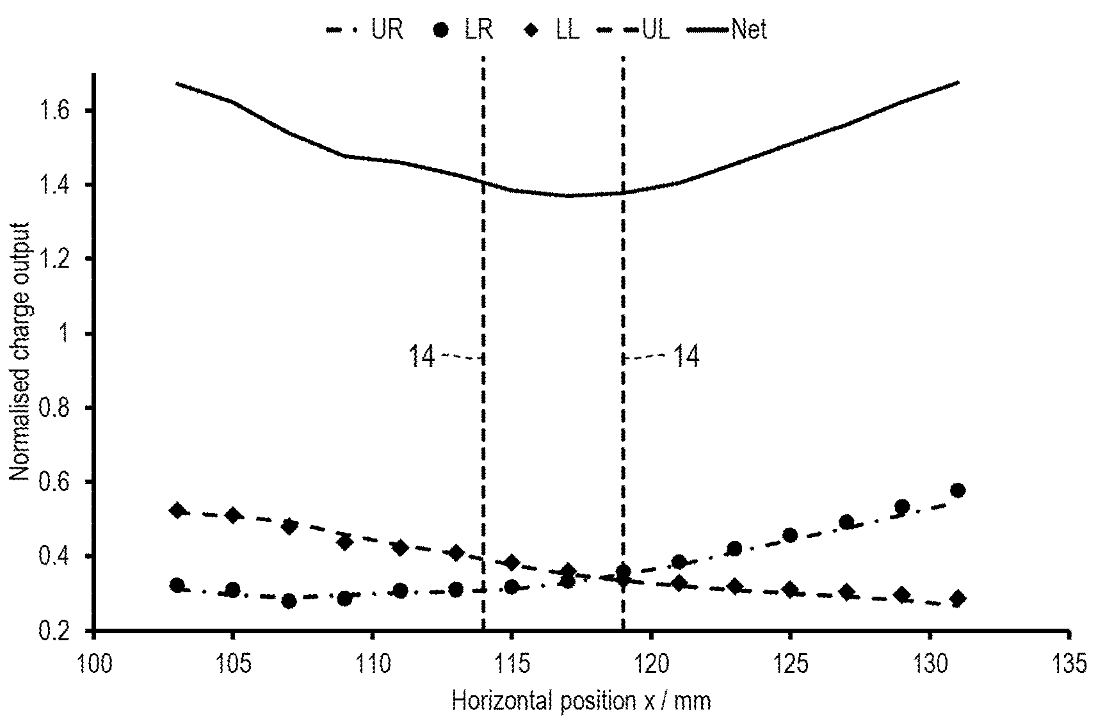
FIG. 36A plots normalised secondary piezoelectric charges for a force modelled with a centroid coordinate traversing a discrete button region.

Referring also to FIG. 36A, normalised secondary piezoelectric charges $Qs_1$, $Qs_2$, $Qs_3$, $Qs_4$ are plotted for a force F modelled with a centroid coordinate ($x_F$, $y_F$) traversing the discrete button region 82 along a first axis x.

Figure 36B:
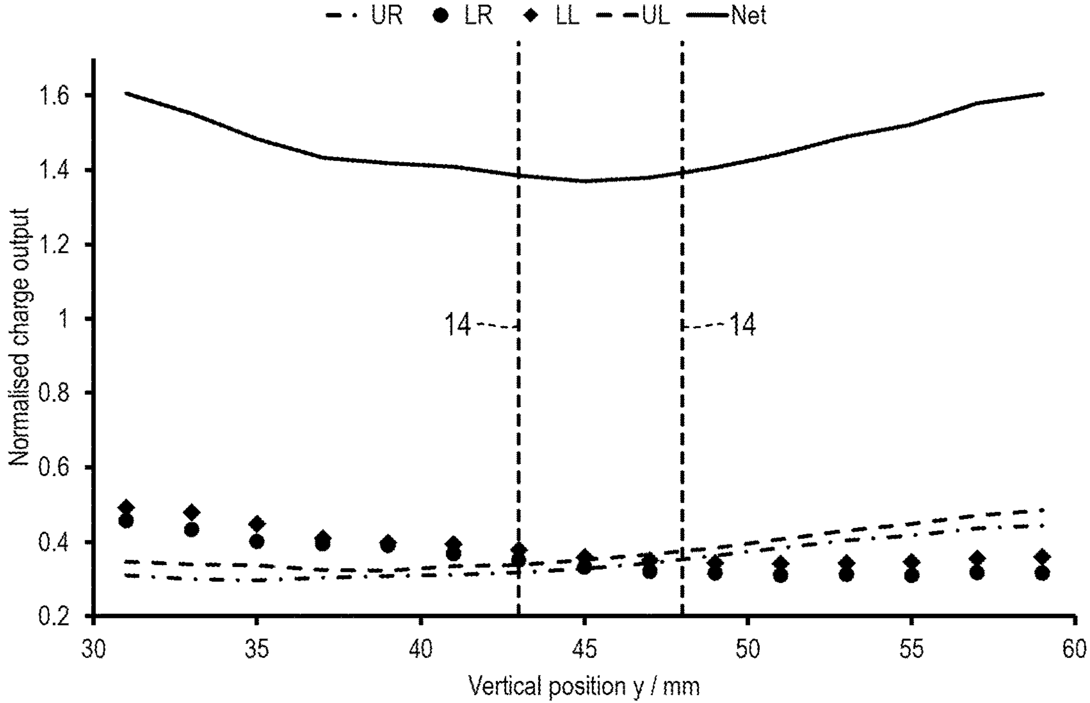
FIG. 36B plots normalised secondary piezoelectric charges for a force modelled with a centroid coordinate traversing a discrete button region along an axis perpendicular to that of FIG. 36A.

Referring also to FIG. 36B, normalised secondary piezoelectric charges $Qs_1$, $Qs_2$, $Qs_3$, $Qs_4$ are plotted for a force F modelled with a centroid coordinate ($x_F$, $y_F$) traversing the discrete button region 82 along a second axis y perpendicular to the first axis x.

The series labelled "UR" (upper right), "LR" (lower right), "LL" (lower left) and "UL" (upper left) in FIGS. 36A and 36B correspond respectively to the secondary sensing electrodes 13, $S_1$, $S_2$, $S_3$, $S_4$ of the discrete button region 82. The series labelled "Net" corresponds to the sum $Qs_1+Qs_2+Qs_3+Qs_4$ of secondary piezoelectric charges over all secondary sensing electrodes 13, $S_1$, $S_2$, $S_3$, $S_4$ of the discrete button region 82. The projection of the perimeter 14 of the discrete button region 82 is indicated in FIGS. 36A and 36B with dashed lines.

The data for FIGS. 36A and 36B were obtained assuming that the centroid coordinate ($x_F$, $y_F$) of the applied force passes above the centre of the circular primary sensing electrode 12, $P_1$. The normalisation referred to for the series of FIGS. 36A and 36B is with respect to the primary piezoelectric charge $Qp_1$ calculated for the primary sensing electrode 12, $P_1$. For example, a normalised secondary piezoelectric charge $Qs_m=1$ corresponds to $Qs_m=Qp_1$.

It may be observed that when the centroid coordinate ($x_F$, $y_F$) of the force F moves along the first direction x, as shown in FIG. 36A, the response from the secondary sensing electrodes 13, $S_1$, $S_2$, $S_3$, $S_4$ is relatively symmetric about a mid-point of the primary sensing electrode 12, $P_1$. Similarly symmetric responses may be observed for moving the centroid coordinate ($x_F$, $y_F$) of the force F along the second direction y, as shown in FIG. 36B.

Considering both motions, it may be observed that it is possible to use the "Net" signal obtained as the sum $Qs_1+Qs_2+Qs_3+Qs_4$ of all the secondary piezoelectric charges. For example, the conductive regions providing the secondary sensing electrodes 13, $S_1$, $S_2$, $S_3$, $S_4$ as modelled could instead all be electrically connected to provide a single secondary sensing electrode 13, $S_1$. Alternatively, the sum $Qs_1+Qs_2+Qs_3+Qs_4$ may be evaluated in the controller 17 or front end to of a device 15. In a further example, four conductive regions spaced around the perimeter 14 could be replaced with more or fewer conductive regions to form a single overall secondary sensing electrode 13, $S_1$, for example by electrically connecting all of the conductive regions together, or by having the corresponding piezoelectric charges summed by the controller 17 or front end to of a device 15. At minimum a single secondary sensing electrode 13, $S_m$ may substantially or completely surround the perimeter 14 (see for example the fourth and fifth active regions 37, 39).

From FIGS. 36A and 36B, a suitable threshold multiplier for application of the method using threshold multipliers described hereinbefore to an overall secondary sensing electrode would be in the region of $Th_1=1.4$. This value of the threshold multiplier $Th_1=1.4$ is determined from the approximate intersection of the "Net" series with the projection of the perimeter 14.

Swipe Control Region

Figure 37A:
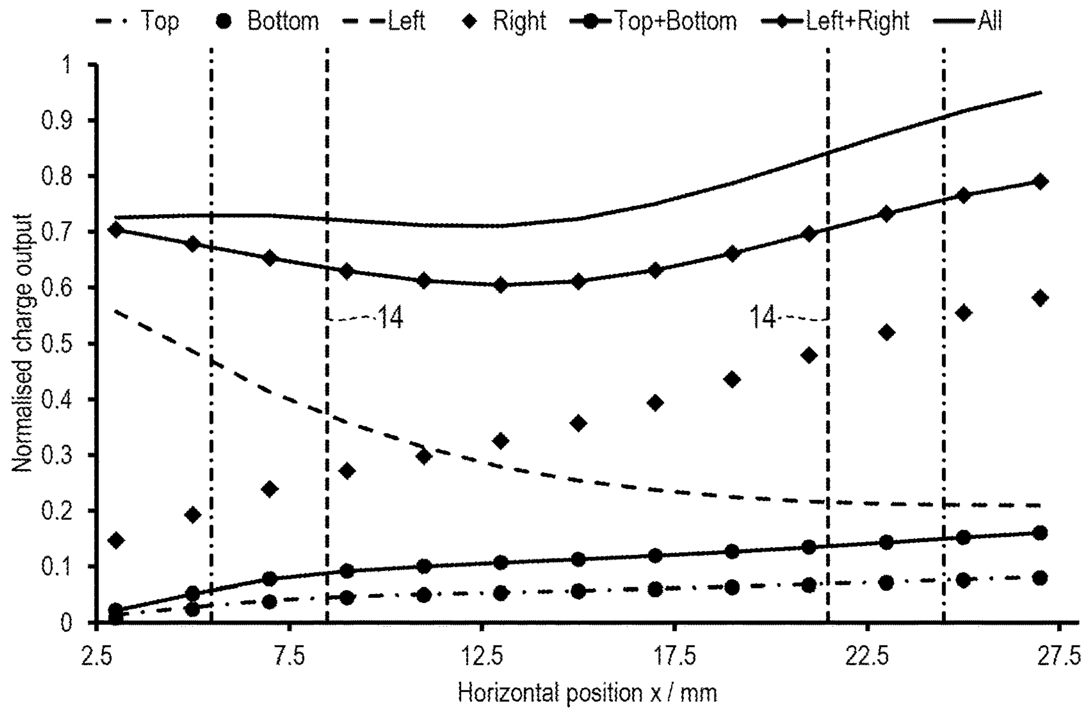
FIG. 37A plots normalised secondary piezoelectric charges for a force modelled with a centroid coordinate traversing a swipe control region.

Referring also to FIG. 37A, normalised secondary piezoelectric charges $Qs_1$, $Qs_2$, $Qs_3$, $Qs_4$ are plotted for a force F modelled with a centroid coordinate ($x_F$, $y_F$) traversing the swipe control region 80 along the first axis x.

Figure 37B:
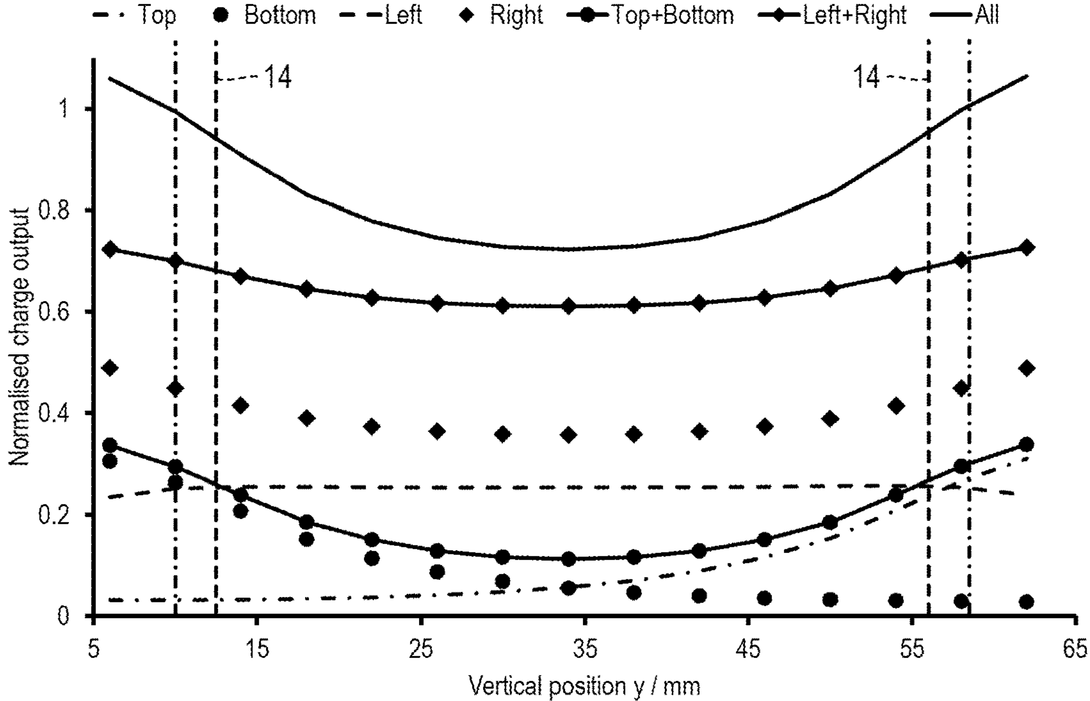
FIG. 37B plots normalised secondary piezoelectric charges for a force modelled with a centroid coordinate traversing a swipe control region along an axis perpendicular to that of FIG. 37A.

Referring also to FIG. 37B, normalised secondary piezoelectric charges $Qs_1$, $Qs_2$, $Qs_3$, $Qs_4$ are plotted for a force F modelled with a centroid coordinate ($x_F$, $y_F$) traversing the swipe control region 80 along the second axis y.

Figure 37C:
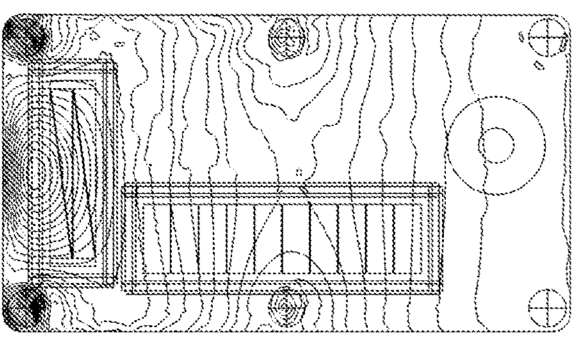
FIGS. 37C to 37E are contour plots corresponding to three positions corresponding to the data plotted in FIG. 37A.
Figure 37F:
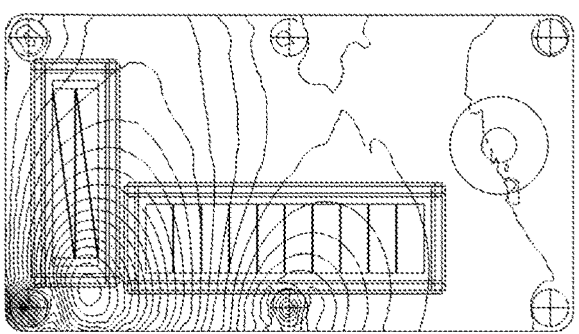
FIGS. 37F to 37H are contour plots corresponding to three positions corresponding to the data plotted in FIG. 37B.
Figure 37D:
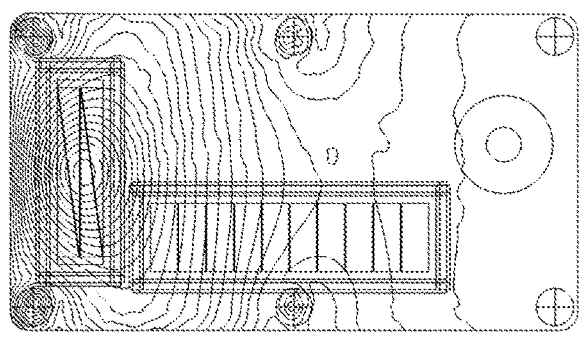
Figure 37G:
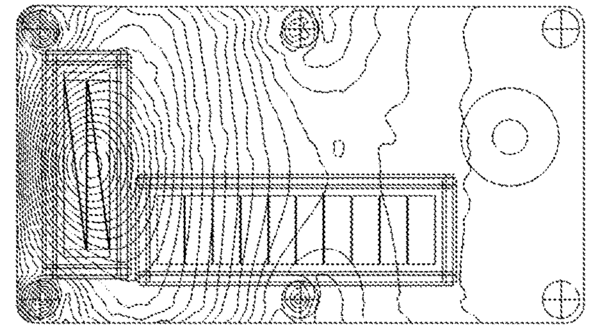
Figure 37E:
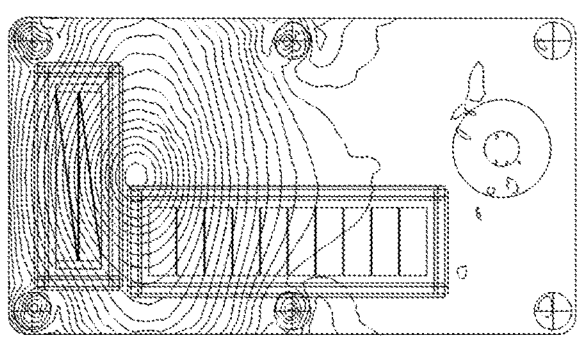

Referring also to FIG. 37C to 37E, contour plots of charge density resulting from straining of the piezoelectric layer 7 are shown corresponding to the movement along the first axis x shown in FIG. 37A.

Figure 37H:
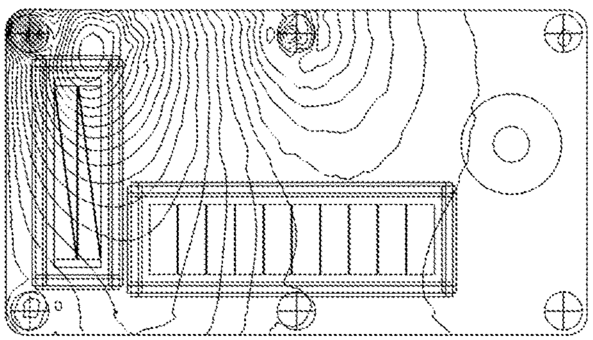

Referring also to FIG. 37F to 37H, contour plots of charge density resulting from straining of the piezoelectric layer 7 are shown corresponding to the movement along the second axis y shown in FIG. 37B.

The series labelled "Top", "Bottom", "Left" and "Right" in FIGS. 37A and 37B correspond respectively to the secondary sensing electrodes 13, $S_1$, $S_2$, $S_3$, $S_4$ of the swipe control region 80. The series labelled "Top+Bottom", "Left+Right" and "All" correspond respectively to the sums $Qs_1+Qs_2$, $Qs_3+Qs_4$ and $Qs_1+Qs_2+Qs_3+Qs_4$ of the modelled secondary piezoelectric charges. The projection of the perimeter 14 of the swipe control region 80 is indicated in FIGS. 37A and 37B with dashed lines, and the projection of an exterior boundary of the secondary sensing electrodes 13, $S_1$, $S_2$, $S_3$, $S_4$ is indicated by chained lines (not labelled).

The data for FIGS. 37A and 37B were obtained assuming that the centroid coordinate ($x_F$, $y_F$) of the applied force F passes above the centre of the swipe control region 80. The normalisation referred to for the series of FIGS. 37A and 37B is with respect to a sum $Qp_1+Qp_2$ over the primary sensing electrodes 12, $P_1$, $P_2$.

It may be observed from FIGS. 37A and 37C to 37E that when the centroid coordinate ($x_F$, $y_F$) of the force F moves along the first direction x, the response from the secondary sensing electrodes 13, $S_1$, $S_2$, $S_3$, $S_4$ is not symmetric. This is a result of the proximity to an edge of the model piezoelectric sensor 79, in particular because the motion of the modelled force F is not symmetric with respect to the hemispherical supports $\mathbf{83}_1, \ldots, \mathbf{83}_6$.

On the other hand, it may be observed from FIGS. 37B and 37F to 37H that when the centroid coordinate ($x_F$, $y_F$) of the force F moves along the second direction y, the response from the secondary sensing electrodes 13, $S_1$, $S_2$, $S_3$, $S_4$ is more symmetric. This results from the motion of the modelled force F being relatively more symmetric with respect to the hemispherical supports $\mathbf{83}_1, \ldots, \mathbf{83}_6$.

Based on the modelling results in FIGS. 37A to 37H, to localise a force F to within the swipe control region 80 along the first axis x, the signals from the "Left" $S_3$ and "Right" $S_4$ electrodes could be summed, either by electrically connecting the corresponding conductive regions or by summation in the measurement front end 10 or controller 17. The resulting first overall (or effective) secondary sensing electrode may be associated with a first threshold multiplier of approximately $Th_1\approx0.65$ for application of the method using threshold multipliers described hereinbefore.

Based on the modelling results in FIGS. 37A to 37H, to localise a force F within the swipe control region 80 along the second axis y, a second overall secondary sensing electrode may be formed by summing the signals from the "Top" $S_1$ and "Bottom" $S_2$ electrodes, in combination with setting a second threshold multiplier of $Th_2\approx0.25$ for the method using threshold multipliers described hereinbefore. Alternatively, the second overall secondary sensing electrode may be formed by summing the signals from all four of the secondary sensing electrodes 13, $S_1$, $S_2$, $S_3$, $S_4$ in combination with the a second threshold multiplier of $Th_2\approx0.94$ for application of the method using threshold multipliers. For practical reasons, the latter combination for the second overall secondary sensing electrode can only be used in combination with the first overall secondary sensing electrode (sum $S_3+S_4$) when signals are combined in the front end 10 or controller 17.

Slider Control Region

Figure 38A:
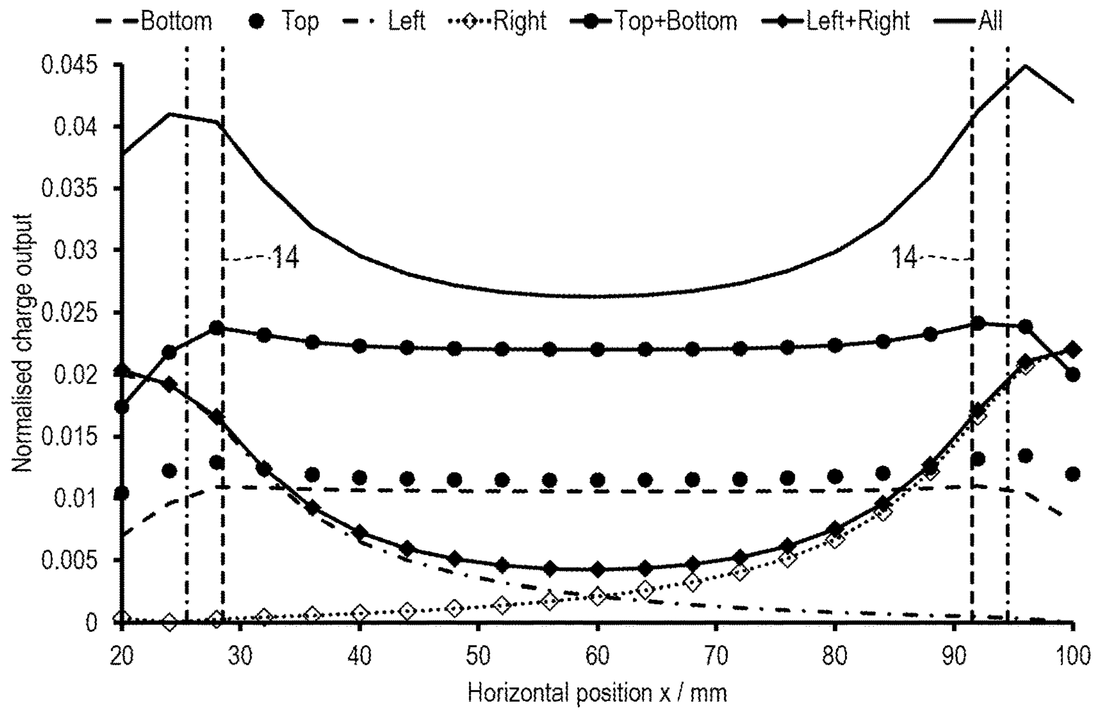
FIG. 38A plots normalised secondary piezoelectric charges for a force modelled with a centroid coordinate traversing a slider control region.

Referring also to FIG. 38A, normalised secondary piezoelectric charges $Qs_1$, $Qs_2$, $Qs_3$, $Qs_4$ are plotted for a force F modelled with a centroid coordinate ($x_F$, $y_F$) traversing the slider control region 81 along the first axis x.

Figure 38B:
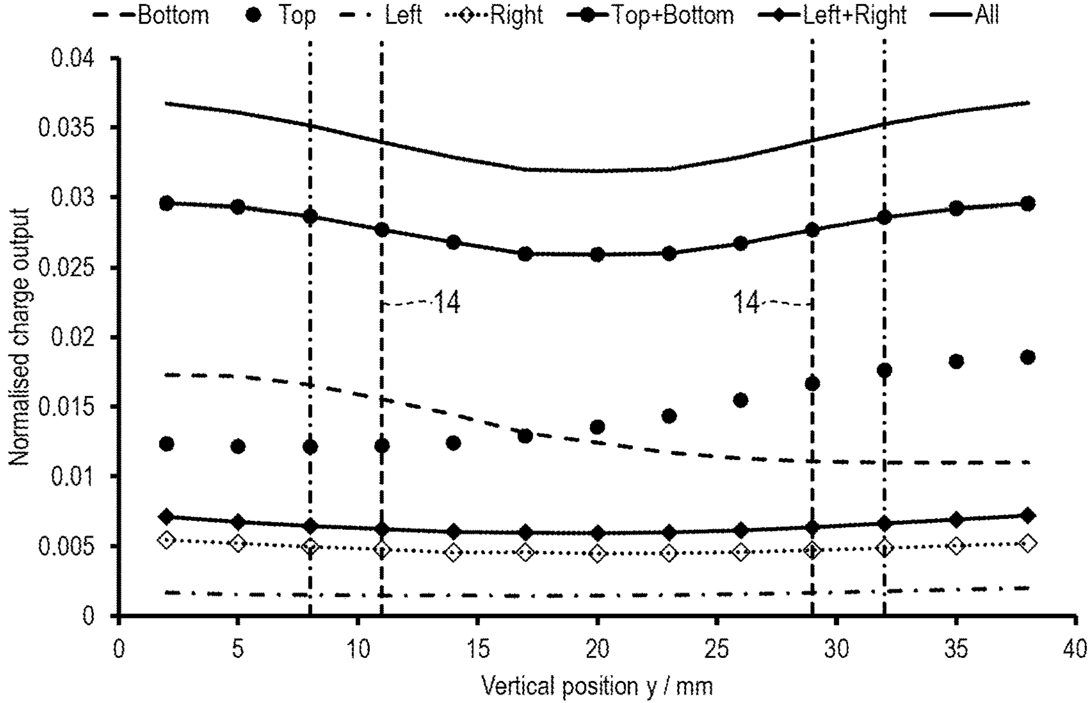
FIG. 38B plots normalised secondary piezoelectric charges for a force modelled with a centroid coordinate traversing a slider control region along an axis perpendicular to that of FIG. 38A.

Referring also to FIG. 38B, normalised secondary piezoelectric charges $Qs_1$, $Qs_2$, $Qs_3$, $Qs_4$ are plotted for a force F modelled with a centroid coordinate ($x_F$, $y_F$) traversing the slider control region 81 along the second axis y.

Figure 38C:
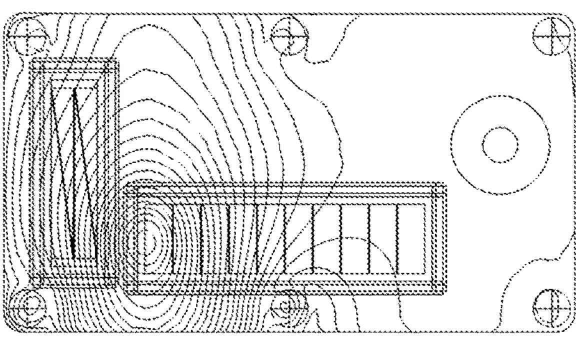
FIGS. 38C to 38E are contour plots corresponding to three positions corresponding to the data plotted in FIG. 38A.
Figure 38F:
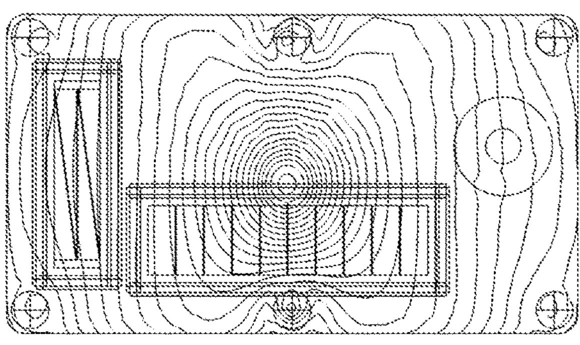
FIGS. 38F to 38H are contour plots corresponding to three positions corresponding to the data plotted in FIG. 37B.
Figure 38D:
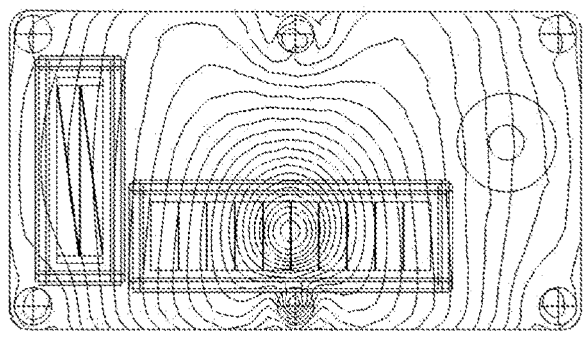
Figure 38G:
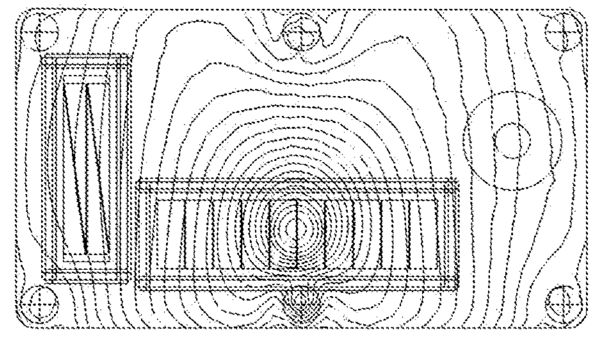
Figure 38E:
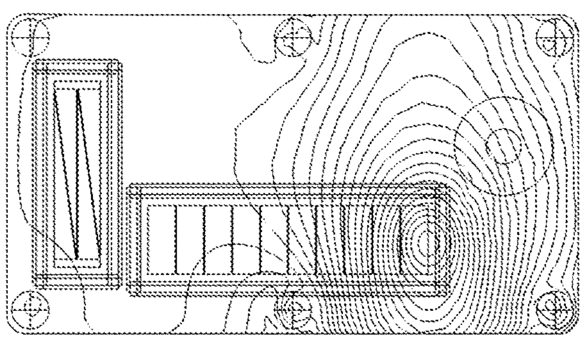

Referring also to FIG. 38C to 38E, contour plots of charge density resulting from straining of the piezoelectric layer 7 are shown corresponding to the movement along the first axis x shown in FIG. 38A.

Figure 38H:
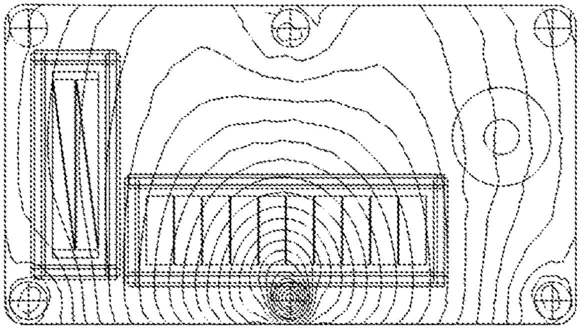

Referring also to FIG. 38F to 38H, contour plots of charge density resulting from straining of the piezoelectric layer 7 are shown corresponding to the movement along the second axis y shown in FIG. 38B.

The series labelled "Top", "Bottom", "Left" and "Right" in FIGS. 38A and 38B correspond respectively to the secondary sensing electrodes 13, $S_1$, $S_2$, $S_3$, $S_4$ of the slider control region 81. The series labelled "Top+Bottom", "Left+Right" and "All" correspond respectively to the sums $Qs_1+Qs_2$, $Qs_3+Qs_4$ and $Qs_1+Qs_2+Qs_3+Qs_4$ of modelled secondary piezoelectric charges. The projection of the perimeter 14 of the slider control region 80 is indicated in FIGS. 38A and 38B with dashed lines, and the projection of an exterior boundary of the secondary sensing electrodes 13, $S_1$, $S_2$, $S_3$, $S_4$ is indicated by chained lines (not labelled).

The data for FIGS. 38A and 38B were obtained assuming that the centroid coordinate ($x_F$, $y_F$) of the applied force passes above the centre of the slider control region 81. The normalisation referred to for the series of FIGS. 38A and 38B is with respect to a sum $Qp_1+Qp_2$ over the primary sensing electrodes 12, $P_1, \ldots, P_{10}$.

It may be observed from FIGS. 38A and 38C to 38E that when the centroid coordinate ($x_F$, $y_F$) of the force F moves along the first direction x, the response from the secondary sensing electrodes 13, $S_1$, $S_2$, $S_3$, $S_4$ is substantially symmetric. Similarly, it may be observed from FIGS. 38B and 38F to 38H that when the centroid coordinate ($x_F$, $y_F$) of the force F moves along the second direction y, the response from the secondary sensing electrodes 13, $S_1$, $S_2$, $S_3$, $S_4$ is also substantially symmetric.

Based on the modelling results in FIGS. 38A to 38H, to localise a force F within the slider control region 81 along the first axis x, the signals from the "Left" S 3 and "Right" $S_4$ electrodes could be summed, either by electrically connecting the corresponding conductive regions or by summation using the measurement front end 10 or controller 17. The resulting first overall (or effective) secondary sensing electrode may be associated with a first threshold multiplier of $Th_1 \approx 0.016$ for application of the method using threshold multipliers described hereinbefore. Similarly, a second overall secondary sensing electrode may be formed by summing the signals from the "Top" $S_1$ and "Bottom" $S_2$ electrodes in combination with setting a second threshold multiplier of $Th_2 \approx 0.028$ for application of the method using threshold multipliers described hereinbefore.

Alternatively, a single overall secondary sensing electrode may be formed by summing the signals from all four of the secondary sensing electrodes 13, $S_1$, $S_2$, $S_3$, $S_4$ in combination with a threshold multiplier of $Th \approx 0.034$ for application of the method using threshold multipliers. This latter option would lose some resolution at the extremal ends of the slider control region 81 along the first axis x. A resolution loss estimated from FIG. 38A would be in the region of 2.5 mm either side. This may be acceptable in some applications, for example, if input is expected from a user's digit having a contact area with a diameter in the region of 10 mm.

Modifications

It will be appreciated that many modifications may be made to the embodiments hereinbefore described. Such modifications may involve equivalent and other features which are already known in the design, manufacture and use of piezoelectric force sensors, buttons and/or touch panels, and which may be used instead of or in addition to features already described herein. Features of one embodiment may be replaced or supplemented by features of another embodiment.

The counter electrodes 3, 47, 48, 53, 55, 58 and/or sensing electrodes 4, 12, 13 may be defined using one or more conductor layers of a multi-layer printed circuit board (PCB). For example, one or more sensing electrodes 4 may be defined by a conductor layer of a two-layer PCB or a four layer PCB. Similarly, one or more counter electrodes 3 may be defined by a conductor layer of a two-layer PCB or a four layer PCB. The sensing electrodes 4 and the counter electrode(s) 3 may be defined using separate multi-layer PCBs. The sensing electrodes 4 and the counter electrode(s) 3 may be defined using separate conductor layers of the same multi-layer PCB.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicant hereby gives notice that new claims may be formulated to such features and/or combinations of such features during the prosecution of the present application or of any further application derived therefrom.

The invention claimed is:

1. A device comprising:

a piezoelectric sensor comprising a layer of piezoelectric material disposed between a plurality of sensing electrodes and at least one counter electrode; and a controller connected to the piezoelectric sensor;

wherein the plurality of sensing electrodes are arranged to form one or more active regions, each active region of the one or more active regions comprising:

a group of one or more primary sensing electrodes of the plurality of sensing electrodes, the group of one or more primary sensing electrodes arranged with overlying indicia defined on a surface of the device so as to define one or more user input controls;

a group of one or more secondary sensing electrodes of the plurality of sensing electrodes, the group of one or more secondary sensing electrodes surrounding the group of one or more primary sensing electrodes, wherein the group of one or more secondary sensing electrodes do not correspond directly to user input controls, and wherein the group of one or more secondary sensing electrodes have no corresponding indicia defining user input controls; and a perimeter, the perimeter being a locus of points separating the group of one or more primary sensing electrodes from the group of one or more secondary sensing electrodes, such that the group of one or more primary sensing electrodes are within the perimeter and the group of one or more secondary sensing electrodes are outside the perimeter;

wherein the controller is configured, for each active region of the one or more active regions, in response to receiving piezoelectric signals from the active region corresponding to an applied force:

to measure primary piezoelectric charges induced on each of the corresponding group of one or more primary sensing electrodes of the active region;

to measure secondary piezoelectric charges induced on each of the corresponding group of one or more secondary sensing electrodes of the active region; and based on comparing the measured primary piezoelectric charges to the measured secondary piezoelectric charges, to determine whether a centroid of the applied force is within the perimeter of the active region;

wherein the controller is further configured, in response to determining at least one active region of the one or more active regions is being pressed with a corresponding applied force having a centroid determined to be within the perimeter of the at least one active region, to output user input data including details of which of the user input controls defined by the group of one or more primary sensing electrodes of the at least one active region have been actuated by the corresponding applied force.

2. The device according to claim 1, wherein the group of one or more secondary sensing electrodes of a first active region of the one or more active regions comprises:

first and second regions of conductive material disposed on opposite sides of the first active region along a first direction; and third and fourth regions of conductive material disposed on opposite sides of the first active region along a second direction which is different to the first direction.

3. The device according to claim 2, wherein:

the first and second regions of conductive material are electrically connected together to provide a first secondary sensing electrode of the group of one or more secondary sensing electrodes.

4. The device according to claim 2 wherein the first, second, third and fourth regions of conductive material are all electrically connected together to provide a first secondary sensing electrode of the one or more secondary sensing electrodes.

5. The device according to claim 2, wherein each of the first, second, third and fourth regions of conductive material provides a separate secondary sensing electrode of the group of one or more secondary sensing electrodes.

6. The device according to claim 5, wherein the controller is configured to sum piezoelectric charges from the first and second regions of conductive material to determine a first secondary piezoelectric charge corresponding to the first and second regions of conductive material.

7. The device according to claim 1, wherein the group of one or more secondary sensing electrodes of a first active region of the one or more active regions comprises one secondary sensing electrode of the one or more secondary sensing electrodes in the form of a region of conductive material extending around a majority of the perimeter of the first active region.

8. The device according to claim 1, wherein the piezoelectric sensor comprises a single counter electrode which is common to all of the plurality of sensing electrodes.

9. The device according to claim 8, wherein the single counter electrode is provided by a metal sheet forming at least part of a casing of the device, and wherein the layer of piezoelectric material is supported by the metal sheet.

10. The device according to claim 1, wherein the piezoelectric sensor comprises a separate counter electrode corresponding to each of the plurality of sensing electrodes.

11. The device according to claim 1, wherein all of the group of one or more secondary sensing electrodes of at least one active region of the one or more active regions are opposed across the layer of piezoelectric material by a common secondary counter electrode corresponding to the at least one active region.

12. The device according to claim 11, wherein each of the one or more primary sensing electrode of the group of one or more primary sensing electrodes of the at least one active region is opposed across the layer of piezoelectric material by a respective primary counter electrode.

13. The device according to claim 11, wherein all of the group of one or more primary sensing electrodes of the at least one active region are opposed across the layer of piezoelectric material by a common primary counter electrode corresponding to that active region.

14. The device according to claim 11, wherein the group of one or more primary sensing electrodes of the at least one active region are opposed across the layer of piezoelectric material by a number of primary counter electrodes which is different than the number of primary sensing electrodes belonging to the at least one active region.

15. The device of claim 1, wherein all of the secondary sensing electrodes are opposed across the layer of piezoelectric material by a single common secondary counter electrode.

16. The device according to claim 1, wherein for a given active region, the corresponding group of one or more primary sensing electrodes and the corresponding group of one or more secondary sensing electrodes are configured with relative areas and positions such that it is possible to define a threshold multiplier corresponding to each secondary sensing electrode of the given active region, wherein the threshold multipliers for the given active region satisfy:

in response to application of a force having a centroid within the perimeter of the given active region the secondary piezoelectric charge measured from each secondary sensing electrode of the corresponding group of one or more secondary sensing electrodes is less than a product of the respective threshold multiplier and a total primary piezoelectric charge measured from all of the corresponding group of one or more primary sensing electrodes; and in response to application of a force having a centroid outside the perimeter of the given active region, a secondary piezoelectric charge measured from at least one secondary sensing electrode of the corresponding group of one or more secondary sensing electrodes is greater than the product of the respective threshold multiplier and the total primary piezoelectric charge measured from all of the primary sensing electrodes of the corresponding group of one or more primary sensing electrodes; and wherein the controller is configured to store pre-calibrated threshold multipliers corresponding to each secondary sensing electrode, and for the given active region to determine whether an applied force has a centroid within the corresponding perimeter by comparing each secondary piezoelectric charge measured from a secondary sensing electrode belonging to the group of one or more secondary sensing electrodes of the given active region against a product of the respective threshold multiplier with a sum over the primary piezoelectric charges measured from the group of one or more primary sensing electrodes of the given active region.

17. The device according to claim 1, wherein the indicia overlying the group of one or more primary sensing electrodes of at least one active region of the one or more active region define one or more user input controls comprising at least one of one or more buttons, a slider control, a dial control, a swipe gesture control, a button pad or a touch pad.

18. A device comprising:

a piezoelectric sensor comprising a layer of piezoelectric material disposed between a plurality of sensing electrodes and at least one counter electrode, wherein the plurality of sensing electrodes are arranged to form one or more active regions, each active region of the one or more active regions comprising:

a group of one or more primary sensing electrodes of the plurality of sensing electrodes, the group of one or more primary sensing electrodes arranged with overlying indicia defined on a surface of the device so as to define one or more user input controls;

a group of one or more secondary sensing electrodes of the plurality of sensing electrodes, the group of one or more secondary sensing electrodes surrounding the group of one or more primary sensing electrodes, wherein the group of one or more secondary sensing electrodes do not correspond directly to user input controls, and wherein the group of one or more secondary sensing electrodes have no corresponding indicia defining user input controls; and a perimeter, the perimeter being a locus of points separating the group of one or more primary sensing electrodes from the group of one or more secondary sensing electrodes, such that the group of one or more primary sensing electrodes are within the perimeter and the group of one or more secondary sensing electrodes are outside the perimeter;

wherein the group of one or more secondary sensing electrodes of at least one active region of the one or more active regions comprise one secondary sensing electrode in the form of a region of conductive material extending around a majority of the perimeter of the at least one active region.

19. A device comprising:

a piezoelectric sensor comprising a layer of piezoelectric material disposed between a plurality of sensing electrodes and at least one counter electrode; and a controller connected to the piezoelectric sensor;

wherein the plurality of sensing electrodes are arranged to form one or more active regions, each active region of the one or more active regions comprising:

a group of one or more primary sensing electrodes of the plurality of sensing electrodes, the group of one or more primary sensing electrodes arranged with overlying indicia defined on a surface of the device so as to define one or more user input controls;

a group of one or more secondary sensing electrodes of the plurality of sensing electrodes, the group of one or more secondary sensing electrodes bracketing the group of one or more primary sensing electrodes, wherein the group of one or more secondary sensing electrodes do not correspond directly to user input controls, and wherein the group of one or more secondary sensing electrodes have no corresponding indicia defining user input controls; and a perimeter, the perimeter being a locus of points separating the group of one or more primary sensing electrodes from the group of one or more secondary sensing electrodes, such that the group of one or more primary sensing electrodes are within the perimeter and the group of one or more secondary sensing electrodes are outside the perimeter;

wherein the controller is configured, for each active region of the one or more active regions, in response to receiving piezoelectric signals from the active region corresponding to an applied force:

to measure primary piezoelectric charges induced on each of the corresponding group of one or more primary sensing electrodes of the active region;

to measure secondary piezoelectric charges induced on each of the corresponding group of one or more secondary sensing electrodes of the active region; and based on comparing the measured primary piezoelectric charges to the measured secondary piezoelectric charges, to determine whether a centroid of the applied force is within the perimeter of the active region;

wherein the controller is further configured, in response to determining at least one active region of the one or more active regions is being pressed with a corresponding applied force having a centroid determined to be within the perimeter of the at least one active region, to output user input data including details of which of the user input controls defined by the group of one or more primary sensing electrodes of the at least one active region have been actuated by the corresponding applied force.

20. The device according to claim 19, wherein the group of one or more primary sensing electrodes of a first active region of the one or more active regions comprises:

an array of primary sensing electrodes of the group of one or more primary sensing electrodes spaced apart along a path; and wherein the group of one or more secondary sensing electrodes of the first active region comprises a pair of secondary sensing electrodes of the group of one or more secondary sensing electrodes arranged on the path at either end of the array of primary sensing electrodes.

* * * * *